(12) United States Patent
Takahashi et al.

(10) Patent No.: US 6,751,144 B2
(45) Date of Patent: Jun. 15, 2004

(54) SEMICONDUCTOR STORAGE AND METHOD FOR TESTING THE SAME

(75) Inventors: Hiroyuki Takahashi, Tokyo (JP); Hideo Inaba, Tokyo (JP); Takashi Kusakari, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/148,430

(22) PCT Filed: Dec. 1, 2000

(86) PCT No.: PCT/JP00/08513
§ 371 (c)(1),
(2), (4) Date: May 29, 2002

(87) PCT Pub. No.: WO01/41149
PCT Pub. Date: Jun. 7, 2001

(65) Prior Publication Data
US 2002/0181301 A1 Dec. 5, 2002

(30) Foreign Application Priority Data
Dec. 3, 1999 (JP) .............................. 11/345345
Mar. 10, 2000 (JP) ........................... 2000-067607
Jun. 13, 2000 (JP) ........................... 2000-177390

(51) Int. Cl.[7] ................................. G11C 7/00
(52) U.S. Cl. ................. 365/222; 365/229; 365/233.5
(58) Field of Search .............................. 365/222, 229, 365/233.5, 230.06, 230.08, 238.5

(56) References Cited
U.S. PATENT DOCUMENTS

| 4,809,233 A | 2/1989 | Takemae | |
|---|---|---|---|
| 5,999,472 A | * 12/1999 | Sakurai | 365/222 |
| 6,028,804 A | * 2/2000 | Leung | 365/222 |

FOREIGN PATENT DOCUMENTS

| EP | 0273652 A2 | 12/1987 |
|---|---|---|
| JP | 61-5495 | 1/1986 |
| JP | 62-188096 | 8/1987 |
| JP | 63-155494 | 6/1988 |
| JP | 4-243087 | 8/1992 |
| JP | 6-36557 | 2/1994 |
| JP | 2529680 | 6/1996 |
| JP | 11-213658 | 8/1999 |
| JP | 11-232876 | 8/1999 |

OTHER PUBLICATIONS

Prince, Betty, *Semiconductor Memories—a Handbook of Design, Manufacture, and Application*, 2$^{nd}$ Edition, Wiley Publishers, 1991, pp. 394–409.
Bellaouar, Abdellatif et al., *Low–Power VLSI Design Circuits and Systems*, Kluwer Academic Publishers, "Low–Power Circuit Techniques", VLSI Circuit Design, pp. 239–244.

* cited by examiner

Primary Examiner—David Lam
(74) Attorney, Agent, or Firm—Choate, Hall & Stewart

(57) ABSTRACT

A semiconductor storage having the same memory cells as a DRAM, operating in SRAM specifications, and having advantages such as a small chop size, a low power consumption, a low manufacturing cost, no access delay due to skew, and no memory cell breakdown. An ATD circuit (3) generates a one-shot pulse added to an address change detection signal (ATD) from a change of the address (Address) supplied from external. By combining one-shot pulse produced for each bit of the address, only one one-shot pulse is generated even if the address includes skew. A memory cell is refreshed by using a refresh address (R_ADD) generated by a refresh control circuit (4) during the time when a one-shot pulse is generated. At the fall of the one-shot pulse, a latch control signal (LC) is generated, and the address is taken in a latch (2) so as to access a memory cell array (6).

58 Claims, 25 Drawing Sheets

SEMICONDUCTOR STORAGE AND METHOD FOR TESTING THE SAME

TECHNICAL FIELD

The present invention relates to a semiconductor memory device in which a memory cell array is constructed of the same memory cells as DRAM (dynamic random access memory), and moreover which when viewed from outside the semiconductor memory device, operates with the same specifications as SRAM (static RAM). In particular, the present invention relates to a semiconductor memory device which is compatible with SRAM in which a write enable signal for determining the write timing for a memory cell is supplied asynchronously relative to a write address.

BACKGROUND ART

SRAM and DRAM are the most representative examples of semiconductor memory devices to which random access is possible. In comparison with DRAM, SRAM is generally faster, and provided a power source is supplied and an address is input, the internal sequential circuit will operate so as to detect any address transitions, and perform reading and writing. In this manner, because SRAM is operated simply by provision of an input signal waveform which is simple in comparison with DRAM, the construction of the circuit for generating the input signal waveform can also be simplified.

Furthermore, because SRAM does not require a refresh for continued retention of data stored in the memory cells as DRAM does, SRAM offers the advantages that handling is easy, and moreover because a refresh is unnecessary, the data retention current in standby mode is very small. For the above reasons, SRAM is widely used in a variety of applications. However, because SRAM typically requires six transistors for each memory cell, the chip size is always larger than for DRAM, and the cost of SRAM is also higher than for DRAM.

In contrast, DRAM suffers from a more complex timing control than SRAM, in that an address needs to be split in two and provided as a separate row address and column address, and a RAS (row address strobe) signal and a CAS (column address strobe) signal are required as signals for defining the latch timing of these addresses, and a control circuit for regular refresh of the memory cells is required.

Furthermore, DRAM suffers from the problem that even when there is no access from externally, the current consumption is large due to the requirement to conduct a refresh of the memory cells. Having said that, a memory cell of a DRAM can be constructed from a single transistor and a single capacitor, and so a shift to mass storage with a small chip size is relatively easy. Consequently, in constructing semiconductor memory devices of identical storage volume, DRAM will be cheaper than SRAM.

Up until now, SRAM has been the mainstream semiconductor memory device used in portable apparatus such as portable telephones. The reasons for this include the fact that up until now portable telephones have been provided with only simple functions and so large storage semiconductor memory devices have been unnecessary, the fact that SRAM is simpler to handle than DRAM in terms of timing control and the like, and the fact that SRAM has only a small standby current and offers low power consumption and so is more suitable for portable telephones and the like in which extending continuous talk time and continuous standby time is a priority.

However recently, portable telephones which offer a huge number of functions have started appearing, and functions such as the ability to send and receive email, or the ability to access various sites and obtain, for example, general information about local restaurants are now a reality. Moreover, in the most recent portable telephones, functions to enable access to web servers on the internet and the subsequent display of simplified versions of the content of home pages have appeared, and it is envisaged that in the future, access to internet home pages and the like in the same manner as conventional desktop type personal computers will be possible.

In order to realize such functions, the type of simple text display used on conventional portable telephones will be insufficient, and graphic displays for providing a variety of multimedia information to the user will be essential. This will require the temporary storage of large amounts of data received from a public network or the like in semiconductor memory devices housed inside the portable telephone. That is, it is thought that mass storage such as that provided by DRAM will be a necessity for the semiconductor memory devices used in future portable telephones. Moreover, because small size and light weight are two essential conditions for portable apparatus, even if the storage capacity of the semiconductor memory devices used is increased, any increases in size or weight of the apparatus must be avoided.

As described above, consideration of ease of handling and power consumption would suggest SRAM as the preferred semiconductor memory device for use in portable apparatus, but from the viewpoint of mass storage DRAM is preferable. That is, it can be said that for future portable apparatus, a semiconductor memory device which incorporates the advantages of SRAM and DRAM is ideal. An example of such a semiconductor memory device known as pseudo SRAM, which uses the same memory cells as those used by DRAM but which has almost the same specifications as SRAM when viewed from externally, has already been proposed.

Pseudo SRAM does not require addresses to be provided as a separate row address and column address as is the case with DRAM, and furthermore timing signals for these such as RAS and CAS are also unnecessary. Hence with pseudo SRAM, an address is provided at a single time, in the same manner as for standard SRAM, and a chip enable signal corresponding with the clock of a clock synchronous type semiconductor memory device is used as a trigger for latch of an address and the performing of reading or writing.

However, pseudo SRAM is not completely compatible with standard SRAM, and most pseudo SRAM is equipped with a refresh control terminal for controlling the refresh of the memory cells from externally, and the control of the refresh must be controlled from outside the pseudo SRAM. Consequently, in comparison with SRAM, most pseudo SRAM is not particularly easy to handle, and suffer from requiring an extra circuit for refresh control. As a result, pseudo SRAM in which external control of the refresh is unnecessary and which is operated with exactly the same specifications as standard SRAM is also under consideration, as described below. However, as described below, this type of pseudo SRAM also suffers from several drawbacks.

As a first background art example there are the semiconductor memory devices disclosed in Japanese Unexamined Patent Application, First Publication No. Sho-61-5495 and Japanese Unexamined Patent Application, First Publication No. Sho-62-188096. A semiconductor memory device of the former application incorporates an integrated refresh timer for timing the refresh interval, and at the point where a time equivalent to the refresh interval has elapsed, a refresh start request is generated, and following completion of the amplification operation of a bit line pair during a read operation, the word line corresponding to the refresh address is activated and self refresh is performed. By so doing, the need for controlling the refresh of the memory cells from outside the semiconductor memory device disappears.

Furthermore the semiconductor memory device of the latter application specifically discloses a detailed construction for an operation timing control circuit required for realizing the semiconductor memory device of the former application, and in effect is the same semiconductor memory device as that disclosed in the former application.

As a second background art example there is the semiconductor memory device disclosed in Japanese Unexamined Patent Application, First Publication No. Hei-6-36557. This semiconductor memory device is also provided with an internal timer for conducting refresh operations, and at the point where a predetermined refresh time has elapsed, a refresh start request is generated, and following completion of a read operation, a self refresh operation is performed.

However, in both the first and second background art examples, absolutely no consideration is given to the timing with which the write enable signal for determining the write timing is provided, and consequently there is a possibility of the following type of problems developing. Namely, in the case where pseudo SRAM is operated under the same specifications as standard SRAM, then the write enable signal will be provided asynchronously relative to an address transition. Moreover, also the self refresh due to a refresh start request, will be performed asynchronously relative to an address transition. As a result, the write enable signal will be input with a later timing than the refresh start request, and in those cases where, for example, the write enable signal is made valid in the latter portion of the memory cycle, if the self refresh has already started then write cannot be performed until after completion of this self refresh.

However, if this happens, the write following the self refresh will be delayed significantly. In order to avoid this type of situation it is necessary for write operations to have priority over self refresh operations. However, so doing means that in those cases where following the generation of a refresh start request a plurality of write requests are generated continuously, there is no room for conducting the self refresh, and so there is a possibility that performing the self refresh will be impossible.

Furthermore, in both the first and second background art examples, in those cases where an address incorporates a skew, a problem of delayed access arises. Namely, in those cases where a skew exists in an address, there is a need to surely delay the word line selection operation by a portion corresponding to the skew. This is because the DRAM memory cells used by pseudo SRAM are typically of destructive read type, and when a certain word line is activated and reading performed by a sense amplifier, there is a necessity for the data originally stored in all of the memory cells connected to the word line to be written back from the corresponding sense amplifiers to the memory cells.

As a result, once a read has commenced, the word line cannot be switched to another word line until the rewrite corresponding to the read has been completed. However, in those cases where the address incorporates a skew, this is equivalent to a transition in the address value, and so as a result the activated word line will be switched. Consequently, a plurality of word lines will be activated simultaneously, and the data in the memory cells connected to these word lines will be read on the same bit line, resulting in the destruction of the memory cell data.

In order to prevent this type of situation, as described above, it is necessary to delay the activation of the word line by the skew included in the address. As a result, if a refresh is performed after a read operation, then in the case where the skew is particularly large, the start of the refresh will also be delayed by the time by which the word line selection operation was delayed due to the existence of the skew, and moreover read operations and so forth following the refresh will also be delayed.

As a third background art example there is the semiconductor memory device disclosed in Japanese Unexamined Patent Application, First Publication No. Hei-4-243087. In this background art example, a refresh timer is not provided within the pseudo SRAM itself, but rather a timer is provided externally to the pseudo SRAM. Then, at the point of a first access request after a refresh time has elapsed, an OE (output enable) signal is produced outside the pseudo SRAM, and following completion of a refresh in accordance with the OE signal, the read or write operation is performed in accordance with the access request.

However, in the construction of this third background art example, the power consumption becomes excessively high, making it inapplicable to lower power consumption products such as portable telephones which are built on the premise of long usage cycles under battery driven conditions. In this third background art example, at the time that a chip enable (CE) signal becomes valid, a pseudo SRAM is operated by latching an address input from outside. That is, in the third background art example, each time the pseudo SRAM is accessed the chip enable signal must be activated, and so the charge and discharge current of the chip enable signal bus lines wired on to a printed circuit board results in high power consumption.

In addition, a fourth background art example is the semiconductor memory device disclosed in Japanese Patent Publication No. 2529680 (Japanese Unexamined Patent Application, First Publication No. Sho-63-206994). In this background art example, a construction is disclosed which is identical with conventional pseudo SRAM in which refresh operations are controlled from externally, and another construction which offers improvements on this pseudo SRAM construction is also disclosed.

In the former construction, on reception of the fact that the output enable signal is valid, an address transition detection signal is generated, and following completion of a self refresh in accordance with a refresh address generated inside the pseudo SRAM, then when the output enable signal becomes invalid, another address transition detection signal is generated, and a refresh is performed on the external address provided from outside the pseudo SRAM. However, if the output enable signal is generated regularly after every refresh interval, then the latter refresh of the external address is essentially unnecessary, and so the refresh of the external address produces a wasted consumption of power.

In contrast, in the latter construction of the fourth background art example, transitions are detected in an external address and an address transition detection signal generated, and a refresh is then performed on a refresh address generated inside the pseudo SRAM in response to the address transition detection signal. Then, following the elapsing of a set time, another address transition detection signal is generated, and normal reading or writing is performed with the external address as the subject. However, problems arise with this construction when the external address incorporates a skew.

Namely, in those cases where the external address incorporates a skew, because each bit of the address will vary by different timings, an address transition will be detected at each of the timings, and a plurality of address transition detection signals will be generated. As a result, although the starting a refresh in response to the first such address transition detection signal is alright, the second and subsequent address transition detection signals will result in the commencement of normal access of the external address which rightfully should be performed following completion of the refresh operation. Thus, in such cases, even though a refresh operation is in progress, an access request is made of the external address. Consequently, as was pointed out in the description of the first and second background art examples, a plurality of word lines are activated simultaneously, and because the data of the memory cells connected to these word lines will be read on the same bit line, destruction of the memory cell data will result.

In addition to the problems described above, conventional pseudo SRAM devices also suffer from the following problem. Namely, in standard SRAM, often a standby mode is provided whereby supply of electrical power to the internal circuits can be stopped and the power consumption significantly reduced. However in pseudo SRAM, because the memory cells are of the same type as those found in DRAM, continual refresh is required to retain the data stored in the memory cells. As a result, although pseudo SRAM can be said to operate in the same manner as SRAM, a standby mode such as that used in standard SRAM is not provided in conventional pseudo SRAM.

However, in addition to operating pseudo SRAM under identical specifications to standard SRAM, from a convenience viewpoint it would also be extremely desirable to provide pseudo SRAM with a lower power consumption mode similar to the standby mode of standard SRAM. Furthermore, considering the recent marked increase in the functions of portable telephones and the like, it is envisaged that pseudo SRAM will be applied to a variety of uses.

As a result, it is also envisaged that the control which can set a device to a simple standby mode as in standard SRAM will be insufficient in the future. Consequently, it is necessary to pre-empt this situation and propose a standby mode unique to pseudo SRAM which offers functions unavailable in existing standard SRAM. If the power consumption in this standby mode could be controlled in a fine stepwise manner in accordance with the needs of the user or the application being used, then this would be extremely useful.

Furthermore because refresh has been considered a prerequisite in standard DRAM, the concept of standby has not existed, but of course the demand for lower power consumption exists, even for standard DRAM. Consequently, if the concept of standby could be incorporated into standard DRAM, and power consumption reduced by controlling the power consumption in the standby state in a fine stepwise manner in accordance with the needs of the user or the application being used, then new fields of application for standard DRAM could be developed.

DISCLOSURE OF INVENTION

The present invention takes into consideration the above mentioned points with the object of providing a semiconductor memory device wherein there are no problems such as normal access being influenced by refresh, refresh unable to be performed due to continuation of writing, defects due to delayed access and destruction of data stored in memory cells occurring in a case where the address includes skew do not occur, and furthermore which operates with the specification of a standard SRAM, and even though storage capacity is increased it has a small chip size, low power consumption and is inexpensive. Moreover, it is an object of the present invention to provide a semiconductor memory device that has standby modes equivalent to those used in standard SRAM, and a unique low power consumption mode, which is not provided in existing semiconductor memory devices. Other objects of the present invention than those mentioned above will become clear from the description of the following embodiments.

The semiconductor memory device of the present invention generates an address transition detection signal in response to an input address signal, and performs memory cell refresh corresponding to the refresh address signal in response to this address transition detection signal, and memory cell access corresponding to the input address signal, in this order.

In this way, by performing access after performing refresh, then even when writing is continuous, refresh can be carried out in a memory cycle. Furthermore, when for example writing is performed to memory cells, then even if the write enable signal is input with a delay, refresh and write do not interfere, and hence timing design can be simplified obviating an increase in circuit size.

Moreover, even when the input address signal incorporates a skew, since the respective bits of the input address signal are changed at different timing due to the skew, concern that a plurality of address transition detection signals are produced and the data of the memory cell is destructed also disappears. Furthermore, since it is no longer necessary to take counter measures such as delaying the access start to the memory cell in order to avoid this problem of memory cell destruction, there is no longer delays inside the semiconductor memory device, thus enabling higher speeds.

The semiconductor memory device of the present invention incorporates a semiconductor memory device which uses a row address and a column address generated from the input address signal, and accesses the memory cell indicated by the input address signal. Therefore, it is no longer to necessary to acquire an address which has been split in two in accordance with the RAS/CAS timing signal as with a standard DRAM, and a one time application of the input address signal is sufficient. Therefore the circuit configuration for generating the signal waveform which is to be input to the semiconductor memory device can be simplified.

Furthermore, since refresh is performed within one memory cycle accompanying the application of the input address signal from outside the semiconductor memory device, then if only an input address signal necessary to refresh all of the memory cells is applied, data of the memory cells can continue to be maintained without performing refresh control from outside the semiconductor memory device, and hence handling is facilitated as with the standard SRAM.

Furthermore, if for the memory cell, one with a single transistor and a single capacitor as with a DRAM is used, then the cell area can be significantly reduced compared to a standard SRAM requiring six transistors per memory cell. Therefore it becomes possible to reduce the chip size and lower cost, while maintaining a large capacity.

Moreover, in the present invention, the transition of the input address signal is made a trigger, and the memory cell is accessed is by taking in the input address signal. Therefore as with the existing pseudo SRAM, there is no longer the requirement for example to change the signal such as the chip enable signal which is provided with the address latch timing control function each time the address is taken in. Hence power consumption can be reduced by this amount.

Here, in the present invention, the upper predetermined bits of the input address signal are used for address transition detection. Moreover, for the plurality of memory cells for which the upper predetermined bits of the input address signal are the same, the page address comprising the bits other than the upper predetermined bits is changed, and these memory cells may be continuously accessed. As a result, a function similar to page mode used in standard DRAM and the like can be realized.

Furthermore, in the present invention, the address transition detection signal may be generated in response to an activation signal which becomes valid when the semiconductor memory device is accessed. For the activation signal, a signal which has the activation function of the chip and which does not have the address latch timing control function may be used. As a result, by setting a previously input address signal, and shifting the activation signal from an invalid state to a valid state, usage such as starting operation inside the semiconductor memory device is possible.

Furthermore, in the present invention, a one shot pulse which has a pulse width corresponding to a waiting period from when the input address signal begins to change until said input address signal becomes definite, may be generated as the address transition detection signal. Moreover, in the semiconductor memory device of the present invention, refresh may be performed within the period when the one shot pulse is being generated. By so doing, the period in the standard SRAM which is originally the waiting period, can be effectively used to perform refresh. Moreover, also when refresh is not performed from when refresh of one refresh cycle is completed until the next refresh cycle, since the period of the one shot pulse corresponds to the waiting period as with the standard SRAM, the time necessary for reading from the memory cell can be made constant, irrespective of whether or not refresh is performed.

Furthermore, in the present invention, when the write enable signal is input within the period for performing refresh, the input write data may be taken in to the bus, and after completion of refresh, the write data may be written into the memory cell from the bus. Moreover, in the semiconductor memory device of the present invention, when the address transition detection signal is generated while self refresh is being performed, once self refresh has been performed, access for the input address signal made be performed. By so doing, even when the input address signal is being applied during self refresh, the input address signal does not influence the self refresh, and the operation results where access is always performed after performing self refresh. Therefore the logical design operation which becomes necessary for timing control can be simplified.

Moreover, in the present invention, when the address transition detection signal is not generated over the predetermined period, self refresh may be started and refresh performed at a fixed time intervals. If normal, the input address signal is applied a certain number of times, and the accompanying memory cell proceeds towards refresh.

However due to the above, even if the input address signal is not applied over a long period, the data stored in the memory cell can be held continuously. Furthermore, in the present invention, of the two kinds of transition points corresponding to the rising or falling of the one shot pulse, preferably the other transition point different to the transition point which becomes the trigger for starting the refresh is made a trigger, and the refresh address updated. As a result, when the newly input address signal changes and the next memory cycle is started, then even if a skew is contained in the input address signal, since the refresh address is already set in the preceding memory cycle, the selection operation of the memory cell (word line) which becomes the object of the refresh is completed without being delayed by the influence of skew, and without the occurrence of a delay in the refresh.

Moreover, in the present invention, by inputting a test mode signal, and also inputting an input refresh request at a desired timing, the refresh operation inside the semiconductor memory device can be freely controlled from the outside. Therefore, it is possible to examine for the presence of a defect produced by noise in the row enable signal which controls the refresh, and noise in a pair of the bit line in the interval from when the word line is activated until the sense operation of the sense amplifier is started, due for example to the influence of the one shot pulse generated from the change in the input address signal. Besides this, since the test mode signal is set by supplying a refresh request from the outside, and if a refresh request is not input from the outside, refresh is not fully performed in the semiconductor memory device, then a condition which inhibits refresh for hold testing can be easily realized.

Furthermore, in the present invention, preferably the input refresh request is applied via a pin which is not used during refresh. By so doing, the pin for applying the input refresh request and a pin for inputting an output enable signal or the like can be shared. Consequently, this is settled without assigning a new pin for merely applying the input refresh request.

Moreover, in the present invention, as well as being able to read and write after performing refresh, it is also possible when a write request is input, to write to the memory cell after performing refresh, and when a read request is input, to perform refresh after reading. By having the latter, reading can be sped up, enabling an improvement in access time. Therefore, preferably read/write is judged when a predetermined time has elapsed from a change in the input address signal.

Furthermore, the control circuit according to the present invention supplies a control signal or an address signal from outside of the memory chip which forms the memory cell, and together with this memory chip constitutes the above-mentioned semiconductor memory device.

For the test method of a semiconductor memory device according to the present invention, when a predetermined test pattern is written in to the memory cell array, all of the refresh is inhibited by the refresh request generated inside the semiconductor memory device, and the transition timing of the input address signal and the supply timing of the input refresh request are set with a certain time relationship, and the input refresh request is applied and refresh of a memory cell array performed while changing the input address signal, and by collating the test pattern which has previously been written in and the data of the memory cell array, quality judgment of the semiconductor memory device is performed. As a result, it is possible to examine for the presence of a defect produced by noise in the row enable signal which controls the refresh, and noise in a pair of the bit line in the interval from when the word line is activated until the sense operation of the sense amplifier is started, due to the influence of the address transition detection signal (one shot pulse) generated from the change in the input address signal.

Moreover, in the test method of the present invention, the time relationship between the transition timing of the input address signal and the supply timing of the input refresh request may be changed over a predetermined time range. For example, by making all the time ranges considered taken as the time relationship for between the two timing intervals, the above mentioned predetermined time range, then no matter what the time relationship is between these timing intervals, it can be guaranteed that deficiencies attributable to the above mentioned noise will not occur.

Furthermore, in the test method of the present invention, when the input address signal is changed, all of the bits of the input address signal may be simultaneously inverted. By so doing, the noise is able to be easily generated in the row enable signal or the bit line pair etc. and the magnitude of the noise is also increased. Therefore, it is possible to examine for whether or not deficiencies will arise even under these severe conditions.

In the semiconductor memory device according to another aspect of the present invention, when a standby state results, then in accordance with the mode selected from amongst a plurality of kinds of modes, the respective circuits inside the device which are necessary for the self refresh are driven for each of the circuits, or drive thereof is stopped. As a result, there is no longer the need to operate unnecessary circuits in performing the refresh, and hence power consumption can be reduced. Therefore in a standard SRAM specification memory, a pseudo SRAM, a standard DRAM or the like which use a memory cell which requires refresh, a low power consumption mode can be realized similar to the standby mode in a standard SRAM. Furthermore, since it is possible to control whether or not to operate the respective circuits for each of the circuits necessary for self refresh, it is possible to realize a unique standby mode not provided in a standard SRAM etc., where the standby current is reduced stepwise corresponding to the needs of the user or the application.

Furthermore, in the present invention, when the memory cell array is constructed with a plurality of memory cell areas which control independent refresh operations, then preferably a mode is set for each memory plate comprising the memory cell area and the peripheral circuits thereof, to operate the respective memory plates or stop the operation thereof. As a result, in relation to a memory cell area which stores information that should be held temporarily, it is not necessary to perform self refresh in the standby state. Consequently, if whether or not to operate a memory plate is determined corresponding to the assignment of the memory space which an application or the like uses, the standby current can be kept to a minimum for the needs of a user or the form of the application.

Moreover, in the present invention, a power supply circuit shared between a plurality of memory plates may be provided, and whether or not to perform power supply from this power supply circuit to the respective memory plates may be individually controlled corresponding to the mode set for each memory plate. As a result, the size of the power supply circuit does not increase in proportion to the number of memory plates. Hence even if a large number of memory plates are provided, the standby current can be reduced by the small scale circuit structure.

Furthermore, in the present invention, it is preferable to be able to set the mode for each of the memory plates by applying an input mode signal for standby. As a result, even if the needs of the user, or the application being used is changed, the standby current can be kept to a minimum while flexibly corresponding to the change.

Moreover, in the present invention, the memory plate which is to perform mode setting may be specified based on the address which is input for mode setting. As a result, compared to when for example mode setting is performed as a result of disconnection of a fuse, mode setting can be easily performed, and mode resetting can be easily performed on the user side similarly to the normal read and write. Consequently, it is not necessary to apply an exclusive signal from outside for mode setting. Also it is not necessary to provide a pin for this exclusive signal.

Furthermore, in the present invention, a first mode may be provided for operating both the refresh control circuit and the power supply circuit, a second mode may be provided for stopping operation of the refresh control circuit and operating the power supply circuit, and a third control mode may be provided for stopping the operation of both the refresh control circuit and the power supply circuit, and any of the modes may be selected from amongst these. As a result, according for example the equipment to be used or the use environment thereof, it is possible to finely control from outside, the necessity or not for data holding in the standby state, the time for recovery to the active state, the current consumption, and so on. That is to say, in the first mode, the data of the memory cell can be held because the current to the necessary circuits in self refresh is supplied, and the time from the standby state until shifting to the active state can be made the shortest amongst the three kinds of modes. Furthermore, in the second mode, as well as being able to reduce the consumption current more than for the first mode by the amount to be supplied to the refresh control circuit, when shifting from the standby state to the active state, the semiconductor memory device can be immediately used as with the first mode. Moreover, in the third mode, the consumption current can be made a minimum of the three kinds of modes.

Furthermore, in this case, when with respect to a predetermined address, there is a request to write data which is previously determined for each of the modes, or when there is a predetermined change in the activation signal, mode setting may be performed. As a result, it is not necessary to apply an exclusive signal to the semiconductor memory device for setting the standby mode. Furthermore, it is not necessary to provide a pin for this exclusive signal in the semiconductor memory device.

BEST MODE FOR CARRYING OUT THE INVENTION

As follows is a description of embodiments of the present invention with reference to the drawings. The present invention however is not to be limited to the following embodiments, and for example related components in the embodiments may also be suitably combined.

First Embodiment

Figure 1:
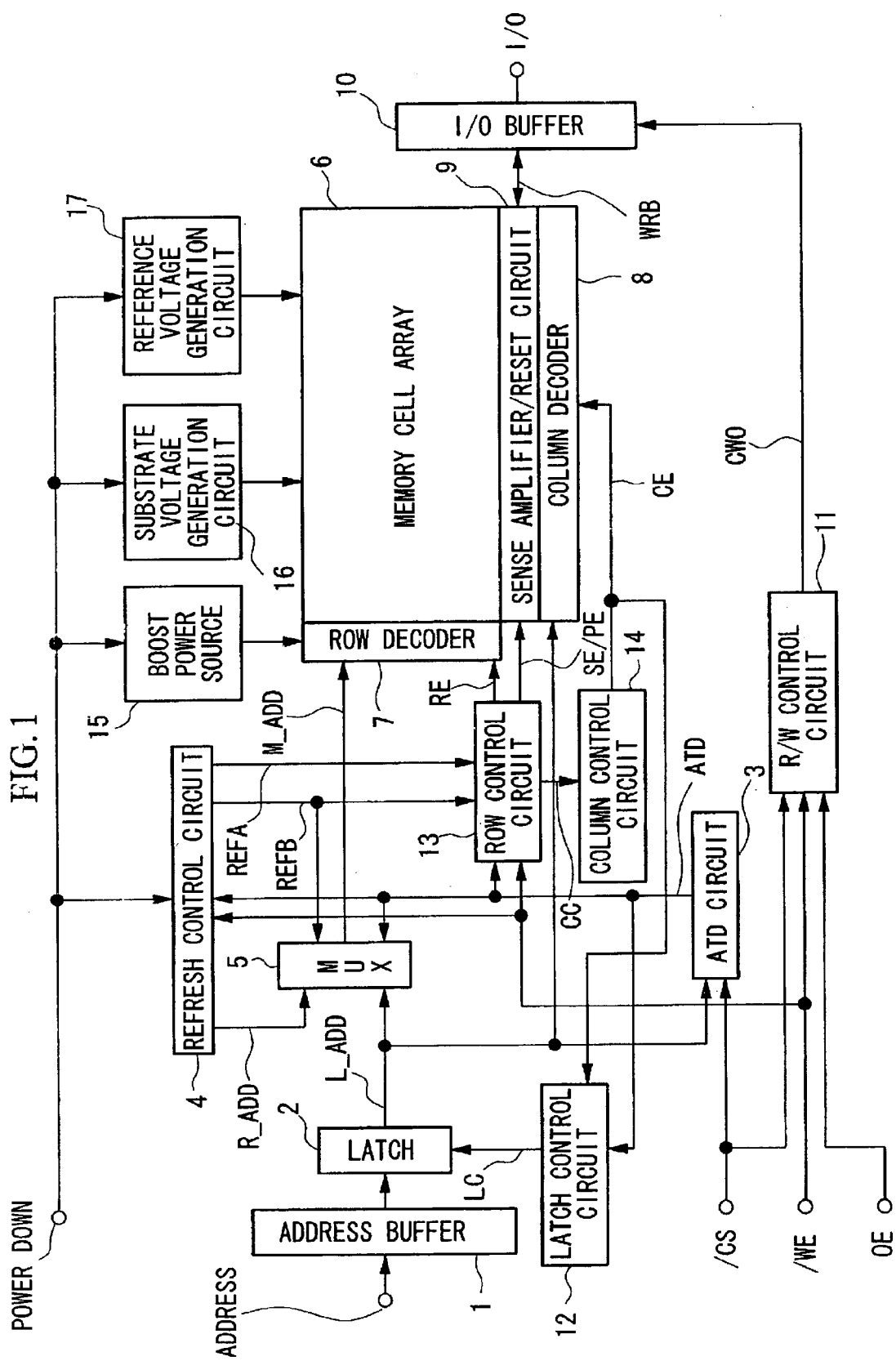
FIG. 1 is a block diagram showing the construction of a semiconductor memory device according to a first embodiment of the present invention.

FIG. 1 is a block diagram showing the construction of a semiconductor memory device according to a first embodiment of the present invention. In the figure, the label "Address" refers to an access address supplied to the semiconductor memory device from externally. Corresponding with the fact that the memory cell array, which is described below, is arrayed in a matrix form, the address "Address" incorporates a column address and a row address. An address buffer 1 buffers, and then outputs the address "Address".

A latch 2, while the latch control signal LC is a level "L" (that is, the period from the latch control signal LC falling until the next rise), outputs the address supplied from the address buffer 1 as an internal address L_ADD. Moreover, the latch 2 acquires the address supplied from the address buffer at the rising of the latch control signal LC, and holds this while the latch control signal LC is a level "H", and then outputs the held address as the internal address L_ADD.

When a chip select signal/CS is valid ("L" level), an ATD (address transition detector) circuit 3 outputs a one shot pulse signal for an address transition detection signal ATD if a transition of even a single bit of the internal address L_ADD occurs. Furthermore, the ATD circuit 3 also generates a one shot pulse for the address transition detection signal ATD in the case where the chip select signal/CS is valid. The chip select/CS signal is a selection signal which becomes valid when the semiconductor memory device shown in FIG. 1 is accessed. Furthermore, the "/" symbol at the beginning of the signal name indicates that the signal is a negative logic signal.

Here, the chip select signal/CS will be described in more detail. The chip select signal/CS is a signal for determining selection/non-selection of semiconductor memory device (chip). In particular, in a system comprising a plurality of semiconductor memory devices, it is an activation signal used for selecting a desired semiconductor memory device. In the following description a chip select signal is used an activation signal for determining selection/non-selection of a chip. However, the activation signal which can be utilized in this invention is not limited to the chip select signal, and any signal may be used provided this is one having a similar function to this.

Therefore, it is considered to use for example a chip enable signal instead of the chip select signal. However, of the so called chip enable signals, there is one having an address latch timing control function in addition to the chip activation function, as with the chip enable signal in existing pseudo SRAM. That is, as also mentioned in the description of the background art, in the existing pseudo SRAM, the chip enable signal for controlling the timing for address acquisition, is input each cycle as with a clock signal, and hence there is a problem with an increase in power consumption due to this.

On the other hand, one characteristic of the semiconductor memory device of the present invention is that even if the signal which becomes the trigger for the internal operation is not input each cycle as with a clock signal, operation is possible. Due to this, in the case where in the present invention the chip enable signal is used as the activation signal, a signal having a chip activation function, that is a signal not having an address latching control function, is used.

A refresh control circuit 4 incorporates an address counter (refresh counter) and a refresh timer. The refresh control circuit 4 uses the address counter and the refresh timer, together with the address transition detection signal ATD and a write enable signal/WE to control the refresh of the internal sections of the semiconductor memory device, and thereby automatically generate a refresh address and a refresh timing from within the semiconductor memory device, and perform the same refresh operation as the self refresh observed in standard DRAM. Here, the address counter generates sequentially a refresh address R_ADD for refreshing the DRAM memory cells. The refresh address R_ADD has the same bit width as the row address incorporated within the address "Address".

Furthermore, the refresh timer is used for measuring the time elapsed since the most recent external access request of the semiconductor memory device, and then initiating a self refresh of the internal sections of the semiconductor memory device when the elapsed time exceeds a predetermined refresh time. As a result, the refresh timer is reset and restarts the timing count each time the address transition detection signal ATD becomes valid.

In addition, the refresh control circuit 4 also generates refresh control signals REFA, REFB for controlling the refresh timing. The significance of these refresh control signals will be described below with reference to FIG. 2, and moreover the detailed timing of these signals will become evident in the operational description.

A multiplexer 5 ("MUX" in the drawings) functions in accordance with the levels of the address transition detection signal ATD and the later mentioned refresh control signal REFB, and if the level of the address transition detection signal ATD is level "L" and the level of the refresh control signal REFB is level "H", then the multiplexer 5 selects the row address incorporated in the internal address L_ADD (since this is complicated, there is also the case where this is simply called internal address L_ADD), and outputs the row address as an address M_ADD. In contrast, if the level of the address transition detection signal ATD is level "H", or the level of the refresh control signal REFB is level "L", then the multiplexer 5 selects the refresh address R_ADD and outputs this as the address M_ADD.

Next, a memory cell array 6 is a memory cell array similar to that used in a standard DRAM, with word lines and bit lines (or bit line pairs, hereafter treated as the same) running in rows and columns respectively, and memory cells of the same one transistor one capacitor construction as standard DRAM are arranged in a matrix at the points of intersection of the word lines and bit lines.

A row decoder 7 decodes the address M_ADD when a row enable signal RE is level "H", and activates the word line designated by the address M_ADD. When the row enable signal RE is level "L", then the row decoder 7 will not activate any word line.

A column decoder 8 decodes the column address incorporated in the internal address L_ADD when a column enable signal CE is level "H", and generates a column selection signal for selecting the bit line designated by the internal address L_ADD. When the column enable signal CE is level "L", then the column decoder 8 will not generate a column selection signal for any bit line.

A sense amplifier/reset circuit 9 comprises sense amplifiers, column switches, and precharge circuits, none of which are shown in the drawings. The column switch connects a bus WRB and the sense amplifier designated by the column selection signal output from the column decoder 8. The sense amplifier is activated when a sense amplifier enable signal SE is at level "H", and senses the electric potential of the bit line connected to the memory cell specified by the address "Address", and then amplifies this electric potential and outputs the result to the bus WRB, or alternatively writes write data supplied to the bus WRB via the bit line to the memory cell. The precharge circuit is activated when a precharge enable signal PE is at level "H", and precharges the electric potential of a bit line to a predetermined potential (for example, ½ of the power source electric potential)

An I/O (input output) buffer 10 functions in accordance with the level of a control signal CWO, and if the signal is of level "H" buffers the data read from the bus WRB at an output buffer, and then outputs the result outside the semiconductor memory device from a bus I/O. Furthermore, if the signal is of level "L" then the I/O buffer 10 places the output buffer in a floating state, and buffers write data supplied to the bus I/O from outside the semiconductor memory device at an input buffer, and then transmits this data to the bus WRB. Namely, a control signal CWO of level "H" indicates reading, and a control signal CWO of level "L" indicates writing.

Next, a R/W (Read/Write) control circuit 11 generates the control signal CWO based on the chip select signal/CS, the write enable signal/WE, and an output enable signal OE. Here the specification of the semiconductor memory device according to the present invention is that writing of data starts at the falling edge of the write enable signal/WE, and data become definite at the rising edge of the write enable signal/WE, and write (acquisition) operation is terminated. The switching timing of the control signal CWO is discussed in the operational description.

A latch control circuit 12 generates the above described latch control signal LC for determining the latch timing of the address "Address", based on the address transition detection signal ATD and the column enable signal CE. A row control circuit 13 generates the row enable signal RE, the sense amplifier enable signal SE, the precharge enable signal PE and a control signal CC, based on the refresh control signal REFA, the refresh control signal REFB, the address transition detection signal ATD and the write enable signal/WE. A column control circuit 14 generates a column enable signal CE based on the control signal CC.

A boost power source 15 is a power source which supplies a booster electric potential applied to word lines in the memory cell array 6 to the row decoder 7. Moreover, a substrate voltage generation circuit 16 is a circuit which generates a substrate voltage which is applied to the wells formed by each of the memory cells of the memory cell array 6, or the semiconductor substrate. Furthermore, a reference voltage generation circuit 17 generates a reference voltage (for example, ½ of the power source electric potential, =½ Vcc) which is used by the memory cell array 6, and the sense amplifier, the precharge circuit, and the equalize circuit inside the sense amplifier/reset circuit 9. This reference voltage use is mainly one of the three ((1) to (3)) types described below, but use of the voltage in which a dummy cell is not provided (3) is currently the most widespread.

(1) The reference voltage (½ Vcc) applied to the opposing electrode of the capacitor constituting a memory cell.

(2) In the case where a dummy cell is provided, the reference electric potential when a sense amplifier judges whether data retained in a memory cell is "0"/"1", based on an electric potential read from a memory cell to one bit line of a bit line pair, and an electric potential (½ Vcc) read from the dummy cell to the other bit line.

(3) In the case where a dummy cell is not provided, the reference voltage used as the precharge and equalize voltage of a bit line pair. In this case, the read voltage from a memory cell exists at one bit line, and the other bit line is set to the precharge voltage (½ Vcc) just prior to commencement of the sense operation.

At this point a power down control signal "PowerDown" is supplied to the refresh control circuit 4, the boost power source 15, the substrate voltage generation circuit 16 and the reference voltage generation circuit 17. This power down control signal "PowerDown" is a signal which designates from externally the mode when the semiconductor memory device is placed in a powered down state (a standby state). As described below, the refresh control circuit 4, the boost power source 15, the substrate voltage generation circuit 16, and the reference voltage generation circuit 17 control their own respective power source supplies in accordance with the power down control signal "PowerDown".

In this first embodiment, because the memory cell itself is the same as that of a DRAM, it is not possible to simply stop power supply to each of the internal circuits of the semiconductor memory device as is the case in a standby state of SRAM. Even in a standby state, power must continue to be supplied to those circuits necessary for the refresh operation used for retention of the data in the memory cells. Hence, the semiconductor memory device of the present embodiment can not be completely compatible with SRAM in terms of the standby state. However in the present embodiment, in order to have the best compatibility with SRAM, a number of modes are provided in the standby state, including some modes which do not exist in conventional semiconductor memory devices.

That is, in this first embodiment, three different standby modes are provided depending on which of the refresh control circuit 4, the boost power source 15, the substrate voltage generation circuit 16, and the reference voltage generation circuit 17 are to be operated. In this specification these standby modes will be called standby mode 1 to 3 for purposes of simplicity. Standby mode 1 is a mode where power is supplied to all four kinds of circuits. Standby mode 2 is a mode where of the four kinds of circuits, power supply to the refresh control circuit 4 is stopped, while power continues to be supplied to the other three kinds of circuits. Standby mode 3 is a mode where power supply to all four kinds of circuits is stopped.

From the above description, a possible circuit for supplying the power down control signal "PowerDown" could be constructed of a first power supply line for supplying power to the refresh control circuit 4, and a second power supply line for supplying power to the boost power source 15, the substrate voltage generation circuit 16, and the reference voltage generation circuit 17.

Next is a more detailed description of each of the standby modes. The standby mode 1 is the same power supply mode as standard DRAM, and of the three kinds of standby modes displays the highest current consumption. However in this case, power supply is maintained to all of the circuits necessary for self refreshing of the memory cells. Consequently, the memory cell data is retained immediately before transition to standby state, and moreover the time of the transition of the semiconductor memory device from standby state back to an active state is the shortest of the three different standby modes. In setting to standby mode 1, power may be supplied to both the first power supply line and the second power supply line.

On the other hand, in the standby mode 2, power is not supplied to a circuit necessary for the self refresh operation. As a result, the memory cell data cannot be retained in the standby state, although the current consumption can be reduced by that amount relative to the standby mode 1. Namely, this standby mode attempts to divert thinking away from the established concept of data retention in a standby state, and after the device transitions from the standby state to an active state, the premise is made that the entire memory cell array is able to be written to. Consequently, when the active state is restored, the data of the memory cell for the point of transition to the standby state is not retained. Therefore, the standby mode 2 and the standby mode 3 described below are suitable for cases such as where the semiconductor memory device is used as a buffer. In setting the standby mode 2, power supply to the refresh control circuit 4 is stopped so as to not to supply power to the first power supply line.

On the other hand, in the standby mode 3, because the boost voltage, the substrate voltage and the reference voltage all need to be raised, the time of the transition of the semiconductor memory device from standby state back to an active state is the longest of the three different standby modes, although as a result the standby mode current consumption can be reduced to the smallest value. In all of the standby modes 1 to 3, among the circuits other than the four kinds of circuits described above, power should be supplied only to those circuits which are required. For example, if only self refresh is to be performed then the address buffer 1, the latch 2, the ATD circuit 3, the column decoder 8, the I/O buffer 10, the R/W control circuit 11, the latch control circuit 12, and the column control circuit 14 are not used, and so stopping the power supply will cause no problems. In setting the standby mode 3, power supply to all of the refresh control circuit 4, the boost power source 15, the substrate voltage generation circuit 16, and the reference voltage generation circuit 17 is stopped so as to not to supply power to either of the first power supply line and the second power supply line.

By providing the standby modes described above, the need for data retention in the standby state, the recovery time to an active state, and the level of current consumption can be controlled carefully from outside the semiconductor memory device, in accordance with the equipment to which the semiconductor memory device is being applied and the operating environment. Moreover, the power down control signal "PowerDown" is not an essential function and may be omitted, which would make it possible to maintain an exact compatibility with the I/O pins of a standard SRAM.

Figure 2:
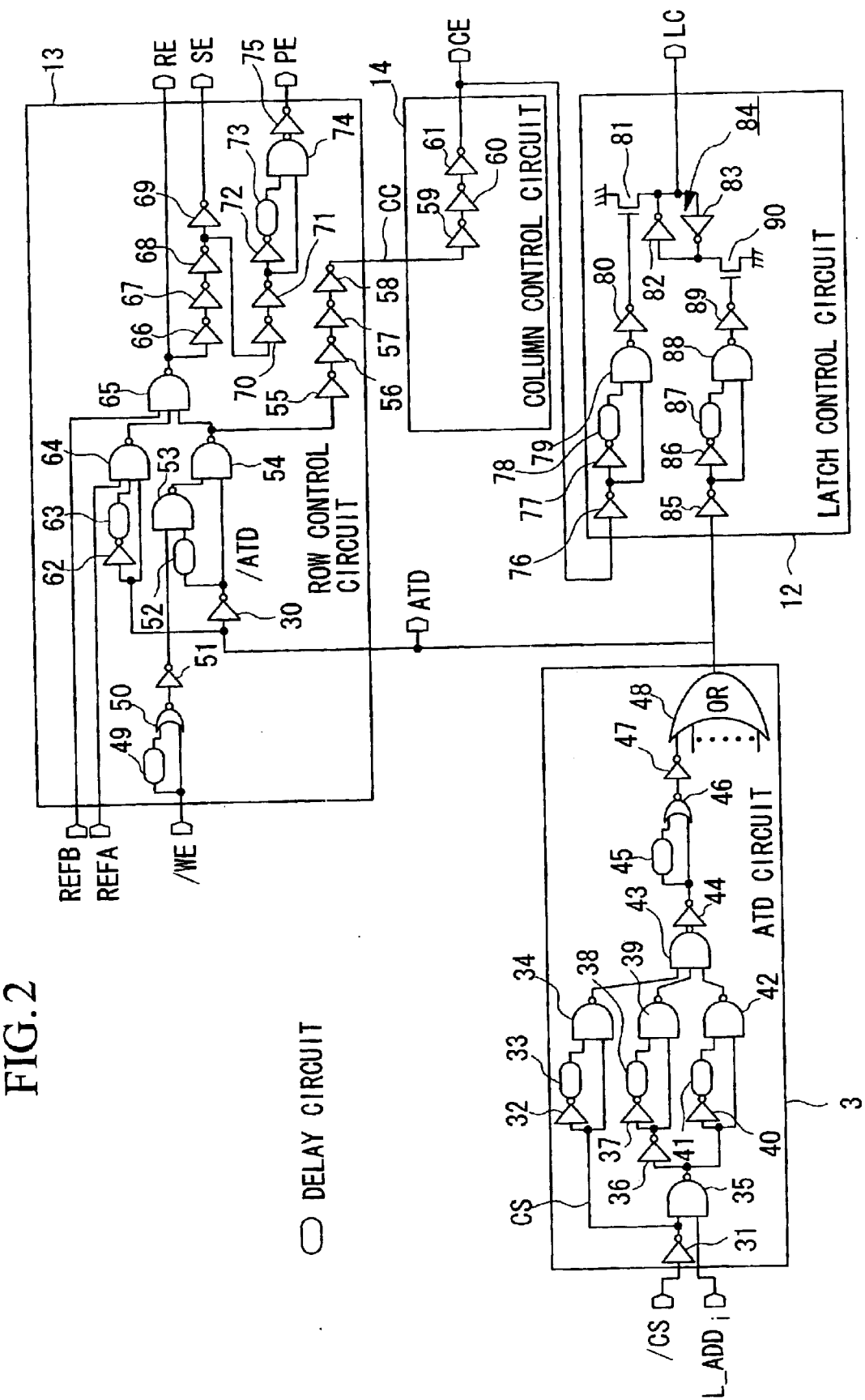
FIG. 2 is a circuit diagram showing the detailed construction of essential sections of the semiconductor memory device according to the first embodiment.

Next is a detailed description of the circuit constructions of the ATD circuit 3, the latch control circuit 12, the row control circuit 13, and the column control circuit 14 shown in FIG. 1, with reference to FIG. 2. In FIG. 2, those structural elements and signal names which are identical with those shown in FIG. 1 are assigned the same numerals.

Focusing first on the ATD circuit 3, an inverter 31 inverts the chip select signal/CS and generates a chip select signal CS. An inverter 32, a delay circuit 33, and a NAND gate 34 generate a negative one shot pulse after the rising of the chip select signal CS, of a width equivalent to the time delay applied by the inverter 32 and the delay circuit 33.

An internal address L_ADDi is one of bits of the internal address L_ADD shown in FIG. 1. When the chip select signal CS is active, a NAND gate 35 supplies the internal address L_ADDi, via an inverter 36, to a circuit comprising an inverter 37, a delay circuit 38 and a NAND gate 39. This results in the generation of a negative one shot pulse after the rising of the internal address L_ADDi, of a width equivalent to the time delay applied by the inverter 37 and the delay circuit 38. In a similar manner, a circuit comprising an inverter 40, a delay circuit 41 and a NAND gate 42 generates a negative one shot pulse after the falling of the internal address L_ADDi, having a width equivalent to the time delay applied by the inverter 40 and the delay circuit 41.

A NAND circuit 43 and an inverter 44 combine the one shot pulses generated by the rise of the chip select signal CS, or the rise or fall of the internal address L_ADDi, and then output the resulting positive one shot pulse. A delay circuit 45, a NOR gate 46 and an inverter 47 are used for extending the pulse widths of each of the one shot pulses output from the inverter 44 by a time delay applied by the delay circuit 45. A circuit block of the type described above is provided for each bit of the internal address L_ADD. An OR gate 48 combines the one shot pulses generated by all of the bits of the internal address L_ADDi, and outputs the result as the address transition detection signal ATD.

In this manner, in this first embodiment, a one shot pulse is generated from the transition of each bit of the internal address L_ADDi, and the one shot pulses are then combined using a logical OR operation. The reason for this approach is as follows. If the assumption is made that a one shot pulse is generated for the address transition detection signal ATD every time any bit of the address "Address" transitions, then when the address "Address" incorporates a skew, a plurality of address transition detection signals will be generated.

This will mean that, as described above in the background art, these address transition detection signals ATD will cause a plurality of word lines to be activated simultaneously. Consequently, either writing will occur to a plurality of memory cells, or reading will occur simultaneously from a plurality of memory cells followed by rewriting, and as a result, memory cell data will be destroyed.

In comparison in this embodiment, first a one shot pulse is generated for the bit from the address "Address" which transitions first, and then in the case where another bit transitions during the generation period of the first one shot pulse, then the already generated one shot pulse and the new one shot pulse are combined. By so doing, even if the address "Address" incorporates a skew, then the effect is limited to a lengthening of the pulse width of the one shot pulse by the amount of the skew incorporated in the address "Address", and the problem of a single address transition resulting in the generation of a plurality of one shot pulses can be avoided. Consequently, the problem of memory cell data destruction described above also disappears.

For the conditions for achieving the above, the time delays of the delay circuits 33, 38, 41 and 45 should be determined so that the skew incorporated in the address "Address" fits within the pulse width of the address transition detection signal ATD. In this regard, in those cases where the skew is large, the pulse width of the generated one shot pulse must be widened to accommodate the large skew. Consequently, this raises the concern that the fall of the address transition detection signal ATD is delayed by the amount of the skew and the access time increases. However, since in the specification of the standard SRAM, the access time becomes a value with the point where the address "Address" becomes definite as the reference, provided the access time from the last bit of the address "Address" to transition is guaranteed, no operational delay will result.

Furthermore, as is described below in the operational description, because refreshing occurs while the one shot pulse of the address transition detection signal ATD is generated, it is preferable that the pulse width of the one shot signal is set to a value greater than the time required for the completion of a refresh operation on a single word line. Consequently, the time delays of the delay circuits 33, 38, 41 and 45 should be determined not only to meet the conditions of the aforementioned skew, but also to satisfy the conditions for refreshing. Furthermore, if the one shot pulse of the address transition detection signal ATD falls immediately following completion of the refresh operation, then following this, access for reading and writing to the address "Address" will occur.

Next, to describe the row control circuit 13, an inverter 30 inverts the address transition detection signal ATD and generates and address transition detection signal/ATD. Furthermore, a circuit comprising a delay circuit 49, a NOR gate 50, an inverter 51, a delay circuit 52, a NAND gate 53 and a NAND gate 54, is a circuit for generating, based on the write enable signal/WE and the address transition detection signal ATD, the row enable signal RE, the sense amplifier enable signal SE, the column enable signal CE, the precharge enable signal PE and the latch control signal LC which are necessary for access requested from outside the semiconductor memory device.

Of the above circuits, the circuit comprising the delay circuit 49, the NOR gate 50 and the inverter 51 is to prevent the problem arising, in the case where the write enable signal/WE becomes level "L" before the transition of the internal address L_ADDi or the chip select signal/CS causes the address transition detection signal ATD to shift to level "H", of pulses being generated sequentially for the row enable signal RE, the sense amplifier enable signal SE, the column enable signal CE, the precharge enable signal PE and the latch control signal LC.

In order to achieve this result, the write enable signal/WE should be supplied to the NAND gate 54 through the NOR gate 50, the inverter 51 and the NAND gate 53 after the address transition detection signal ATD has risen and a level "L" signal has been supplied from the inverter 30 to the NAND gate 54. Hence, a signal resulting from the delay of the write enable signal/WE by the delay circuit 49, and the write enable signal/WE itself, undergo a logical OR operation at the NOR gate 50 and the inverter 51, and the time delay of the delay circuit 49 is adjusted so that the fall of the write enable signal/WE is delayed sufficiently to prevent the aforementioned problem. In the circuits described above, because the output from the inverter 51 will rise in accordance with the rise of the write enable signal/WE, then when the write enable signal/WE is at level "H", a subsequent transition to a reset operation is possible.

In cases other than during writing (in other words when the write enable signal/WE is at level "H" and a level "H" signal is supplied from the inverter 51 to the NAND gate 53), the circuit comprising the delay circuit 52, the NAND gate 53 and the NAND gate 54 generates a one shot pulse as the row enable signal RE from the falling edge of the address transition detection signal ATD. Furthermore, this circuit also maintains the row enable signal RE, the sense amplifier enable signal SE, the column enable signal CE, the precharge enable signal PE and the latch control signal LC at level "H" during a write request while the address transition detection signal ATD is level "L". In other words, if the address transition detection signal ATD is of level "L", then a level "H" signal is supplied from the inverter 30 to the NAND gate 53 and the NAND gate 54. Consequently, if the write enable signal/WE output from the inverter 51 at this time is of level "L", then the row enable signal RE will be remain at level "H" through the NAND gate 53, the NAND gate 54 and a NAND gate 65.

Then, the output from the NAND gate 54 is delayed by the inverters 55 to 58, and output as a control signal CC. This control signal CC is delayed still further by the inverters 59 to 61 which make up the column control circuit 14 and becomes the column enable signal CE. Furthermore, in the row control circuit 13, a circuit comprising an inverter 62, a delay circuit 63 and a NAND gate 64 is a circuit for generating the row enable signal RE, the sense amplifier enable signal SE and the precharge enable signal PE required for the refresh operation. That is, in the case where the refresh control signal REFA is at level "H", this circuit generates a negative one shot pulse from the time of the rise of the address transition detection signal ATD, of a pulse width equivalent to the time delay applied by the inverter 62 and the delay circuit 63. Then, the NAND gate 65 combines the refresh control signal REFB, and the outputs from the NAND gate 54 and the NAND gate 64, and outputs the result as the row enable signal RE.

The refresh control signal REFA is a signal for controlling whether or not a refresh operation is performed accompanying an access request from outside the semiconductor memory device. That is, if this signal is at level "H", then a one shot pulse can be generated for a row enable signal RE with the rise of the address transition detection signal ATD produced by the access request, and a refresh operation started. In contrast, if the signal is at level "L", then even if a one shot pulse is generated for the address transition detection signal ATD, a one shot pulse will not be generated for the row enable signal RE.

Here, in this embodiment, as a refresh operation triggered by generation of the address transition detection signal ATD, the following actual example is assumed and described. That is, in this embodiment, in the case where the refresh operation accompanying reading and writing is continuous, refresh is performed continuously in these respective memory cycles so that all of the memory cells are refreshed. Then, when all of the memory cells are refreshed, a condition results where refresh does not occur for a while. After this when near the limit condition for holding the data of the memory cells (cell hold limit), this is detected, the condition again moves to the where refresh is continuously performed in continuous memory cycles.

The main factors for falling the refresh control signal REFA would be in those cases where the refresh of a first refresh cycle has been completed by refresh accompanying an external access request, but where there is still time available before starting the refresh of the next refresh cycle, or in those cases where because a self refresh has been started, there is no need to perform refresh accompanying an external access requests until this is completed.

Here in generating the refresh control signal REFA, a construction is considered where a latch circuit for holding the refresh control signal REFA is provided inside the refresh control circuit 4, and set and reset of this latch circuit is controlled by the address transition detection signal ATD and the output signal of the refresh timer. More specifically, a timing slightly before the refresh operation becomes necessary (cell hold limit) is generated by the refresh timer, and the set signal for the latch circuit is generated inside the refresh control circuit 4 based on the output signal thereof, to set the latch circuit, and a level "H" signal is output for the refresh control signal REFA. The timing for generating the set signal is determined taking into consideration the maximum value of the cycle time. After this, the row control circuit 13 triggers the refresh control signal REFB which is generated based on the address transition detection signal ATD or the refresh control signal REFA, and proceeds towards the refresh operation of the memory cell at word line units. Then, when the refresh operation has been performed for all of the memory cells, the reset signal of the latch circuit is generated inside the refresh control circuit 4 to reset the latch circuit, and a level "L" signal is output for the refresh control signal REFA.

The reset of the latch circuit may be performed to suit the time of competing the refresh operation in the refresh cycle for refreshing the last word line. Alternatively, when the refresh operation is finished, the row control circuit 13 may generate a refresh operation completion signal, and when the refresh control circuit 4 receives this refresh operation completion signal at a refresh cycle for the last word line, the latch circuit may be reset. However, considering the situation described later for FIG. 7, in the interval from when the refresh control signal REFA rises until the refresh which is first performed after this rising is complete, if the address transition detection signal ATD is not generated (refer to FIG. 8) or the write enable signal/WE is not input (refer to FIGS. 10, 11), then the latch circuit is reset after completion of the first refresh.

On the other hand, the refresh control signal REFB is a signal for self refresh. That is, by applying a negative one shot pulse for the refresh control signal REFB, then regardless of the output from the NAND gate 54 and the NAND gate 64, a one shot pulse can be forcibly generated for the row enable signal RE and a self refresh operation initiated.

Here, in generating the refresh control signal REFB, a construction is considered where a delay circuit for delaying the refresh control signal REFA, and a pulse generation circuit for generating a negative one shot pulse are provided inside the refresh control circuit 4, and the timing for generating the negative one shot pulse from the pulse generating circuit is controlled by the refresh control signal REFA delayed by the delay circuit, and the address transition detection signal ATD.

Usually, the refresh control signal REFB becomes a level "H". In this condition, in the case where the refresh control signal REFA rises to give the level "H", the rising of the refresh control signal REFA is delayed by a predetermined time in the delay circuit, and when the address transition detection signal ATD is not generated during this delay, the pulse generation circuit starts at the rinsing of the delayed refresh control signal REFA, and outputs a negative one shot pulse for the refresh control signal REFB.

The abovementioned predetermined time delay is for measuring up until the limit of the time required for refresh of the memory cell, so that the trigger for generating the address transition detection signal ATD is not applied from the outside. Furthermore, as described later (refer to FIG. 11), in the case where the write enable signal/WE falls during the abovementioned delay, in order to perform self refresh after performing write, the time required for this writing is also considered, and sets the timing of the rising of the refresh control signal REFA and the abovementioned predetermined time delay.

The present invention is not limited to the abovementioned refresh operation embodiment, and for example a form is possible where the memory cell is refreshed at a constant period for each word line of a predetermined number (that is for each single word line, or each plurality of word lines). In this case, the circuit construction for generating the refresh control signal REFB may be the same as described above. However the circuit construction for generating the refresh control signal REFA is for example as follows.

At first, the refresh timer generates a trigger signal for starting the refresh, at a constant period. Then, as with the abovementioned case, a latch circuit is provided inside the refresh control circuit 4, and based on the trigger signal output by the refresh timer, the latch circuit is set by a set signal which is generated at a timing slightly before the refresh operation becomes necessary, and the refresh control signal REFA becomes a level "H". In this case also, the timing for setting the latch circuit is determined taking into consideration the maximum value of the cycle time.

Then, in conformity with the timing when the row control circuit 13 which receives the address transition detection signal ATD or the refresh control signal REFB completes the refresh operation of the memory cell, the refresh control circuit 4 resets the latch circuit by the reset signal generated, and the refresh control signal REFA becomes a level "L". In this case the reset of the latch circuit may be performed at a fixed time delay timing from when the latch circuit is set. Alternatively, the row control circuit 13 may generate a refresh operation completion signal when the refresh operation is completed, and the refresh control circuit 4 may reset the latch circuit when this refresh operation completion signal is received.

Incidentally, in this form, when the refresh operation which the address transition detection signal ATD triggers is competed, the refresh control signal REFA in the respective memory cycles falls. The signal waveform of this refresh control signal REFA is the same as, for example, the signal waveform at the refresh cycle timing shown in FIG. 4.

Next, inverters 66 to 69 delay the row enable signal RE and generate the sense amplifier enable signal SE. Furthermore, by further delaying the output from the inverter 68, inverters 70 and 71 generate a negative one shot pulse which is delayed five inverter stages from the row enable signal RE. A circuit comprising an inverter 72, a delay circuit 73, a NAND gate 74 and an inverter 75 generates a one shot pulse from the rising of the signal produced by delaying the row enable signal RE by five inverter stages, of a pulse width equivalent to the time delay applied by the inverter 72 and the delay circuit 73, and then outputs this one shot pulse as the precharge enable signal PE. In other words, the one shot pulse of the precharge enable signal PE is produced in accordance with the fall of the row enable signal RE.

Next, considering the latch control circuit 12, a circuit comprising an inverter 76, an inverter 77, a delay circuit 78, a NAND gate 79 and an inverter 80 generates a positive one shot pulse from the falling of the column enable signal CE, of a width equivalent to the time delay of the inverter 77 and the delay circuit 78. An n-channel transistor 81 connects the latch control signal LC to a grounded electric potential in response to the supply of a one shot pulse from the inverter 80, to give a level "L". Furthermore, the inverters 82 and 83 which are connected in a loop arrangement, comprise a latch 84 for retaining the latch control signal LC, and by switching the transistor 81 ON, the value retained by the latch 84 is reset to "0".

Furthermore, a circuit comprising an inverter 85, and inverter 86, a delay circuit 87, a NAND gate 88 and an inverter 89 generates a positive one shot pulse from the falling of the address transition detection signal ATD, of a width equivalent to the time delay of the inverter 86 and the delay circuit 87. An n-channel transistor 90 connects the input terminal of the inverter 82 to a grounded electric potential in response to the supply of a one shot pulse from the inverter 89. As a result, the latch control signal LC switches to level "H", and the value retained by the latch 84 is set to "1". In other words, the latch control signal LC is a signal which is at level "H" from the falling of the address transition detection signal ATD until the time of the fall of the column enable signal CE.

As follows is a description of the operation of a semiconductor memory device of the above construction in a variety of situations.

Read with Accompanying Refresh

Figure 3:
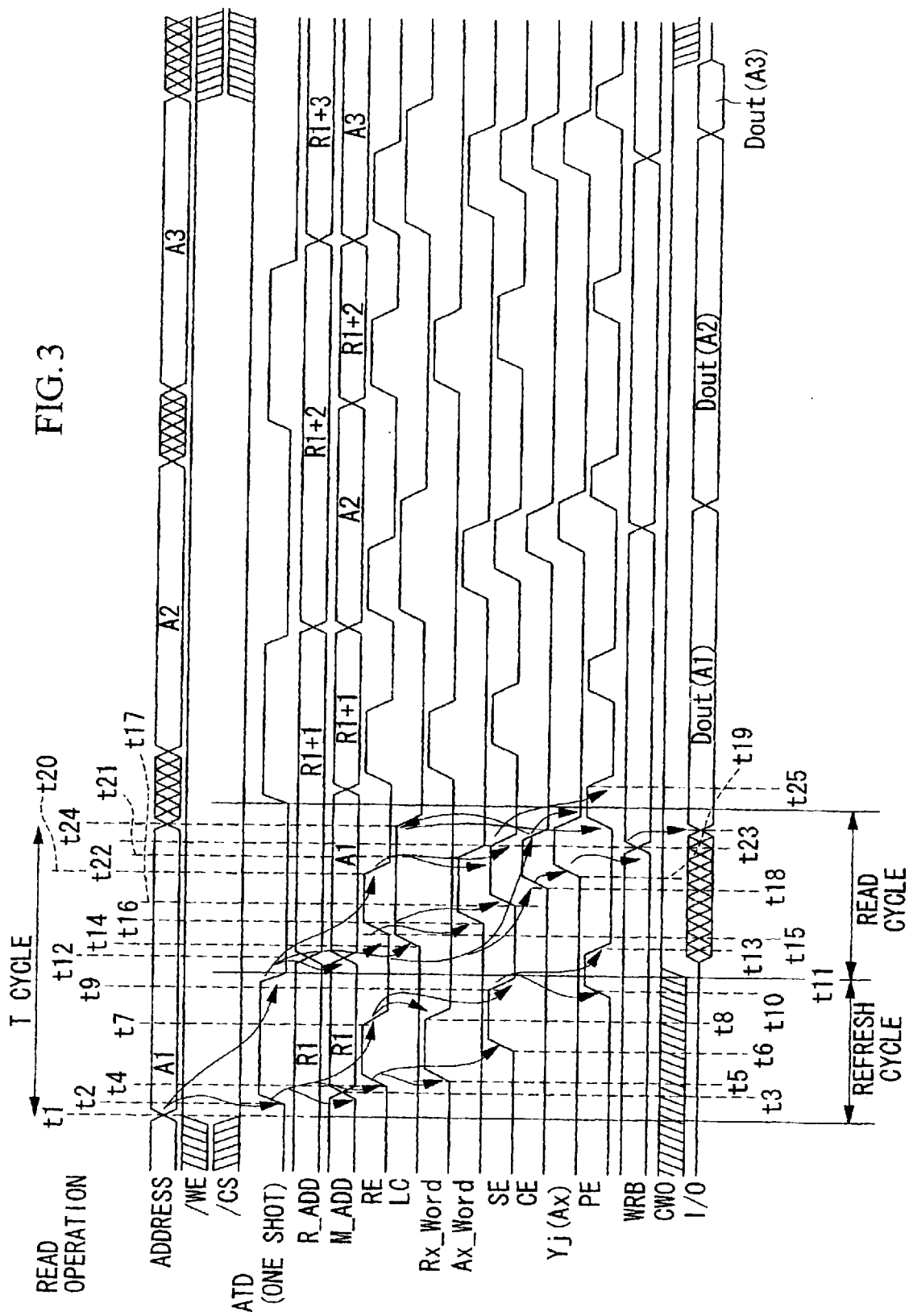
FIG. 3 is a timing chart for the semiconductor memory device according to the first embodiment, showing operations for the case where a refresh and a subsequent read are executed within one memory cycle.

First is a description, with reference to the timing chart of FIG. 3, of operations in the case where a read operation and an accompanying refresh are performed by sequentially altering the read address. FIG. 3 shows the timing for when the refresh operation triggered by the generation of the address transition detection signal ATD, is continuously performed for the respective memory cycles. Therefore, both the refresh control signals REFA and REFB are fixed at level "H", and these signals are not specifically shown in FIG. 3. Furthermore, in this case because there is a read operation, the write enable signal/WE will remain at level "H". Moreover, a label "Rx_Word" shown in FIG. 3 represents the word line corresponding to the refresh address R_ADD, and a label "Ax_Word" represents the word line corresponding to the address "Address". Furthermore, in FIG. 3, from before that shown in FIG. 3, the value of the refresh address R_ADD is "R1".

First, at time t1, the address "Address" begins to transition from a previous value to a value "A1", and the chip select signal/CS becomes valid. At this point, as will become evident from the description below, the latch control signal LC is at level "L". As a result, the address "Address" is buffered in the address buffer 1, passes through the latch 2, and is supplied to the ATD circuit 3 as the internal address L_ADD. Moreover, because there is a possibility of the address "Address" incorporating a skew, then in the same manner as for standard SRAM, the value of the address "Address" need not necessarily be definite at this point.

As a result, the address is not latched by the latch 2 at time t1, and so the value of the address will be definite as "A1"

until the latch control signal LC shifts to level "H", at which point the address is latched by the latch 2. Due to the above situation, in the present embodiment, the waiting period during which the value of the address "Address" supplied from outside the semiconductor memory device is indefinite, is devoted to refreshing, and so the waiting period, which is not used for internal operations in standard SRAM, can be effectively utilized.

Next, once the address "Address" (=the internal address L_ADD) has transitioned, at a time t2 the ATD circuit 3 generates a one shot pulse for the address transition detection signal ATD. When the address transition detection signal ATD rises, the multiplexer 5 selects the refresh address R_ADD, and then at a time t3 the value of the address M_ADD becomes R1. Furthermore, the rising of the address transition detection signal ATD causes the row control circuit 13 to generate a one shot pulse for the row enable signal RE as from a time t4.

By so doing, at the rising of the row enable signal RE, the row decoder 7 decodes the "R1" value of the address M_ADD, and at a time t5 activates the word line Rx_Word. As a result, the retained data of the memory cells connected to the word line Rx_Word appear as electric potentials on the bit line in the memory cell array 6. On the other hand, by the generation of a one shot pulse for the row enable signal RE, at a time t6, a one shot pulse is also generated for the sense amplifier enable signal SE. Consequently, the sense amplifier within the sense amplifier/reset circuit 9 is activated, and refresh is performed for each of the memory cells connected to the word line Rx_Word. The refresh itself is identical with that performed in DRAM and is a well-known technique matter, and as such is not described in detail here.

Subsequently, at a time t7, when the one shot pulse generated for the row enable signal RE falls, the row decoder 7 deactivates the word line Rx_Word. Therefore, at a time t8, the word line Rx_Word is deactivated. Furthermore, at a time t9, in response to the fact that the row enable signal RE has fallen at the previous time t7, the row control circuit 13 lowers the sense amplifier enable signal SE. Consequently, the sense amplifier within the sense amplifier/reset circuit 9 which has completed the refresh operation is deactivated. Furthermore, the row control circuit 13 receives the fall of the row enable signal RE, and at a time t10 generates a one shot pulse for the precharge enable signal PE.

Consequently, the precharge circuit within the sense amplifier/reset circuit 9 precharges the bit line in preparation for the next access. In the refresh process, there is no need to output the memory cell data to outside the semiconductor memory device. Therefore in contrast to the case of a read operation, even if a one shot pulse is generated for the row enable signal RE, a one shot pulse is not generated for the column enable signal CE. Consequently, the column decoder 8 leaves all of the column selection signals in a deactivated state, and as shown in the figure, for example, a column selection signal Yj (Ax) will remain at level "L".

Next, at a time t11, when the one shot pulse of the address transition detection signal ATD falls, the output enable signal OE becomes valid, although this is not shown in FIG. 3. Then, the R/W control circuit 11 sets the control signal CWO to level "H" in preparation for reading from the memory cell. Furthermore, the I/O buffer 10 sends the data output from the sense amplifier/reset circuit 9 via the bus WRB to the bus I/O. However, at this point the bus WRB data is still indefinite. Moreover, in response to the fact that the address transition detection signal ATD has fallen, at a time t12, the refresh control circuit 4 updates the refresh address R_ADD and shifts the value thereof to "R1+1".

Formerly, the assumption was that the value of the refresh address R_ADD was "R1", but this value also has been sequentially updated from the reset time data "0" each time the address transition detection signal ATD falls, in the same manner as that described above. Furthermore, in response to the fall of the address transition detection signal ATD, at the same time t12, the multiplexer 5 selects the internal address L_ADD side. As described above, because the address "Address" is definite at this point, the value thereof "A1" is output as the address M_ADD.

Next, at a time t13 and in accordance with the prior fall of the row enable signal RE at the time t7, the one shot pulse of the precharge enable signal PE falls and the precharge circuit within the sense amplifier/reset circuit 9 finishes the precharging operation. In contrast, in response to the fact that the address transition detection signal ATD has fallen at the time t11, the latch control circuit 12 raises the latch control signal LC at a time t14. As a result, even if the value of the address "Address" subsequently transitions, the latch 2 will retain the value of the internal address L_ADD (and consequently the address M_ADD) until the latch control signal LC falls again.

In a similar manner, in response to the fall of the address transition detection signal ATD, the row control circuit 13 generates a one shot pulse for the row enable signal RE at a time t15. Consequently, at time t16, the row decoder 7 activates the word line Ax_Word corresponding with the address "A1". As a result, the data retained in the memory cells connected to the word line Ax_Word appear as electric potentials on the bit line. Subsequently and in accordance with the rise of the row enable signal RE, the row control circuit 13 generates a one shot pulse for the sense amplifier enable signal SE at a time 17. As a result, the sense amplifier within the sense amplifier/reset circuit 9 senses the data of each memory cell connected to the word line Ax_Word, and amplifies the bit line electric potential to a "0"/"1" logic level (namely, ground potential or power source potential).

Furthermore, in response to the one shot pulse of the row enable signal RE, the row control circuit 13 generates a one shot pulse for the control signal CC and outputs the signal to the column control circuit 14. Based on this control signal CC, the column control circuit 14 generates a one shot pulse for the column enable signal CE at a time t18. When this column enable signal CE shifts to level "H", the column decoder 8 decodes the column address incorporated in the internal address L_ADD, and then at a time t19, generates as a one shot pulse for a column selection signal (refer to the signal Yj (Ax) shown in FIG. 3) corresponding with this column address. As a result, the outputs from those sense amplifiers within the sense amplifier/reset circuit 9 which correspond with this column address are selected and connected to the bus WRB.

Next, at a time t20, the row control circuit 13 lowers the row enable signal RE, and so the row decoder 7 then deactivates the word line Ax_Word at a time t21. Moreover, at a time t22, the sense results according to the previously selected sense amplifiers appear on the bus WRB. Furthermore, at the same time, the row control circuit 13 lowers the sense amplifier enable signal SE in accordance with the previously fallen row enable signal RE, and the sense operations by the sense amplifiers within the sense amplifier/reset circuit 9 are completed.

Furthermore, the row control circuit 13 lowers the control signal CC in accordance with the previously fallen row enable signal RE, and the column control circuit 14 lowers the column enable signal CE. Consequently, at a time t23, the column decoder 8 makes the column selection signal (Yj (Ax) in the figure) invalid, and as a result, the selected sense amplifiers within the sense amplifier/reset circuit 9 is disconnected from the bus WRB. Furthermore, at approximately the same time, the I/O buffer 10 outputs the memory cell data Dout (A1) read into the bus WRB, to outside the semiconductor memory device, via the bus I/O.

Next, at a time t24, the row control circuit 13 lowers the precharge enable signal PE in accordance with the previously fallen row enable signal RE, and then performs another precharge of the bit line in preparation for the next access. Furthermore at the same time, in response to the fall of the column enable signal CE, the latch control circuit 12 sets the latch control signal LC to level "L". Subsequently, at a time t25, the row control circuit 13 lowers the precharge enable signal PE at time t25, to correspond with the row enable signal RE which was lowered previously at the time t20. Consequently, the precharge circuit within the sense amplifier/reset circuit 9 stops the precharge of the bit line.

Subsequent operations are identical with the operations at the times t1 to t25 described above, and a cyclic operation with a unit of time Tcycle is then repeated. In other words, when "A2" is applied as the address "Address", then in accordance with the address transition, a one shot pulse is output for an address transition detection signal ATD. Then, following the refresh of the address "R1+1", the refresh address is updated to a value of "R1+2", and then the memory cells corresponding with the address "A2" are read, and the data Dout (A2) is output externally through the bus I/O.

Then, when "A3" is applied as the address "Address", then once again in accordance with the address transition, a one shot pulse is output as an address transition detection signal ATD, and following the refresh of the address "R1+2", the refresh address is updated to a value of "R1+3", and then the memory cells corresponding with the address "A3" are read, and the data Dout (A3) is output externally through the bus I/O.

In the manner described above, when the address "Address" transitions in the present embodiment, then first a refresh is performed on a refresh address determined by an internal address counter, and then normal access of the address "Address" is carried out. The reason for this is due to a consideration of the case at the time of a later described write operation. In other words, in standard asynchronous SRAM, the write enable signal/WE becomes valid asynchronously, with a delay relative to the transition of the address "Address".

Therefore, in constructions such as the first background art example and the second background art example, where refreshing is conducted after the processing of normal access operations, then provided the write enable signal/WE is made valid with an early timing, no particular problems arise because the refresh operation is commenced after completion of the write operation. However, in the case where the write enable signal/WE becomes valid with a delay, then the write operation and the refresh operation may overlap. Therefore in this case, write must be delayed until refresh is completed. However in so doing, the timing control becomes complex and the dimensions of the circuit increase, and the design of the logic circuit becomes that much more difficult. As a result, in order to complete the refresh and the write within a predetermined time Tcycle, it is preferable to adopt a construction where the refresh is performed before the write operation, and such a construction enables a reduction in the circuit dimensions as well as a simplification of the design of the logic circuit itself.

Read without Accompanying Refresh

Figure 4:
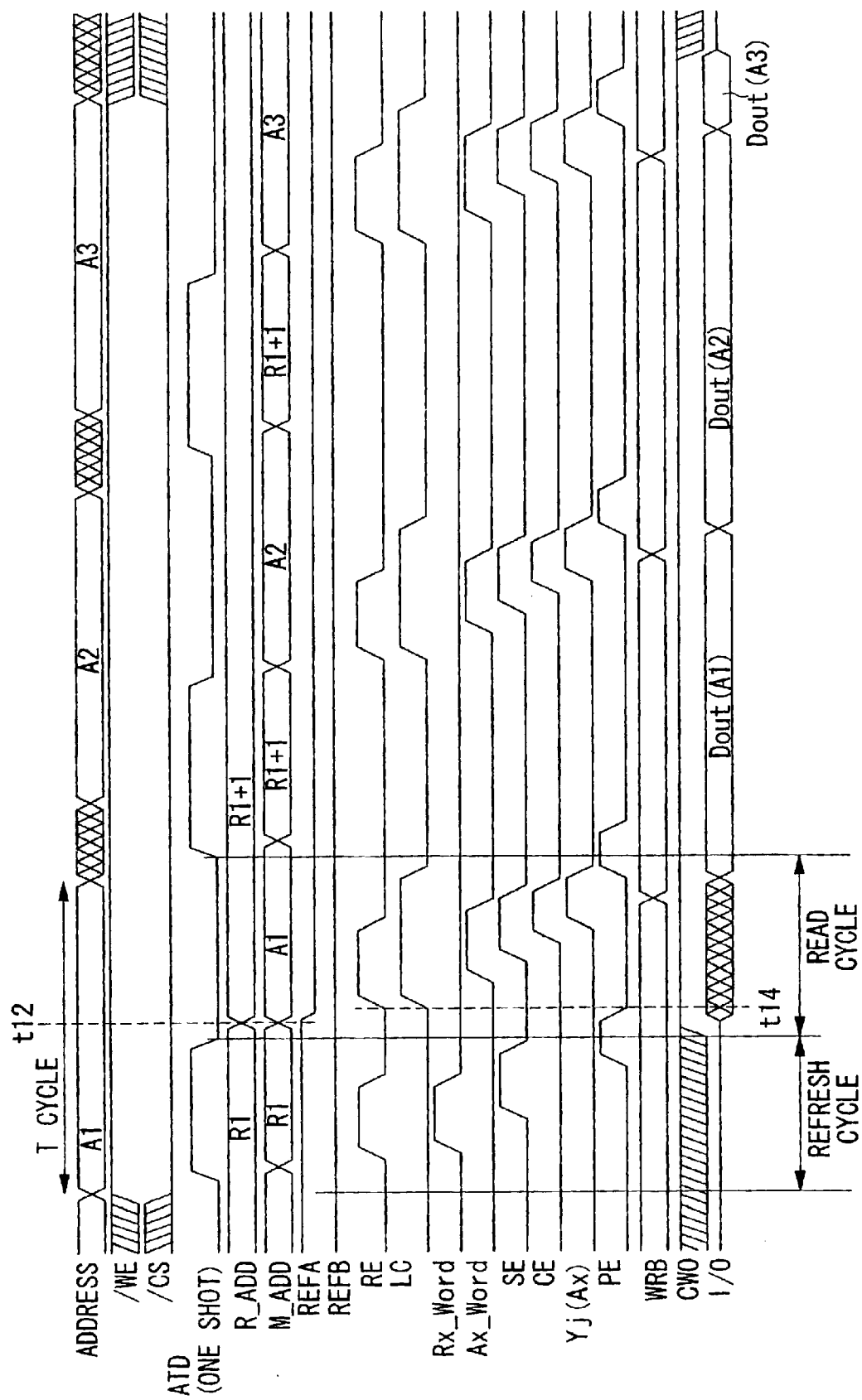
FIG. 4 is a timing chart for the semiconductor memory device according to the first embodiment, showing operations for the case where a refresh is suspended partway through and only a read is executed.

Next an operational example of the case where refresh is controlled by a refresh timer within the refresh control circuit 4 is shown in the timing chart of FIG. 4. In the same figure is shown the timing for switching from a condition where the refresh operation, which is triggered by generation of the address transition detection signal ATD, is performed continuously in each memory cycle, to the condition where the refresh operation is not performed. Therefore, whereas in FIG. 3 the refresh control signal REFA remains at level "H", in FIG. 4, during a time t12 to t14 where the refresh of one refresh cycle has been completed, the latch circuit inside the refresh control circuit 4 is reset and the refresh control signal REFA is lowered. The refresh of one refresh cycle refers to the refresh one at a time of all of the word lines. Note that the refresh control signal REFB remains at level "H", as was the case in FIG. 3.

Although dependent on the configuration and capacity of the memory cell array, the refresh operations of one refresh cycle should usually be performed within a predetermined time period of between several milliseconds and several dozen milliseconds, and a refresh need not necessarily be conducted every time a transition occurs in the address "Address". Consequently, if it is assumed that as shown in FIG. 3, the refresh operations of one refresh cycle were performed during the refresh operation accompanying an external access request, then until the refresh operations of the next refresh cycle are commenced, the refresh control signal REFA is lowered and refreshing is suspended. By so doing, extra refresh operations can be prevented and power consumption can be reduced.

As is evident from the above description, FIG. 4 is a chart showing the timing waveforms before and after the completion of one refresh cycle of refresh operations for the refresh of the address "R1". The refresh control signal REFA falls to level "L", and so the row control circuit 13 will not generate a one shot pulse for the row enable signal RE even if the address transition detection signal ATD rises. As a result, the row control circuit 13 will also not generate the sense amplifier enable signal SE and the precharge enable signal PE corresponding with the row enable signal RE.

Furthermore, the row decoder 7 will not activate the word line Rx_Word, and hence the refresh of the word line Rx_Word will also not be performed. In addition, because the refresh control signal REFA is at level "L", the address counter within the refresh control circuit 4 will halt count operations, and so the value of the refresh address R_ADD will remain at the value "R1+1" updated at the time t12. Furthermore, the address M_ADD will also remain at the value "R1+1" when the refresh address R_ADD side is selected. Subsequently, in the case where the refresh of the next refresh cycle is to be commenced, the refresh control circuit 4 will again perform the same operations shown in FIG. 3, in order to return the refresh control signal REFA to level "H".

If the refresh counter is not reset when the refresh operation is restarted in this manner, then an increment operation is performed on the value already held in the refresh counter. That is, even if for example the self refresh operation is interrupted part way through the refresh cycle (that is, the cycle which refreshes all word lines), the refresh counter is not reset, and when the next refresh operation is restarted (either the refresh accompanying normal access of read or write, or self refresh), the value remaining in the refresh counter is incremented.

Write with Accompanying Refresh

Figure 5:
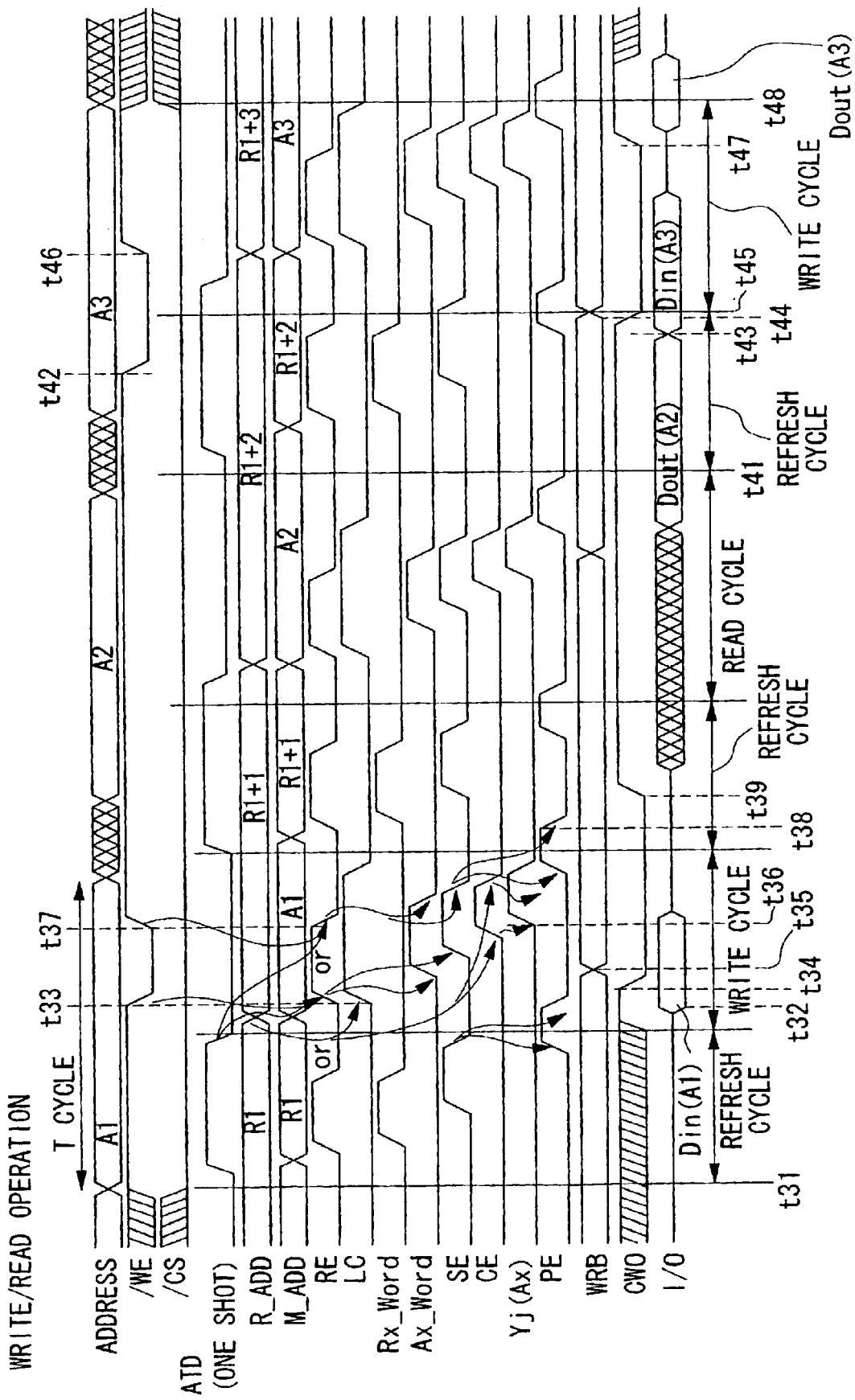
FIG. 5 is a timing chart for the semiconductor memory device according to the first embodiment, showing operations for the case where a refresh and a subsequent write are executed within one memory cycle.

Next is a description, with reference to the timing chart of FIG. 5, of operations in the case where a write operation and an accompanying refresh are performed. In this case the refresh control signal REFA and the refresh control signal REFB are both fixed at level "H", as was the case in FIG. 3, and hence these signals are not shown in FIG. 5. Furthermore, FIG. 5 is a chart where the read operation shown FIG. 3 is replaced by a write operation, although the basic operations are the same as those in FIG. 3. Consequently, the operations performed at times t31 to t38 shown in FIG. 5, are with the following exceptions, the same as the operations performed at the times t1 to t25 shown in FIG. 3.

As described above, the write enable signal/WE is input asynchronously within the memory cycle regardless of transitions in the address "Address". Consequently, in this embodiment, it is assumed that at a time t32 after the completion of the refresh operation, "Din (A1)" is supplied as the write data and placed on the bus I/O, and then at a time t33 the write enable signal/WE is lowered. Furthermore, a negative pulse is input for the write enable signal/WE, and when this signal falls at the time t33, the row control circuit 13 delays and inverts this write enable signal/WE, and then outputs the result as the row enable signal RE.

However in this case, since a one shot pulse is generated for the row enable signal RE even at the fall of the address transition detection signal ATD, in the same manner as that described for FIG. 3, then both signals are combined, and a one shot pulse output for the row enable signal RE. When a one shot pulse is generated in this manner for the row enable signal RE, the word line "Ax_Word" corresponding to the address "A1" is activated, in the same manner as the situation described in FIG. 3. Furthermore at the same time, one shot pulses are sequentially produced for the sense amplifier enable signal SE, the column enable signal CE, the column selection signal Yj (Ax) and the precharge enable signal PE.

In contrast, as the write enable signal/WE becomes valid, the RIW control circuit 11 lowers the control signal CWO at a time t34. As a result, the I/O buffer I/O will send the write data loaded on the bus I/O towards the bus WRB side, and at a time t35, a transition will be produced in the data in the bus WRB. Subsequently, at a time t36, when the column selection signal Yj (Ax) shifts to level "H", writing occurs to the memory cell specified in the address "Address". Furthermore, following completion of the write operation, the bit line is precharged in the same manner as the previous cases.

Subsequently at a time t37, when the write enable signal/WE rises, the write data becomes definite. Then the row control circuit 13 lowers the row enable signal RE. Furthermore, when the row enable signal RE falls, then in the same manner as was observed when the address transition detection signal ATD fell in FIG. 3, the sense amplifier enable signal SE, the column enable signal CE, the column selection signal Yj (Ax) and the precharge enable signal PE fall sequentially until the time t38. Furthermore, in response to the fact that the write enable signal/WE has risen at the time t37, the R/W control circuit 11 raises the control signal CWO at a time t39.

Reading from the address "A2" then occurs, although this operation is identical with the operation of reading from the address "A2" described in FIG. 3. After the read operation, a write operation to the address "A3" is carried out. The operations in this case at the times t41 to t48 correspond with the operations described above for writing to the address "A1". However in this case, the write enable signal/WE is input at an earlier timing than was the case for the writing to the address "A1". In other words, in this case the timing of the fall of the write enable signal/WE occurs during the refresh, and so differences develop in some of the operations in comparison with the write operation described above.

That is, in this case, the write enable signal/WE rises at a time t42 during the refresh operation, and also "Din(A3)," being write data, is supplied on the bus I/O at a time t43. Subsequently at a time t44, the R/W control circuit 11 lowers the control signal CWO coincidentally with the fall of the write enable signal/WE. As a result, at a time t45 data "Din(A3)" is transmitted from the I/O buffer 10 to the bus WRB. At this point, none of the word line Ax_Word, the column enable signal CE and the column selection signal Yj(Ax) is activated, so no memory cell is written.

Similarly to standard SRAM, in a semiconductor memory device of the present embodiment, the time from when the write enable signal/WE is input to when write data can be take in is defined in the specification. Accordingly, even if an attempt is made to take in write data at the point when refreshing is completed and writing is actually performed on memory cells, the value of write data cannot be guaranteed. Therefore, in the present embodiment, when the write enable signal/WE is valid during refresh, write data is taken in the bus WRB, and writing is performed to memory cells of address "Address" from the bus WRB after completing refresh.

That is, since write data on the bus WRB is at a logic level (that is ground potential or power source potential) of "0" or "1", if word line Ax_Word, sense amplifier enable signal SE, column enable signal CE and column selection signal Yj(Ax) are sequentially activated afterwards, it is possible to write to memory cells from the bus WRB. After this, similarly to the case of writing to address "A1", if a one shot pulse is generated on the row enable signal RE from the fall of the address transition detection signal ATD, writing to address "A3" and a subsequent precharge of the bit line are performed.

In this process, the write enable signal/WE rises at a time t46 and, in response to this, the R/W control circuit 11 raises the control signal CWO at a time t47. Furthermore, at the point where the write enable signal/WE has risen at a time t42, since the address transition detection signal ATD is already at level "H", the row enable signal RE is not generated immediately, but after the address transition detection signal ATD becomes level "L" it is delayed in the row control circuit 13 and output as a row enable signal RE. In this case, similarly to writing to address "A1", since a one shot pulse is generated on the row enable signal RE even at the fall of the address transition detection signal ATD, the composition of both is output as a row enable signal RE.

Write without Accompanying Refresh

Figure 6:
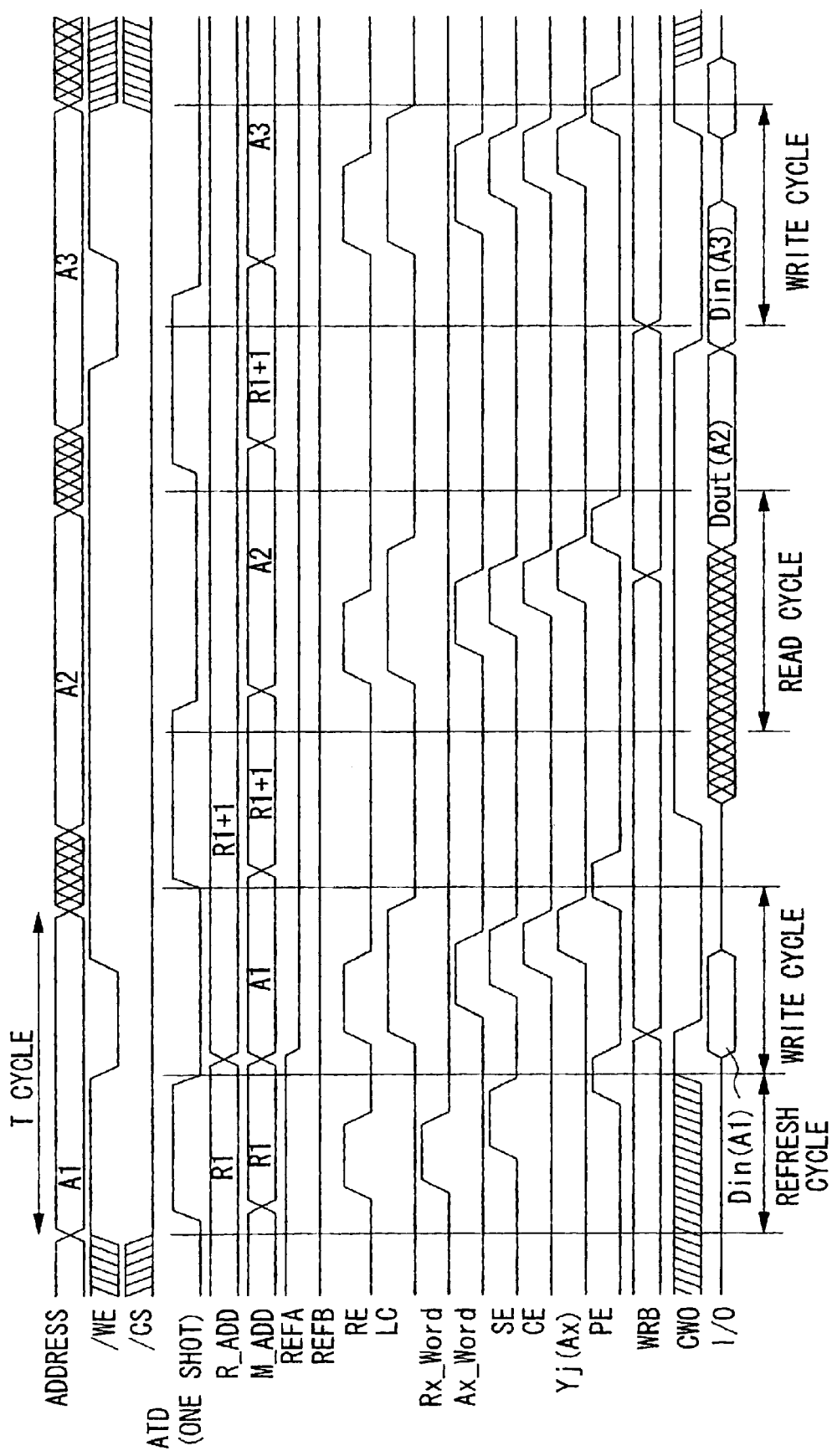
FIG. 6 is a timing chart for the semiconductor memory device according to the first embodiment, showing operations for the case where a refresh is suspended partway through and only a read or a write is executed.

Next is a description of an operational example of a case of writing wherein refresh is controlled by a refresh timer in a refresh control circuit 4, shown in the timing chart in FIG. 6. The difference between this figure and FIG. 5 are exactly the same as the difference between FIG. 3 and FIG. 4. That is, the differences from FIG. 5 are that in FIG. 6, the refresh control signal REFA is lowered after refresh is completed, in FIG. 6 the refresh address R_ADD is not updated from "R1+1", and in FIG. 6 refresh is not performed for the refresh address "R1+1" and "R1+2".

Self Refresh

Next is a description of operation where no access request is applied from outside a semiconductor memory device for a predetermined time (referred to hereunder as "refresh time"), and self refresh is performed by means of a refresh timer. This "predetermined time" may be set based on the data retention characteristics (for example data retention time) of the memory cells. As described above, in the present embodiment, when an address transition occurs accompanying an external access request, a refresh operation is performed prior to processing the access request. However, considering that external access requests may not occur for a long time, data of the memory cell array 6 cannot be retained by only refreshing when an access is requested. Therefore, in the present embodiment, self refresh is driven using the refresh timer in the refresh control circuit 4 at the point where a refresh time has elapsed after the previous external access request.

Figure 7:
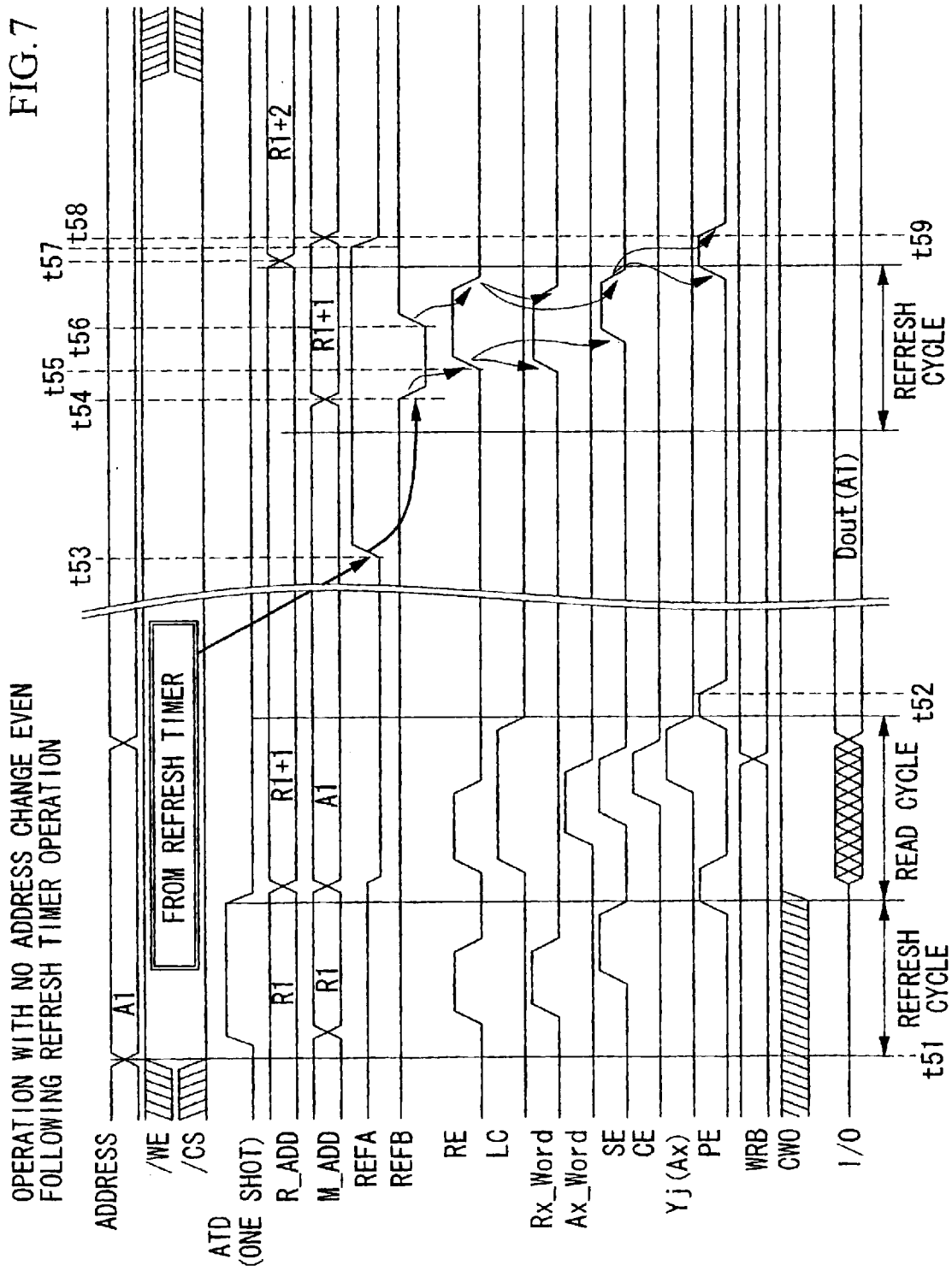
FIG. 7 is a timing chart for the semiconductor memory device according to the first embodiment, showing operations for the case where a self refresh is performed due to a refresh timer.

FIG. 7 shows the timing of this operation. At times t51 to t52 in the figure, a transition of address "Address" accompanying an external reading request is detected to perform refresh and reading. The operation during this period is exactly the same as the reading of address "A1" shown in FIG. 4, and the refresh control signal REFA becomes level "L" after this operation. Furthermore, at the point where a one shot pulse is generated on the address transition detection signal ATD, the refresh control circuit 4 resets the value of the refresh timer.

Subsequently, if a state continues in which there is no access request from outside the semiconductor memory device, the refresh control circuit 4 raises the refresh control signal REFA at a time t53 to change to a state in which refreshing is possible. If the state in which there is no access request continues despite the change of state, the refresh control circuit 4 starts the above-described pulse generation circuit with the rise of a signal delayed from the refresh control signal REFA by the above-mentioned delay circuit as a trigger, and at a time t54 generates a negative one shot pulse on the refresh control signal REFB. In this manner, the row control circuit 13 generates a one shot pulse on the row enable signal RE at a time t55 to start self refresh.

At this time, because the refresh control signal REFB becomes level "L", the multiplexer 5 selects the refresh address R_ADD side, and outputs "R1+1" as an address M_ADD. The self refresh and its following precharge are exactly the same as the operations shown in FIG. 3. In this manner, the precharge enable signal PE falls at a time t59, and self refresh and precharge are completed. Since there is no external access request at this point, access to address "Address" is not performed, which is different from times t51 to t52.

Subsequently, the pulse generation circuit in the refresh control circuit 4 raises the refresh control signal REFB at a time t56. Next, when the refresh control circuit 4 detects the rise of the refresh control signal REFB, at a time t57 it updates the value of the refresh address R_ADD to "R1+2". In this case, an address transition detection signal ATD is not generated since the refresh control signal REFA is raised at the time t53, so control does not proceed to a situation in which refresh operations accompanying address transitions are performed continuously. Accordingly, the refresh control circuit 4 changes the refresh control signal REFA to level "L" at a time t58, and initiates a state in which refresh operation is afterwards controlled continuously by the refresh timer. Furthermore, detecting the rise of the refresh control signal REFB, the multiplexer 5 selects the internal address L_ADD side after a time t59.

Figure 8:
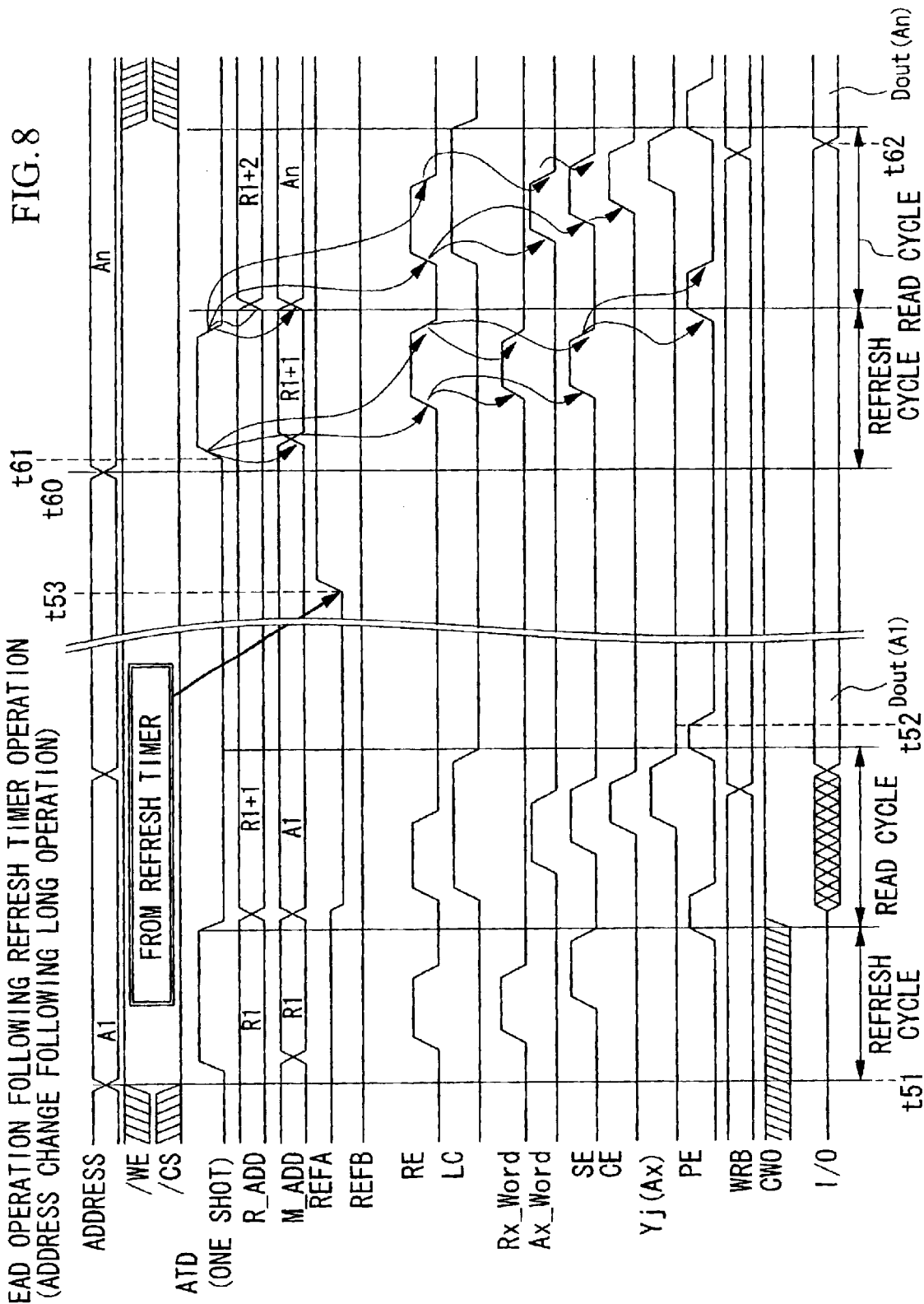
FIG. 8 is a timing chart for the semiconductor memory device according to the first embodiment, showing operations for the case where a refresh is performed due to a refresh timer, and a read is subsequently executed.

Here, if there is an external access request from outside the semiconductor memory device and a transition is detected in the address "Address" during the time t53 to t54, the operation is as in the timing chart shown in FIG. 8. That is, when the address "Address" changes to "An" at a time t60, and the ATD circuit 3 generates a one shot pulse on the address transition detection signal ATD at a time t61, the refresh control circuit 4 maintains the refresh control signal REFB at level "H" without lowering it as in FIG. 7. Accordingly, a refresh for address "R1+1" and reading from the address "An" are performed at a time t61 and later times similarly to the time t51 to t52. As a result "Dout (An)," being stored data of the address "An," is output to the bus I/O at a time t62. In FIG. 8, it is assumed that the refresh control signal REFA is raised at the time t53 approaching the cell hold limit time. Accordingly, since refresh is to be performed continuously accompanying memory cycles that continue afterwards, the refresh control signal REFA is maintained at level "H".

Write in a Case where the Write Enable Signal Input is Delayed

Figure 9:
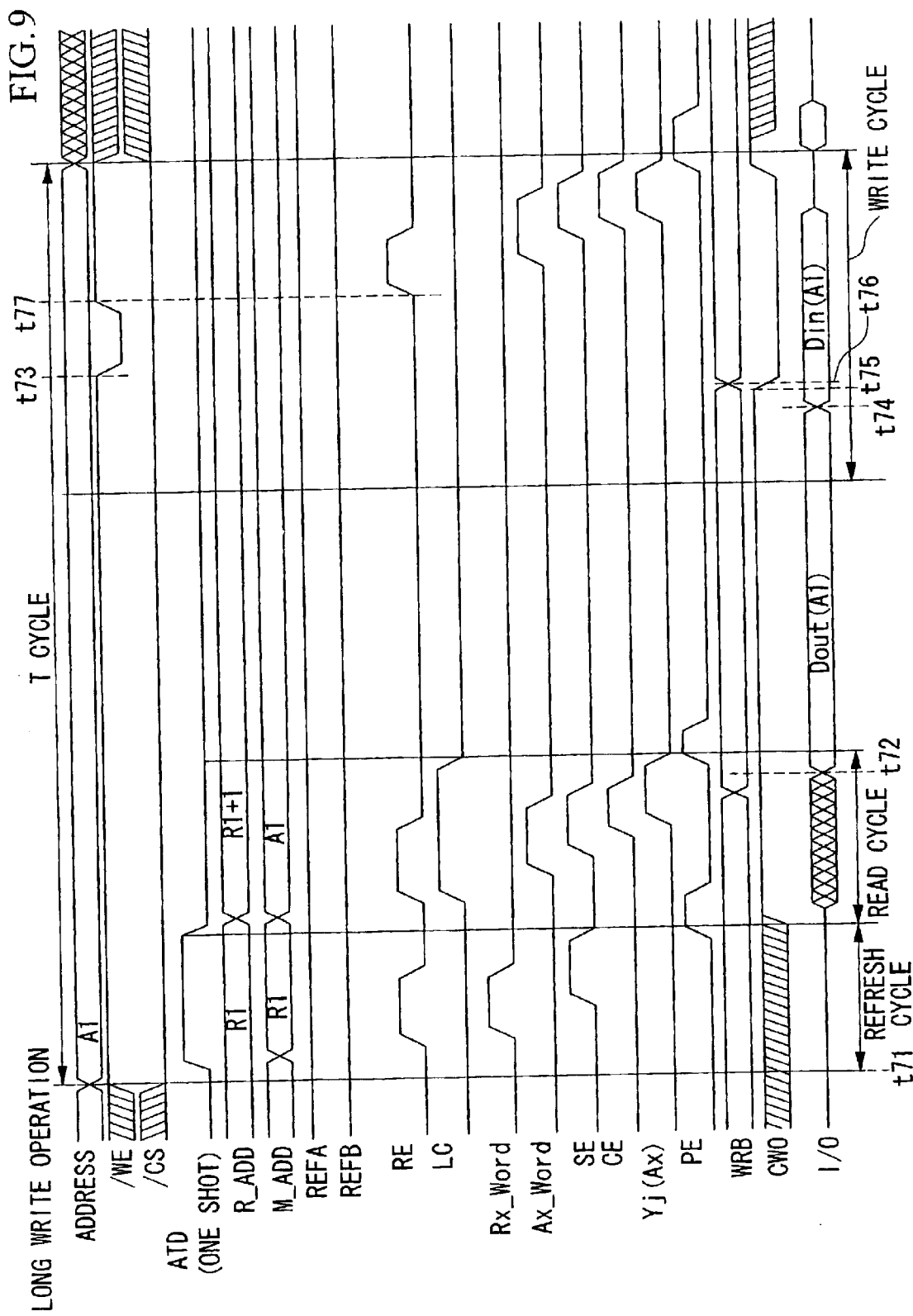
FIG. 9 is a timing chart for the semiconductor memory device according to the first embodiment, showing a refresh, and dummy read and write operations within one memory cycle when a write enable signal is input with a delay.

Next is a description of writing when the write enable signal/WE input is delayed, with reference to the timing chart of FIG. 9. In this case, since the memory cycle becomes long, in the present specification this operation is called "Long Write Operation" as shown in FIG. 9. Here, in this case also, both the refresh control signals REFA and REFB remain at level "H".

Firstly, at a time t71, the value of the address "Address" is changed to "A1", and a refresh is thereby performed for refresh address "R1" exactly the same as in the abovementioned case. However, since the write enable signal/WE is still at level "H" even after this refresh is completed, reading is performed with address "A1" as an object, subsequent to the refresh in the same manner as in FIG. 3. As a result, at a time t72 "Dout (A1)", being memory data of the address "A1", is output to the bus I/O. However, since the one that has access to the semiconductor memory device tries to write to the memory cells, in practice read data cannot be used by the access side at this point. However, the arrangement may be such that the access side takes in this read data, performs some computation, and subsequently performs a write. That is, by delaying the write enable signal intentionally, it is also possible to realize a read modify write operation in one memory cycle.

Later, at a time t73, the write enable signal/WE is finally lowered, writing is thereby started, and almost the same operation as in a second write cycle shown in FIG. 6 is performed. However, in this case, there is no transition in address "Address" accompanying the rise of the write enable signal/WE, so the value remains "A1". Accordingly, the ATD circuit 3 does not generate a one shot pulse on the address transition detection signal ATD, so the address transition detection signal ATD remains at level "L". Therefore, the multiplexer 5 continues to the select internal address L_ADD side, and the value of the address M_ADD remains "A1" in preparation for the subsequent write.

Furthermore, when the write enable signal/WE input is delayed, the row enable signal RE generated by the fall of the address transition detection signal ATD between times t71 and t72 returns to level "L" by the completion of reading subsequent to refresh. Therefore in this case, the row control circuit 13 generates a row enable signal RE based on the write enable signal/WE.

That is, at this point because the address transition detection signal ATD is level "L", level "H" is supplied from the inverter 30 shown in FIG. 2 to the delay circuit 52, the NAND gate 53 and the NAND gate 54. Therefore, when the write enable signal/WE is lowered at a time t73, this write enable signal/WE is delayed by the delay circuit 49, passes through the NOR gate 50 and the inverter 51, and after the level is inverted via the NAND gate 53, the NAND gate 54, and the NAND gate 65, it is output as a row enable signal RE at a time t77. Here, in this case, since no one shot pulse is generated on the address transition detection signal ATD, the latch control signal LC is also returned to level "L". However, since the operation of latching address "Address" by the latch 2 has already been performed in a dummy read subsequent to a refresh, there is no particular problem.

Here, "Din(A1)", being write data, is already supplied to the bus I/O at a time t74, and when the R/W control circuit 11 detects the fall of the write enable signal/WE and lowers the control signal CWO at a time t75, the write data "Din(A1)" is transmitted from the I/O buffer 10 to the bus WRB at a time t76. Accordingly, writing is started by a one shot pulse of the row enable signal RE, and writing is performed for the address "A1" in the same manner as described in FIG. 6.

As described above, in the present embodiment, similarly to an asynchronous type SRAM and the like, at the starting point of a memory cycle when address "Address" starts to change, it is not clear whether an external access request is a read or a write, and furthermore in the case of writing, it is not possible to predict at which point a write enable signal/WE will be input. Therefore in the present embodiment, as a first step, assuming that the access request is a read, reading is performed from a rise of the address transition detection signal ATD, and writing is performed at a point when the write enable signal/WE is input later.

Figure 10:
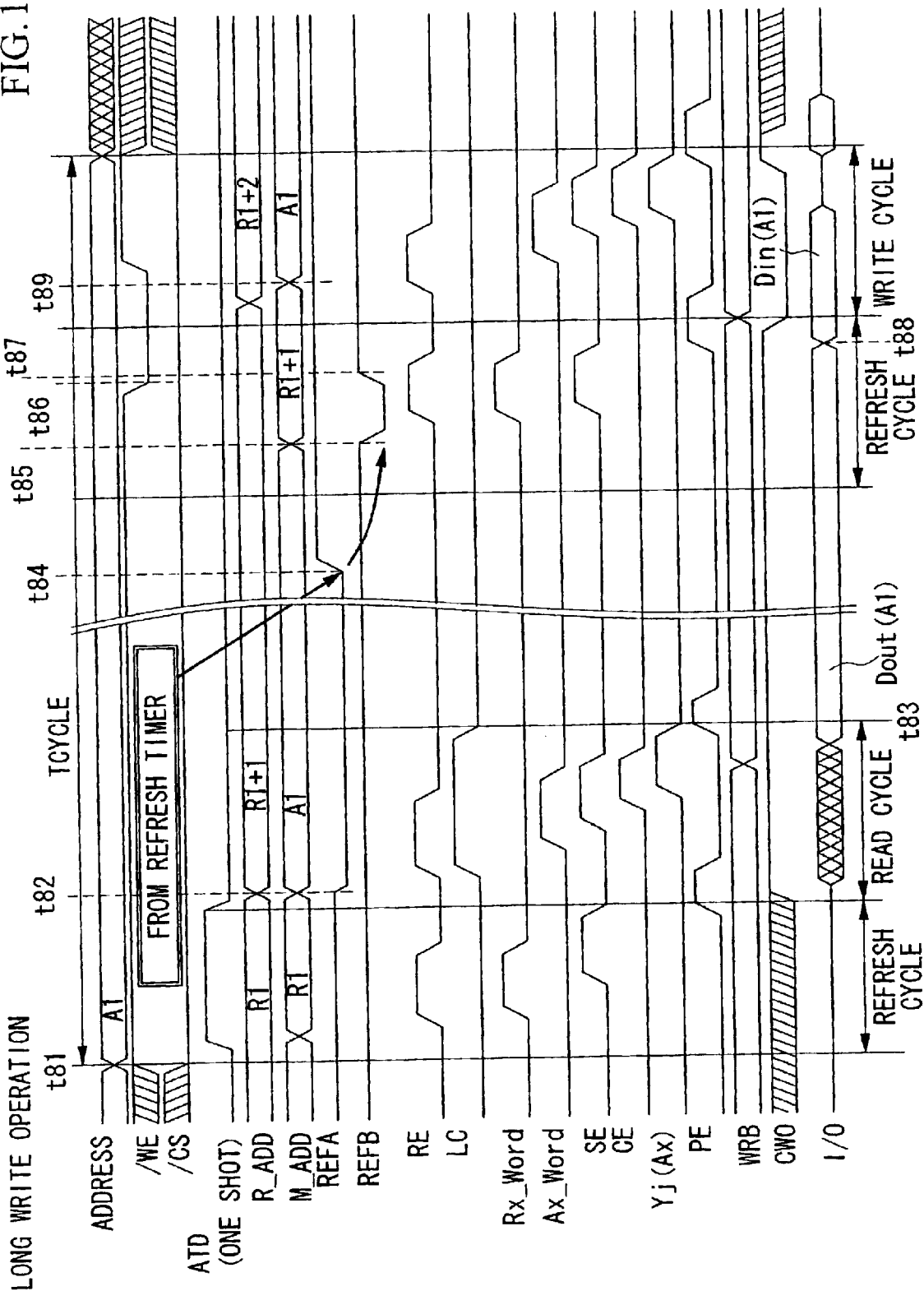
FIG. 10 is a timing chart for the semiconductor memory device according to the first embodiment, showing a refresh, dummy read, self refresh and write within one memory cycle, when following the start of a self refresh due to a refresh timer, a write enable signal is input with a delay.

Case where Writing is Performed After Refresh by a Refresh Timer Because a Write Enable Signal is Input with a Delay Next is a description of the timing of another Long Write operation with reference to the timing chart in FIG. 10. This figure corresponds to a case where, because self refresh is started by a refresh timer before a write enable signal/WE is input, the write enable signal/WE is lowered while the self refresh is being performed.

Firstly, for a refresh and dummy read at times t81 to t83, the operations are exactly the same as shown in FIG. 9 except for the following point. That is, one refresh cycle is completed by a refresh starting at the time t81. Accordingly, a refresh control circuit 4 lowers the refresh control signal REFA at the time t82, and stops the refresh until the next refresh cycle is required. Afterwards, if a state continues in which there is no access request from outside the semiconductor memory device, the refresh control circuit 4 raises the refresh control signal REFA at a time t84.

However afterwards, if there is still no access request, the refresh control circuit 4 generates a negative one shot pulse on the refresh control signal REFB at a time t85. Then, because the refresh control signal REFB is at level "L", the multiplexer 5 selects the refresh address R_ADD side, and the row control circuit 13 generates a one shot pulse on the row enable signal RE to start self refresh for address "R1+1". Subsequently, at a time t86 the write enable signal/WE falls. However, self refresh and writing in this case are the same as shown at the times t41 through t48 in FIG. 5.

That is, at a time t88, since write data is supplied on the bus I/O from outside the semiconductor memory device, the R/W control circuit 11 lowers the control signal CWO and transfers the write data from the I/O buffer 10 to the bus WRB. Furthermore, since the multiplexer 5 detects a rise of the refresh control signal REFB at a time t87 and selects the internal address L_ADD side, "A1" is output as an address M_ADD at a time t89. Subsequently, when the self refresh is completed, write data "Din(A)" is written to the memory cell at address "A1" from the bus WRB according to a row enable signal RE generated from the refresh control signal REFB.

Figure 11:
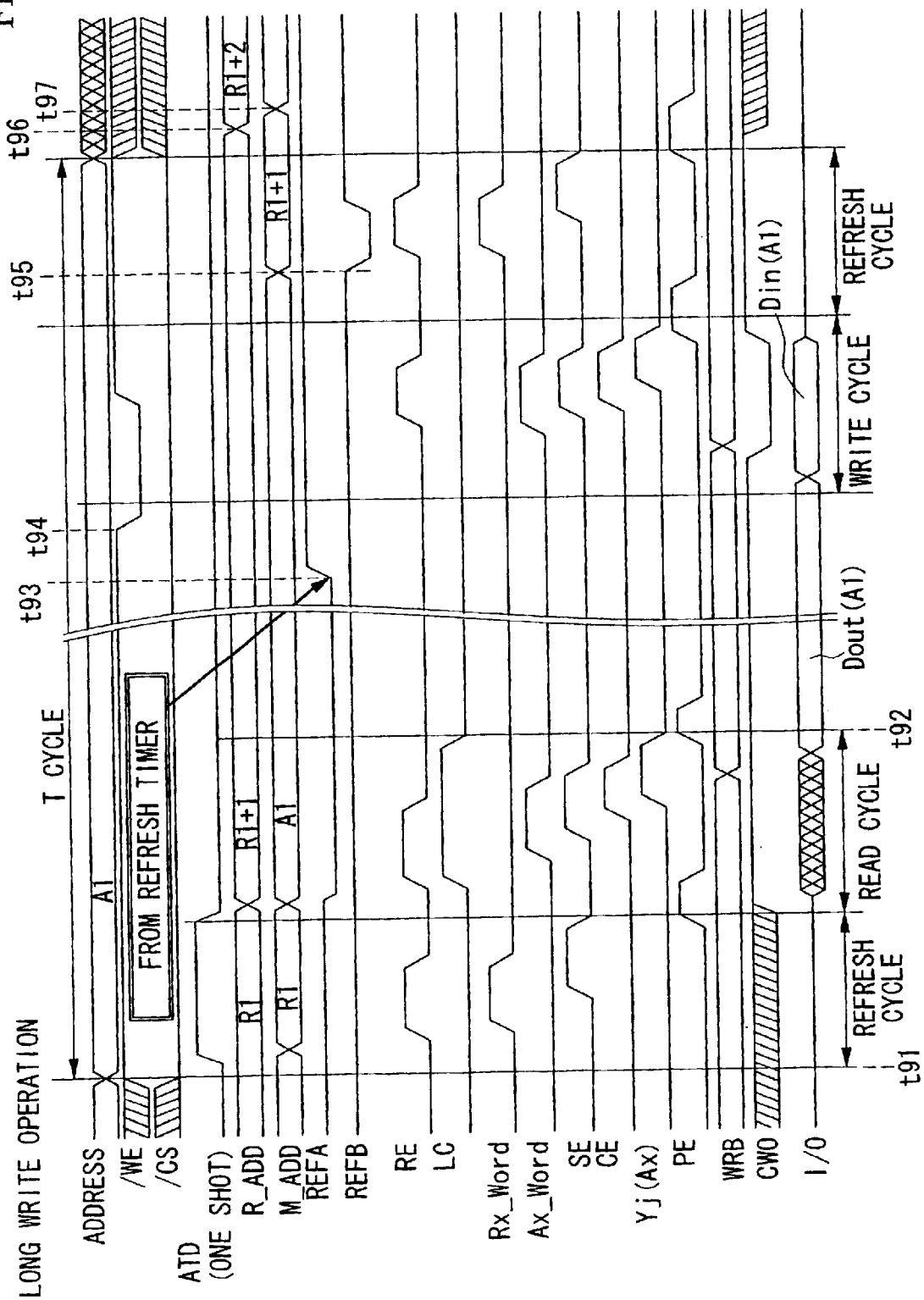
FIG. 11 is a timing chart for the semiconductor memory device according to the first embodiment, showing a write and a subsequent self refresh when, within one memory cycle, a write enable signal is input with a delay, and during the write a refresh request occurs due to a refresh timer.

Case Where Refresh is Performed Due to a Refresh Timer After Writing Although a Write Enable Signal is Input with a Delay Next is a description of another timing example of a Long Write operation with reference to the timing chart in FIG. 11. This figure shows a case where there is a request to refresh by a refresh timer after the write enable signal/WE is input and writing has started, and corresponds to a case where self refresh is performed after writing is completed.

Firstly, refresh and dummy read at times t91 to t92 are exactly the same as in the case of FIG. 10. Subsequently, if a state continues in which there is no access request from outside the semiconductor memory device, the refresh control circuit 4 raises the refresh control signal REFA at a time t93. Then, if the write enable signal/WE is lowered at a time t94 before the refresh timer calculates the refresh time, writing of data "Din(A1)" to the address "A1" is performed prior to self refresh. Here, the write itself is the same as the Long Write operation shown in FIG. 9 and FIG. 10. Furthermore, in the case where the write enable signal/WE is lowered, the refresh control circuit 4 delays the rise of the refresh control signal REFA in the internal delay circuit so that a negative one shot pulse is not generated on the refresh control signal REFB, until a sufficient time to write to the memory cell array 6 and for the following precharge has elapsed.

When writing is completed in this manner, the pulse generation circuit in the refresh control circuit 4 generates a negative one shot pulse on the refresh control signal REFB at a time t95. As a result, the multiplexer 5 selects the refresh address R_ADD side. Furthermore, the row control circuit 13 generates a one shot pulse on the row enable signal RE, and starts a self refresh for the address "R1+1" output from the multiplexer 5. When this self refresh is completed, detecting a rise of the refresh control signal REFB the refresh control circuit 4 updates the value of the refresh address R_ADD to "R1+2" at a time t96, and the multiplexer 5 selects the internal address L_ADD side at a time t97.

Second Embodiment

Figure 12:
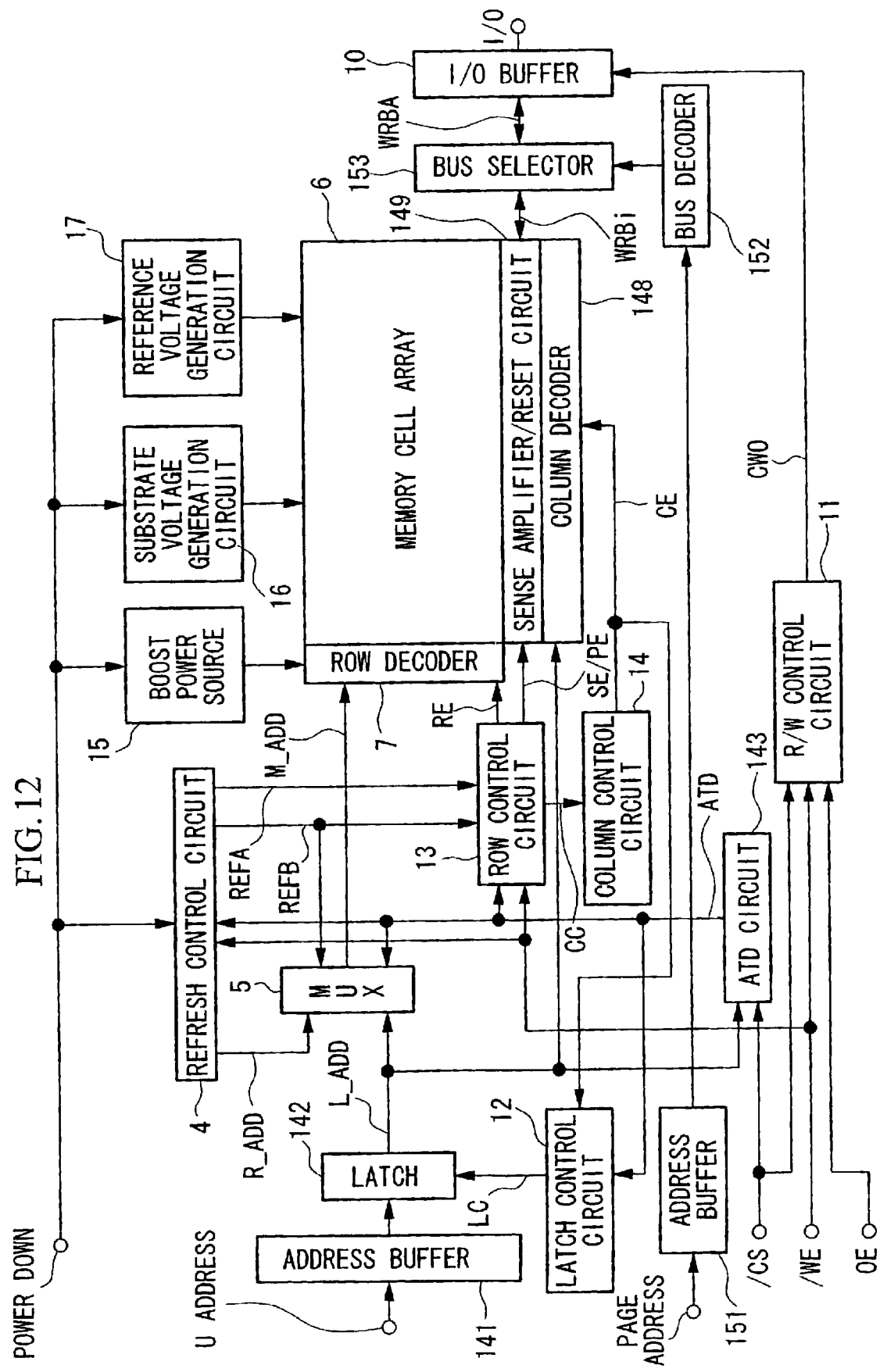
FIG. 12 is a block diagram showing the construction of a semiconductor memory device according to a second embodiment of the present invention.

This embodiment realizes a similar function to page mode used in standard DRAM and the like. FIG. 12 is a block diagram showing the construction of a semiconductor memory device according to this embodiment. Those structural elements and signal names that are identical to those shown in FIG. 1 are assigned the same reference symbols. In this embodiment, by dividing the address "Address" into an address "UAddress" for the higher bits and an address "PageAddress" for the lower bits, it is possible to input and output bits in a burst with the same "UAddress" address by changing only the "PageAddress" address.

For example, in the present embodiment, since the address "PageAddress" is two bits wide, by varying the address "PageAddress" within a range of "00B" to "11B" (here, "B" designates binary), it is possible to access data in a continuous burst for four addresses. The width of the address "PageAddress" is not limited to two bits, and the number of bits may be from "two bits" through to "the number of bits of row address" contained in the address "Address" as desired. Furthermore, in the present embodiment, together with the fact that it is possible to select four bits of data using the address "PageAddress", four pairs of buses WRBi (here, i=0 to 3) are provided instead of a bus WRB as shown in FIG. 1. Accordingly, when the value of the address "PageAddress" is "00B" to "11B", the bit data of each of the memory cells designated by these addresses are input and output through buses WRB0 to WRB3 respectively.

Next, the structures of an address buffer 141, a latch 142, an ATD circuit 143, a column decoder 148, and a sense amplifier/reset circuit 149 are similar to the address buffer 1, the latch 2, the ATD circuit 3, the column decoder 8, and the sense amplifier/reset circuit 9. In the present embodiment, since address "UAddress" is used instead of address "Address" in the first embodiment, the structures of the circuits differ with respect to the difference in bit width of these addresses. Furthermore, there are some differences in the sense amplifier reset circuit 149.

That is, in the present embodiment, regarding an individual row address contained in the internal address L_ADD, data for four bits are input and output on the buses WRB0 to WRB3 respectively. Accordingly, the sense amplifier/reset circuit 149 selects four adjacent bit lines from the memory cell array 6 at the same time in accordance with a column selection signal output from the column decoder 148, and connects four pairs of sense amplifiers connected to these bit lines and their respective buses WRB0 to WRB3. Here, since address "PageAddress" is not input to the ATD circuit 143, in a case where the address "PageAddress" is changed for burst access, a one shot pulse is not generated on the address transition detection signal ATD.

Besides this, an address buffer 151 has a similar construction to the address buffer 1 except for a point of difference in address bit width, which buffers the address "PageAddress". Furthermore, a bus decoder 152 decodes page addresses for two bits output from the address buffer 151, and outputs four bus select signals. Moreover, a bus selector 153 connects one of the buses WRB0 to WRB3 and an I/O buffer 10 through a bus WRBA depending on these bus selection signals.

Figure 13:
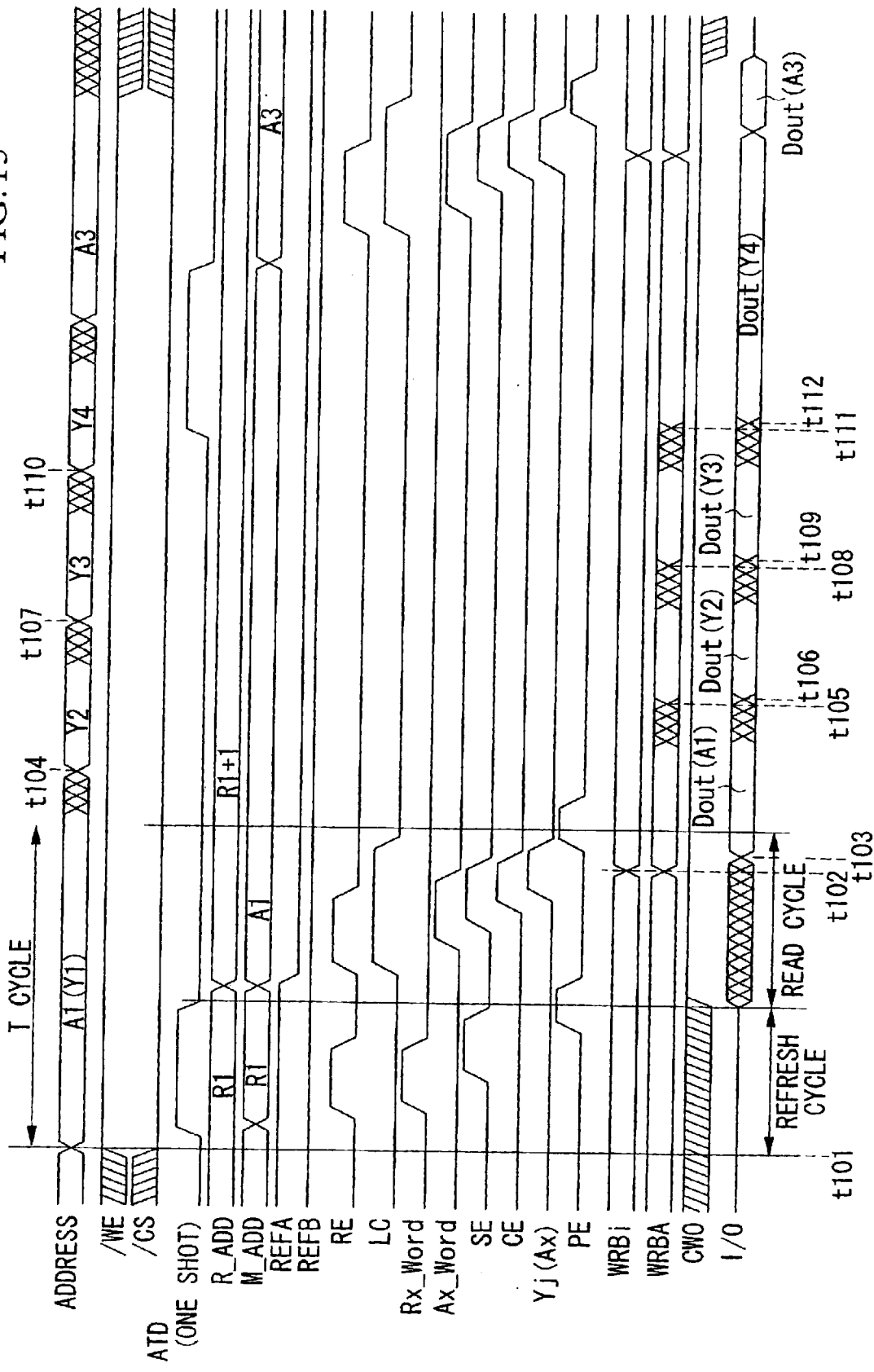
FIG. 13 is a timing chart for the semiconductor memory device according to the second embodiment, showing operations for the case where a refresh is suspended partway through and only a read is executed.

Next is a description of the operation of a semiconductor memory device in which the above-described construction is used, with reference to the timing chart in FIG. 13. Since the operation in the figure corresponds to the operation in FIG. 4 described in the first embodiment, here is a description based around the points of difference from the operation in FIG. 4. Here, "Y1" to "Y4" shown in FIG. 13 represent values within "00B" to "11B", and the values "Y1" to "Y4" here are assumed to be "00B" to "11B" respectively for simplification.

Firstly, at a time t101, similarly to FIG. 4, "A1" is applied to the address "Address". At this time, the address "PageAddress" is "Y1". Accordingly, a refresh and read corresponding to the address "A1" are performed, and data stored in four memory cells (that is, lower addresses "00"B to "11"B) assigned by the address A1 are read on the buses WRB0 to WRB3 respectively at a time t102. At this time, the value of the address "PageAddress" is "00B", and the bus decoder 152 decodes "00B" as the value of the address "PageAddress" "Y1" received through the address buffer 151. As a result, the bus selector 153 selects the bus WRB0, and outputs bit data that is subsequently output to the bus WRBA. As a result, the value of [Dout (A1)] stored in the address A1, is output on the bus I/O at a time t103.

Afterwards, by changing the address "PageAddress" appropriately, it is possible to read data of memory cells whose address UAddress part of address "A1" is the same. That is, if "Y2" (="01B") is applied to the address "PageAddress" at a time t104, the bus selector 153 selects bit data on the bus WRB1 at a time t105, outputs it to the bus WRBA, and at a time t106, data "Dout (Y2)" stored in an address whose lower address is "01B" is output to the bus I/O.

Afterwards similarly, if "Y3" ("10B") is applied to the address "PageAddress" at a time t107, at a time t108 the bus WRB2 is connected to the bus WRBA, and at a time t109, data "Dout (3)" stored in an address whose lower address is "10B" is output to the bus I/O. Furthermore, if "Y4" (="11B") is applied to the address "PageAddress" at a time t110, the bus WRB3 is connected to the bus WRBA at a time t111, and data "Dout (Y4)" stored in an address whose lower address is "11B" is output to the bus I/O.

Here, the description of the second embodiment is for the case of the application in FIG. 4. However, needless to say, it may be applied to the cases as shown in FIG. 5 through FIG. 11.

Third Embodiment

In each of the embodiments described above, regardless of whether an access request is a read or a write, reading or writing is performed after refresh is performed with a change (including the case where the chip select signal/CS is made active) of address "Address" as a trigger.

By contrast in the present embodiment, in the case where there is a read request, refresh is performed after reading is performed. Doing so achieves an improvement in reading speed (shortening of access time) compared with each of the above-described embodiments. Here, in the case where there is a write request, writing is performed after refresh in the same manner as in the above-described embodiments.

Figure 14:
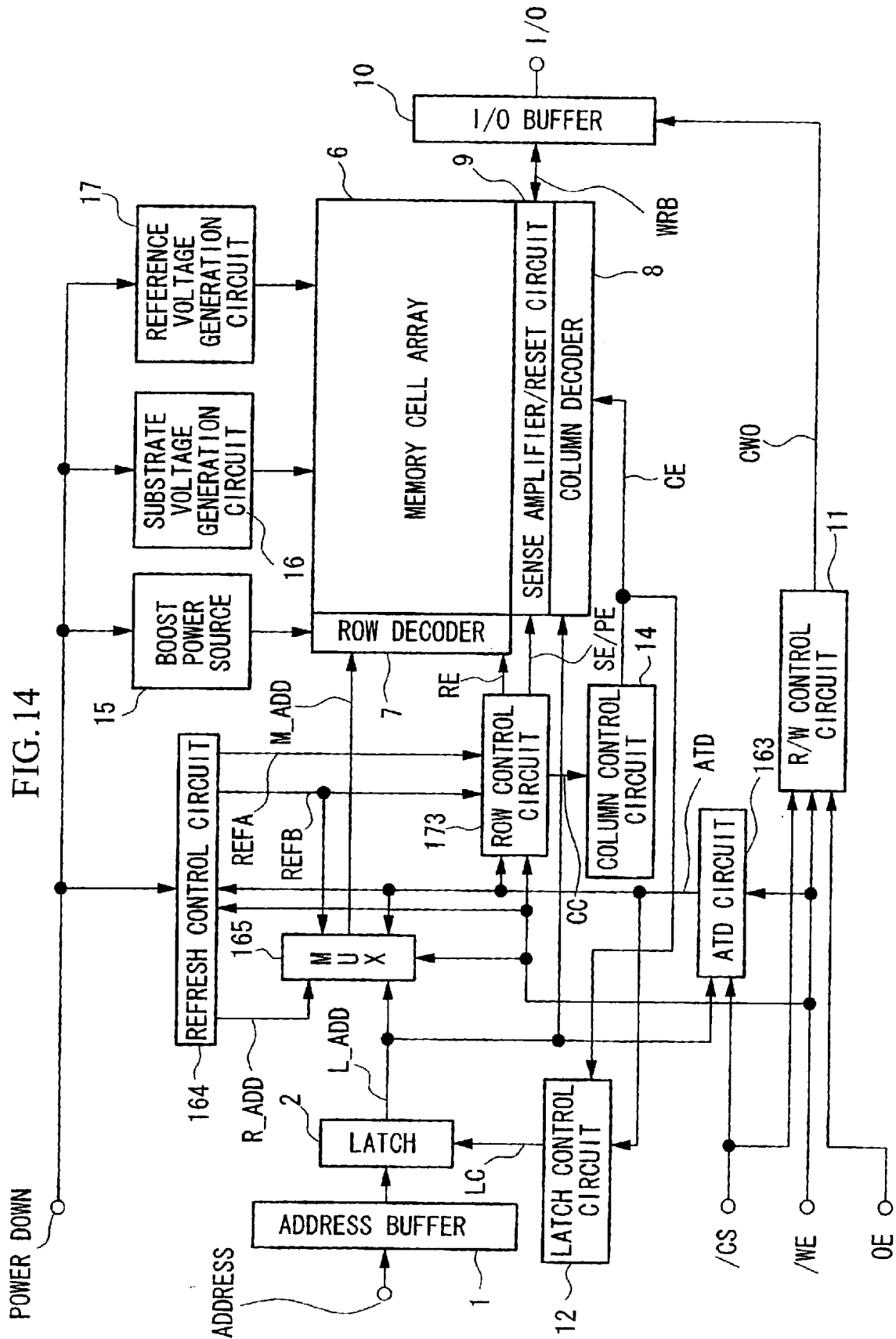
FIG. 14 is a block diagram showing the construction of a semiconductor memory device according to a third embodiment of the present invention.

FIG. 14 is a block diagram showing the construction of a semiconductor memory device according to the present embodiment. The construction shown in the figure is basically the same as the construction of the first embodiment (FIG. 1). Therefore those structural elements that are identical to those in FIG. 1 are assigned the same numerals. Hereunder the present embodiment is described using the semiconductor memory device of the first embodiment as a basis. However, technical idea of the present embodiment may be applied to the semiconductor memory device of the second embodiment.

In the specification of a standard SRAM, the write enable signal and address change are asynchronous. Here, in the present embodiment, the processing orders of refresh operations and access operations to memory cells in the case of reading and in the case of writing are opposite. Accordingly, in the present embodiment, it is necessary to determine in specified timing whether an access request supplied from outside is a read or a write, and to decide the processing order based on the result of this determination.

Figure 16:
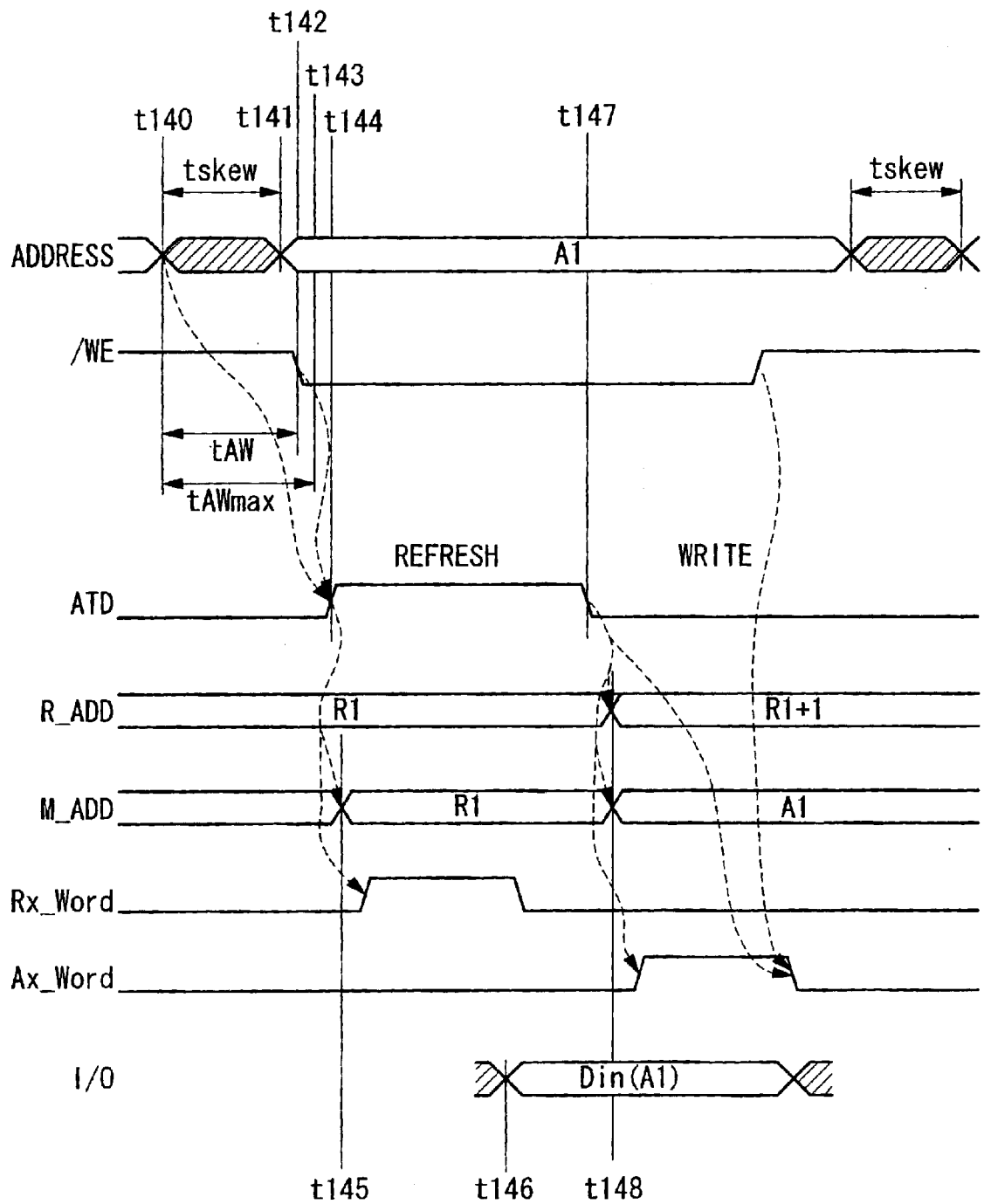
FIG. 16 is a timing chart for the semiconductor memory device according to the third embodiment, showing a write operation.

Therefore, in the present embodiment, a maximum value (hereunder, this maximum value is designated tAWmax) of time (for example, a time corresponding to time tAW as shown in FIG. 16) from when address "Address" is changed to when a write enable signal/WE is made active is defined in the specification of a semiconductor memory device. That is, in a system in which a semiconductor memory device is used, when writing to the semiconductor memory device is performed, it is necessary to activate the write enable signal/WE within the time tAWmax from when the address "Address" is changed. Here, the value of the time tAWmax may be determined appropriately according to request specifications on the system side.

An ATD circuit 163 shown in FIG. 14 has almost the same function as the ATD circuit 3 shown in FIG. 1. However, since read or write is not determined from when the address starts to change until the time tAWmax has elapsed, the arrangement is such that the ATD circuit 163 does not generate an address transition detection signal ATD after an address change is detected until time tAWmax has elapsed.

Here, if a maximum value of the skew in the address "Address" is denoted as time tskew (for example, refer to FIG. 15), depending on the system there is a possibility of a case where the time tAWmax is shorter than the value of time tskew shown. As described above, the value of the time tAWmax is primarily determined according to the request specifications on the system side, so that it may be set regardless of the time tskew.

However, since the value of the address "Address" is not definite from when the address "Address" starts to change until the time tskew has elapsed, access to the memory cell array must not be started until then. Accordingly, in the case where the time tAWmax is shorter than the time tskew, the arrangement is such that the value of the time tAWmax is set to be the time tskew, and access is performed after the address "Address" becomes definite.

However, what is mentioned above may be considered for the case of reading. In the case of writing, since writing is also performed after refresh is performed in the present embodiment, there is no problem even if the refresh operation is started when the read or write becomes definite after the time tAWmax has elapsed from the point of address change. Furthermore, if the write enable signal/WE becomes valid before the time tAWmax elapses, it can be determined to be a write operation at that point of time, and hence the refresh operation may be started without waiting for the time tAWmax to elapse.

A refresh control circuit 164 has the same function as the refresh control circuit 4 in FIG. 1. However, the refresh control circuit 164 references the write enable signal/WE when the address transition detection signal ATD is raised. If it is a read request, it updates refresh address R_ADD with a rise of the address transition detection signal ATD as a trigger, and if it is a write request, updates the refresh address R_ADD with a fall of the address transition detection signal ATD as a trigger.

A multiplexer 165 has almost the same function as the multiplexer 5 shown in FIG. 1. However, in the present embodiment, in the case of reading, since reading needs to be performed prior to refresh, the write enable signal/WE is input to the multiplexer 165 in order to distinguish between reading and writing. In the case where the write enable signal/WE is at level "L" (writing), the operation of the multiplexer 165 is the same as the operation of the multiplexer 5.

On the other hand, in the case where the write enable signal/WE is at level "H", the multiplexer 165 selects the opposite operation to the case of writing. To be specific, the multiplexer 165 selects the internal address L_ADD side if the address transition detection signal ATD is at level "H" and the refresh control signal REFB is at level "H", and selects the refresh address R_ADD side if the address transition detection signal ATD is at level "L" or the refresh control signal REFB is at level "L".

A row control circuit 173 has almost the same function as the row control circuit 13 shown in FIG. 1, and in the case of writing, performs the same operation as the row control circuit 13. Conversely, in the case of reading, the row control circuit 173 activates a row enable signal RE, a sense amplifier enable signal SE, a control signal CC and a precharge signal PE for a read operation with a rise of the address transition detection signal ATD as a trigger. Furthermore, the row control circuit 173 activates the row enable signal RE, the sense amplifier signal SE and the precharge enable signal PE for a refresh operation with a fall of the address transition detection signal ATD as a trigger.

Next is a description of the operation of a semiconductor memory device according to the present embodiment. Here firstly, read operation will be described with reference to a timing chart shown in FIG. 15, and then write operation will described with reference to a timing chart in FIG. 16.

Figure 15:
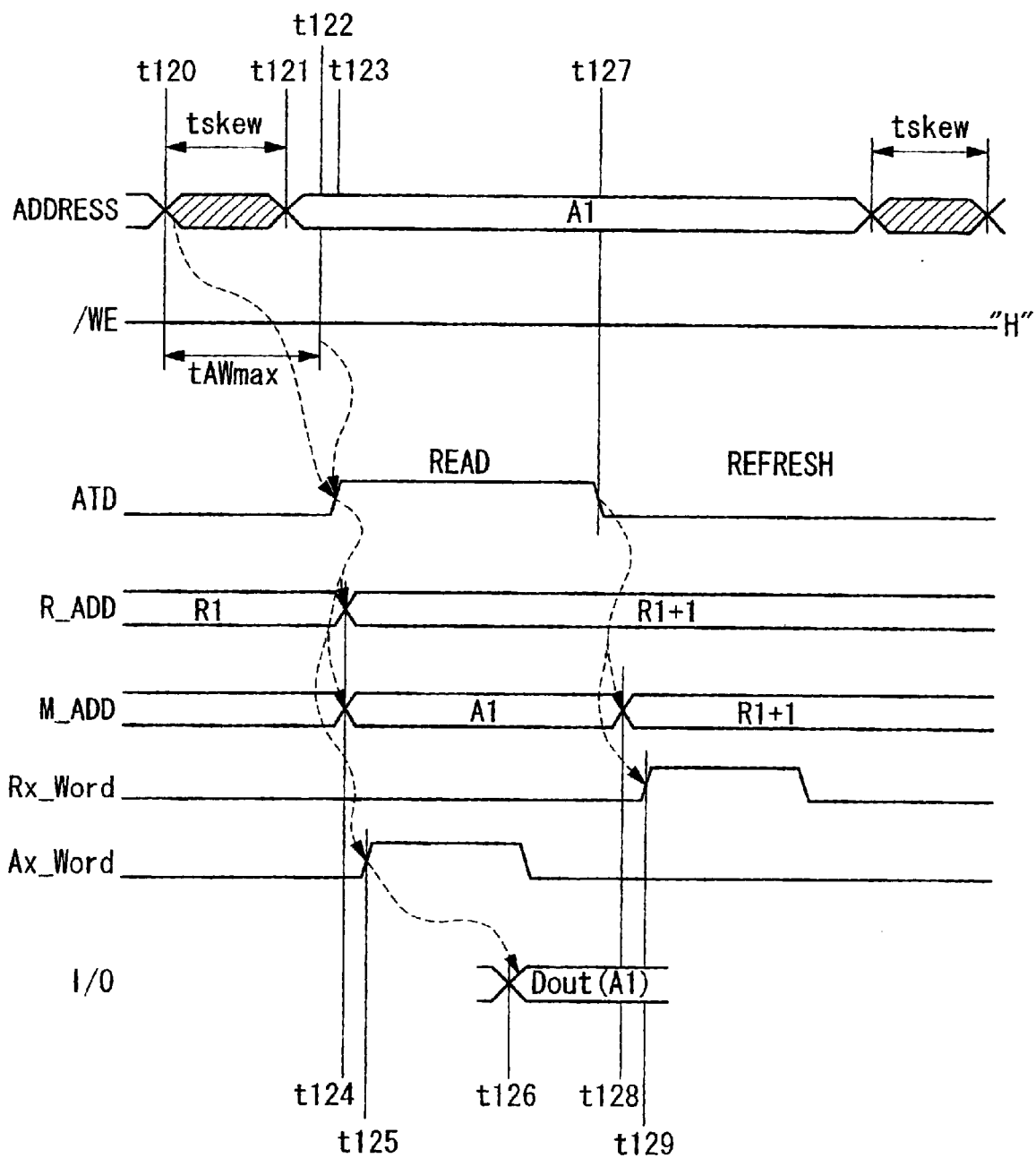
FIG. 15 is a timing chart for the semiconductor memory device according to the third embodiment, showing a read operation.

Firstly, when the address "Address" is changed at a time t120 shown in FIG. 15, this address change is transmitted to the ATD circuit 163 through the address buffer 1 and the latch 2. However, at this point of time, read or write has not been determined. Therefore, the ATD circuit 163 does not generate a one shot pulse on the address transition detection signal ATD immediately.

Subsequently, since write or read is determined at a time t122 after the time tAWmax has elapsed from the time t120, at a time t123, the ATD circuit 163 generates a one shot pulse on the address transition detection signal ATD. Then, since this case is a read request, the write enable signal/WE is at level "H", so the multiplexer 165 selects the internal address L_ADD side, and supplies an address M_ADD (=address "A1") to the row decoder 7 at a time t124. Furthermore, the row control circuit 173 generates a row enable signal RE, a sense amplifier enable signal SE, a control signal CC and a precharge signal PE successively with a rise of the address transition detection signal ATD as a trigger. As a result, a read operation is performed in the same manner as the case shown by "Read Cycle" in FIG. 3, and for example a word line Ax_Word corresponding to the address "A1" is activated at a time t125, and data of memory cells, "Dout (A1)", are read on the bus I/O at a time t126.

Subsequently, when the address transition detection signal ATD is fallen at a time t127, the multiplexer 165 selects the refresh address R_ADD side, and supplies the address M_ADD (=address "R1+1") to the row decoder 7 at a time t128. Furthermore, the row control circuit 173 generates a row enable signal RE, a sense amplifier enable signal SE and a precharge signal PE successively with a fall of the address transition detection signal ATD as a trigger. As a result, a refresh operation is performed in the same manner as in the case shown by "Refresh Cycle" in FIG. 3, and for example a word line Rx_Word corresponding to the address "R1+1" is activated at a time t129.

Next is a description of the operation of the case where there is a write request. In the case of writing, a write enable signal/WE becomes active from when the address "Address" starts to change at a time t140 shown in FIG. 16 until a time t143 after the time tAWmax has elapsed. In FIG. 16, the arrangement is such that the write enable signal/WE is lowered at a time t142 after time tAW has elapsed from the time t140.

The ATD circuit 163 detects an address change and a fall of the write enable signal/WE, and generates a one shot pulse on the address transition detection signal ATD at a time t144. At this time, since the write enable signal/WE is at level "L", the multiplexer 165 selects the refresh address R_ADD side for refresh operation, and outputs "R1" to the row decoder 7 as an address M_ADD at a time t145. Furthermore, the row control circuit 173 generates a row enable signal RE, a sense amplifier enable signal SE and a precharge signal PE successively. As a result a refresh operation is performed in the same manner as in the case shown by "Refresh Cycle" at the time t31 and later in FIG. 5.

Subsequently, at a time t146, a value of write data, "Din(A 1)", is then supplied on the bus I/O. Then at a time t147, when the ATD circuit 163 lowers the address transition detection signal ATD, the multiplexer 165 selects the internal address L_ADD side, and at a time t148, outputs the row address part of "A1" to the row decoder 7 as an address M_ADD. Furthermore, the row control circuit 173 generates a row enable signal RE, a sense amplifier enable signal SE, a control signal CC and a precharge signal PE successively. As a result, a write operation is performed in the same manner as in the case shown by "Write Cycle" in FIG. 5.

As described above, in the present embodiment, when the time tAWmax has elapsed after the address is changed, a read operation can be started. Therefore it is possible to speed up reading compared with the first embodiment and the second embodiment, thus enabling a reduction of access time. In particular, in each of the above-described embodiments, the longer the time required for a refresh operation, and in the present embodiment the shorter the value of the time tAWmax, the greater the effect of access time improvement becomes.

Fourth Embodiment

In the above-described embodiments, standby mode is switched based on a power down control signal "Power-Down" supplied from outside the semiconductor memory device. Whereas in the present embodiment, by writing mode switching instruction data to a predetermined specific address in the memory cell array 6, standby mode switching similar to the above-described embodiments is realized. Here, in a semiconductor memory device according to the present embodiment, address "0" (the lowest address) is designated a data storage region exclusively for mode switching. Furthermore, in the present embodiment, data for setting standby mode 2 is designated "F0h" (here, "h" denotes hexadecimal), and data for setting to standby mode 3 is designated "0Fh". Accordingly, in the present embodiment, the bus width of the bus WRB is 8 bits.

Figure 17:
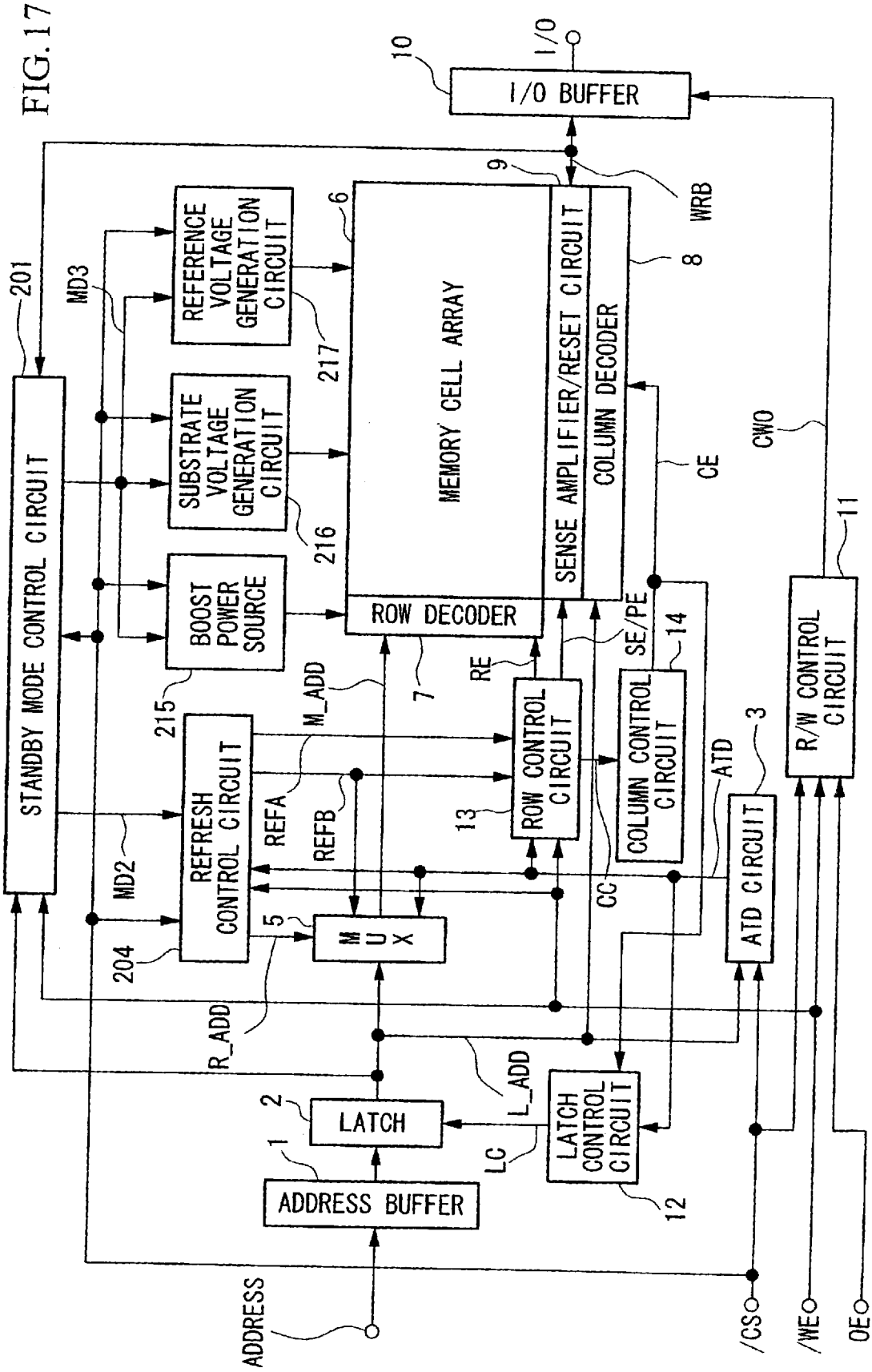
FIG. 17 is a block diagram showing the construction of a semiconductor memory device according to a fourth embodiment of the present invention.

FIG. 17 is a block diagram showing the construction of a semiconductor memory device according to the present embodiment. Those structural elements and signal names that are identical to those shown in FIG. 1 are assigned the same numerals. The differences of FIG. 17 from FIG. 1 are that there is no pin for inputting a power down control signal "PowerDown", that a standby mode control circuit 201 is added, and that parts of the structure of a refresh control circuit 204, a boost power source 215, a substrate voltage generation circuit 216 and a reference voltage generation circuit 217 are different from the refresh control circuit 4, the boost power source 15, the substrate voltage generation circuit 16 and the reference voltage generation circuit 17. Hereunder is a detailed description of each part with reference to FIG. 18 through FIG. 22. Here, in these figures, those structural elements and signal names that are identical to those shown in FIG. 1 or FIG. 17 are assigned the same numerals.

Firstly, in FIG. 17, a standby mode control circuit 201 generates mode setting signals MD2 and MD3 based on the internal address L_ADD, the chip select signal/CS, the write enable signal/WE and write data on the bus WRB. Among these, the mode setting signal MD2 is a signal that becomes level "H" when setting standby mode 2, and is supplied to the refresh control circuit 204. On the other hand, the mode setting signal MD3 is a signal that becomes level "H" when setting standby mode 2 or standby mode 3, and supplied to the boost power source 215, the substrate voltage generation circuit 216 and the reference voltage generation circuit 217. Here, when the mode setting signals MD2 and MD3 are both at level "L" standby mode 1 is set.

Figure 18:
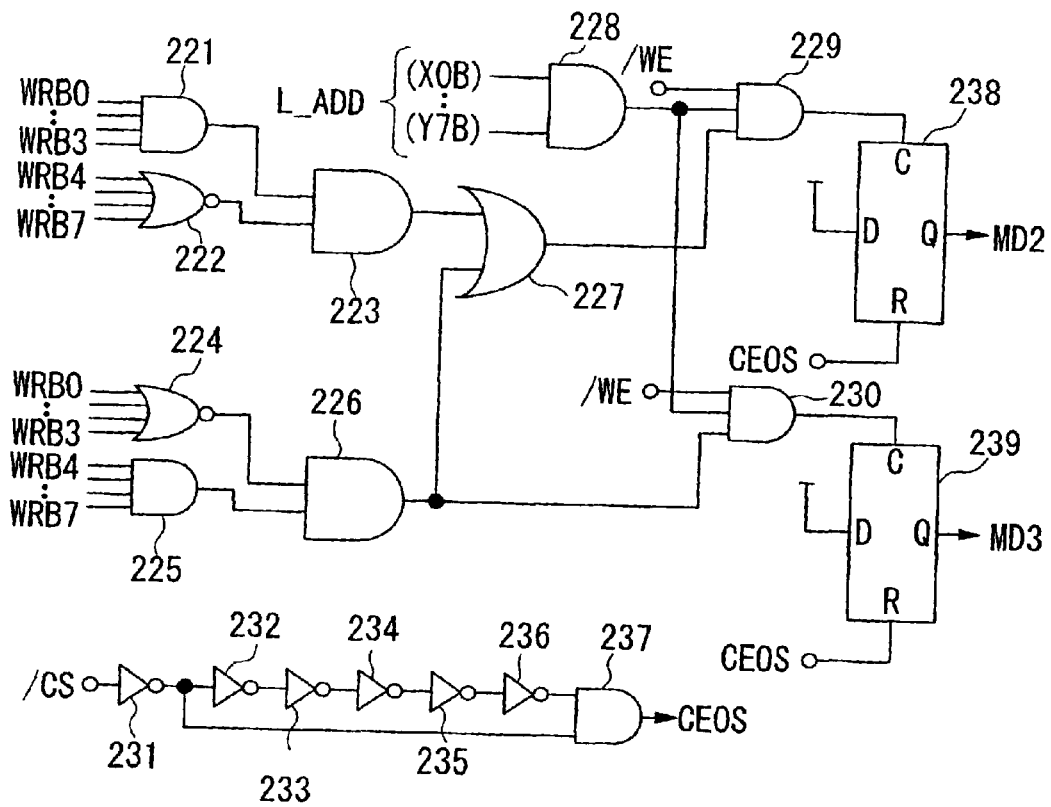
FIG. 18 is a circuit diagram showing a detailed construction of a standby mode control circuit according to the fourth embodiment.

Here, FIG. 18 is a circuit diagram showing a detailed construction of the standby mode control circuit 201. In the figure, data WRB0 to WRB3 and WRB4 to WRB7 are bits 0 to 3 and 4 to 7 of write data supplied from outside the semiconductor memory device to the bus WRB. A circuit comprising an AND gate 221, a NOR gate 222 and an AND gate 223 outputs level "H" only when the write data is "F0h". Similarly, a circuit comprising a NOR gate 224, an AND gate 225 and an AND gate 226 outputs level "H" only when the write data is "0Fh". Furthermore, an OR gate 227 outputs level "H" when either "F0h" or "0Fh" is input as write data by obtaining the logical OR of the outputs of the AND gates 233 and 226.

Addresses X0B to Y7B are address values wherein each bit comprising the internal address L_ADD is inverted. For example, the address X0B is the value of bit 0 of the row address inverted, and the address Y7B is the value of bit 7 of the column address inverted. Accordingly, an AND gate 228 outputs level "H" only when detecting that all of the bits of the internal address L_ADD are "0B" (that is, address "O"). Then, an AND gate 229 outputs the write enable signal/WE unchanged as a clock only in the case where data "F0h" or "0Fh" is written to address "O". Furthermore, an AND gate 230 outputs the write enable signal/WE unchanged as a clock only in the case where data "0Fh" is written to address "0".

A circuit comprising inverters 231 to 236 and an AND gate 237 detects a falling edge of the chip select signal/CS, and generates a one shot pulse on a signal CEOS. Subsequently, a latch 238 outputs level "H" corresponding to the power supply voltage supplied to the D terminal as the mode setting signal MD2 from the Q terminal when the output of the AND gate 229 is raised and a clock is input to the C terminal. Furthermore, when a one shot pulse is generated on the signal CEOS supplied to the R terminal, the latch 238 resets itself and outputs level "L" on the mode setting signal MD2. A latch 239 has a similar construction. When the output of an AND gate 230 is raised, it outputs level "H" on the mode setting signal MD3, and when a one shot pulse is generated on the signal CEOS it outputs level "L" on the mode setting signal MD3.

As described above, in the case of setting to standby mode 2, the output of the AND gate 229 rises synchronously with the rise of the write enable signal/WE, a D-type latch 238 is set, and the mode setting signal MD2 becomes level "H". Furthermore, in the case of setting to standby mode 3, the outputs of the AND gates 229 and 230 both rise synchronously with the rise of the write enable signal/WE, the latches 238 and 239 are both set, and both the mode setting signal MD2 and the mode setting signal MD3 become level "H".

Figure 19:
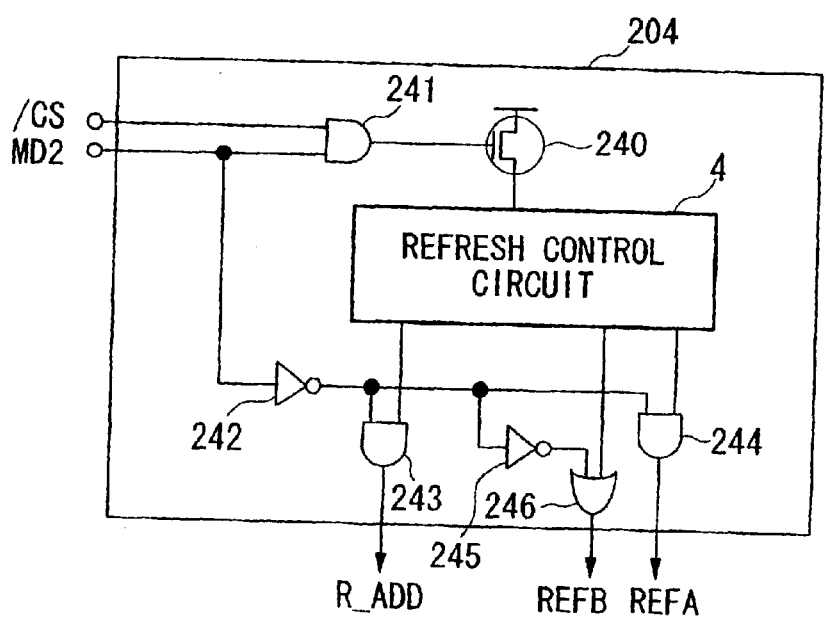
FIG. 19 is a circuit diagram showing a detailed construction of a refresh control circuit according to the fourth embodiment.

A refresh control circuit 204 shown in FIG. 17 uses the chip select signal/CS and the mode setting signal MD2 instead of the power down control signal "PowerDown", and generates a refresh address R__ADD, and refresh control signals REFA and REFB. Here, FIG. 19 is a circuit diagram showing a detailed construction of the refresh control circuit 204. In the figure, the gate terminal, the source terminal and the drain terminal of a P channel transistor 240 are connected to the output of an AND gate 241, the power supply voltage, and the power supply pin of the refresh control circuit 4 respectively. As a result, if the output of the AND gate 241 is at level "L", the transistor 240 turns on, and power is supplied to the refresh control circuit 4, and if the output is at level "H", the transistor 240 is turned off, and power supply is stopped.

When the semiconductor memory device is in a deselected state (chip select signal/CS is at level "H"), and in standby mode 2 or standby mode 3 (the mode setting signal MD2 is at level "H"), the AND gate 241 turns off the transistor 240. An inverter 242 generates an inverse signal of the mode setting signal MD2, and when standby mode 1, its output becomes level "H". An AND gate 243 outputs a refresh address R__ADD generated by the refresh control circuit 4 unchanged in standby mode 1, while, in standby mode 2 or standby mode 3, it fixes the address at "0".

An AND gate 244 outputs a refresh control signal REFA generated by the fresh control circuit 4 unchanged in standby mode 1, while it fixes the signal to level "L" in standby mode 2 or standby mode 3. Furthermore, an inverter 245 outputs level "L" in standby mode 1 in order to invert the output of the inverter 242. An OR gate 246 outputs the refresh control signal REFB generated by the refresh control circuit 4 unchanged in standby mode 1, while it fixes the signal to level "H" in standby mode 2 or standby mode 3.

Figure 20:
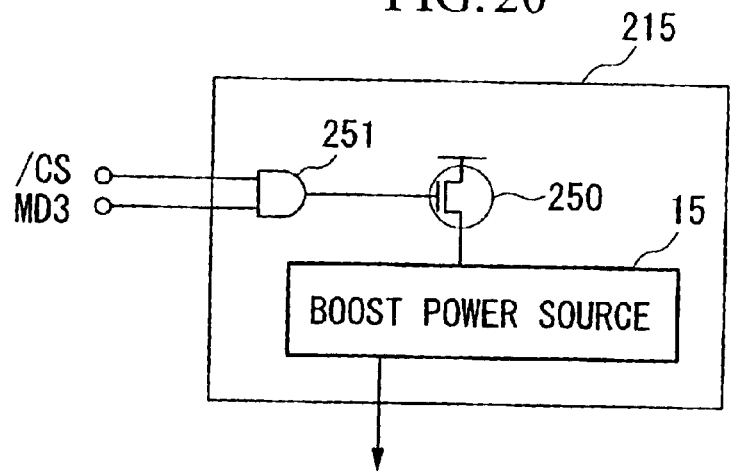
FIG. 20 is a circuit diagram showing a detailed construction of a boost power source according to the fourth embodiment.
Figure 21:
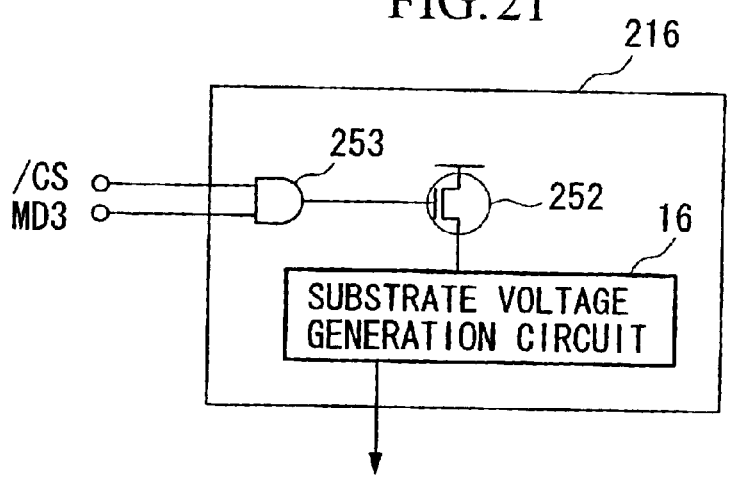
FIG. 21 is a circuit diagram showing a detailed construction of a substrate voltage generation circuit according to the fourth embodiment.
Figure 22:
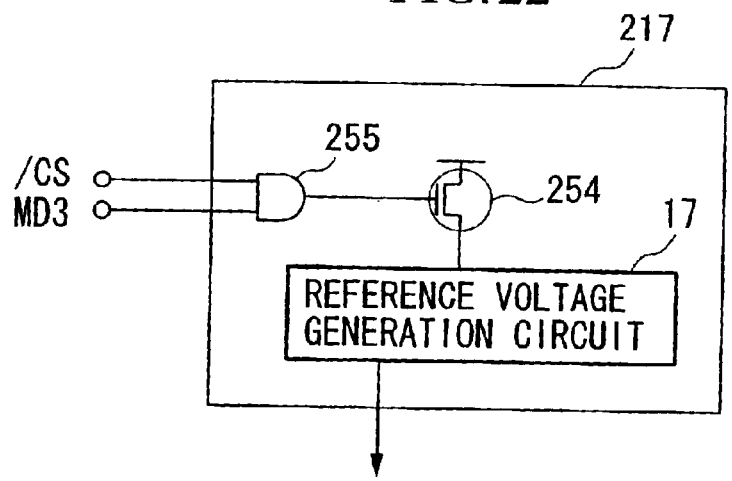
FIG. 22 is a circuit diagram showing a detailed construction of a reference voltage generation circuit according to the fourth embodiment.

FIG. 20 to FIG. 22 are circuit diagrams showing detailed constructions of the boost power source 215, the substrate voltage generation circuit 216, and the reference voltage generation circuit 217. In the boost power source 215, a P channel transistor 250 and an AND gate 251 have the same functions as the transistor 240 and the AND gate 241 shown in FIG. 19 respectively. That is, when the semiconductor memory device is in a deselected state (the chip select signal/CS is at level "H"), and in standby mode 3 (the mode setting signal MD3 is at level "H"), the transistor 250 is turned off, and power supply to the boost power source 15 is stopped. In cases other than this, power is supplied to the boost power source 15. What is described above applies in exactly the same way to the substrate voltage generation circuit 216 and the reference voltage generation circuit 217. Transistors 252 and 254 comprising these circuits correspond to the transistor 250 in the boost power source 215, and AND gates 253 and 255 correspond to the AND gate 251 in the boost power source 215.

Operation when switching standby modes in a semiconductor memory device according to the above-described construction is as follows.

(1) Standby Mode

In order to set the semiconductor memory device to standby mode 1, the chip select signal/CS is lowered. By doing so, the standby mode control circuit 201 generates a one shot pulse from a falling edge of the chip select signal/CS, resets the latch 238 and the latch 239, and sets both the mode setting signals MD2 and MD3 to level "L".

As a result, in the refresh control circuit 204, the transistor 240 is turned on, power is supplied to the internal refresh control circuit 4, and also the refresh address R__ADD and the refresh control signals REFA and REFB generated by the refresh control circuit 4 are output unchanged. Furthermore, in the boost power source 215, the substrate voltage generation circuit 216 and the reference voltage generation circuit 217, power is supplied to the internal boost power source 15, the substrate voltage generation circuit 16 and the reference voltage generation circuit 17 respectively. Performing the above operations enables the operations as described in the first embodiment and the second embodiment.

(2.) Standby Mode 2

In order to set to standby mode 2, as mentioned above, data "F0h" is written to address "0". As a result, the standby mode control circuit 201 sets the mode setting signal MD2 to level "H" from a rising edge of the write enable signal/WE. At this point, if the semiconductor memory device has not been selected, or is not going to be selected afterwards, the chip select signal/CS becomes level "H". Therefore, the refresh control circuit 204 stops power supply to the internal refresh control circuit 4.

Furthermore, since the output becomes unstable because there is no power supply to the refresh control circuit 4, the refresh control circuit 204 fixes the refresh address R__ADD at "0", and also fixes the levels of the refresh control signals REFA and REFB at level "L" and level "H" respectively. Moreover, at this point, since the chip select signal/CS is at level "H", the ATD circuit 3 does not generate a one shot pulse on the address transition detection signal ATD even if the internal address L__ADDi (refer to FIG. 2) changes, and maintains it at level "L".

Therefore, the row control circuit 13 fixes the row enable signal RE, the sense amplifier enable signal SE, the precharge enable signal PE and the control signal CC at level "L". Accordingly, the columns enable signal CE, and the latch control signal LC also remain at level "L". On the other hand, since the refresh control signal REFB is fixed at level "H" and the address transition detection signal ATD is fixed at level "L", the multiplexer 5 continues to select the internal address L__ADD side.

In the manner described above, refresh operation is discontinued and current consumption is reduced. Here, at this time, since the mode setting signal MD3 remains at level "L", power continues to be supplied to the boost power source 15, the substrate voltage generation circuit 16, and the reference voltage generation circuit 17 (refer to FIG. 20 to FIG. 22).

(3.) Standby Mode 3

In order to set to standby mode 3, data "0Fh" is written to address "0" as mentioned above. As a result, the standby mode control circuit 201 sets both the mode setting signal MD2 and the mode setting signal MD3 to level "H" from a rising edge of the write enable signal/WE. Accordingly, at the point where the chip select signal/CS becomes level "H", similarly to standby mode 2, the refresh control circuit 204 stops power supply to the internal refresh control circuit 4. At the same time, the boost power source 215, the substrate voltage generation circuit 216 and the reference voltage generation circuit 217 stop power supply to the internal boost power source 15, substrate voltage generation circuit 16, and reference voltage generation circuit 17 respectively. By doing so, similarly to standby mode 2, refresh control is discontinued, and also current to the power source system control circuit is cut, further reducing current consumption.

As described above, in the present embodiment, since a signal such as a power down control signal "PowerDown" described in the first embodiment does not need to be applied from outside the semiconductor memory device, it is possible to reduce the number of pins accordingly.

Here, in the above description, the fourth embodiment is described based on the first embodiment. However, the same may be applied unchanged to the second embodiment and the third embodiment.

Fifth Embodiment

In each of the embodiments described above, refresh operations for the whole memory cell array inside the semiconductor memory device are controlled according to which standby mode is selected among the three standby modes. Therefore, for example, even in a case where the memory cell array 6 shown in FIG. 1 is divided into a plurality of areas (referred to hereunder as "memory cell areas"), the self refresh operation in standby states controls all memory cell areas using the same common standby mode.

However, depending on the application of a semiconductor memory device, certain memory cell areas (memory spaces) may need to hold data in standby states, while in memory cell areas (memory cell areas used as buffers as described above), in which only temporary use data is stored, data does not need to be held in standby state. For example, considering a mobile telephone as an example of a mobile terminal system, information such as homepage data downloaded from the Internet may be held only temporarily while a user is reading it.

In other words, for a memory cell area used for the purpose as mentioned above, it is not necessary to perform self refresh in standby state, so that standby current can be reduced accordingly. In order to do so, if it is possible to determine whether self refresh needs to be performed to hold data or not for each memory cell area, standby current can be controlled efficiently according to a user's needs and applications. For example, by allocating memory cell areas in mobile terminal systems appropriately, it is also possible to keep the amount of standby current consumption to a minimum.

Figure 23:
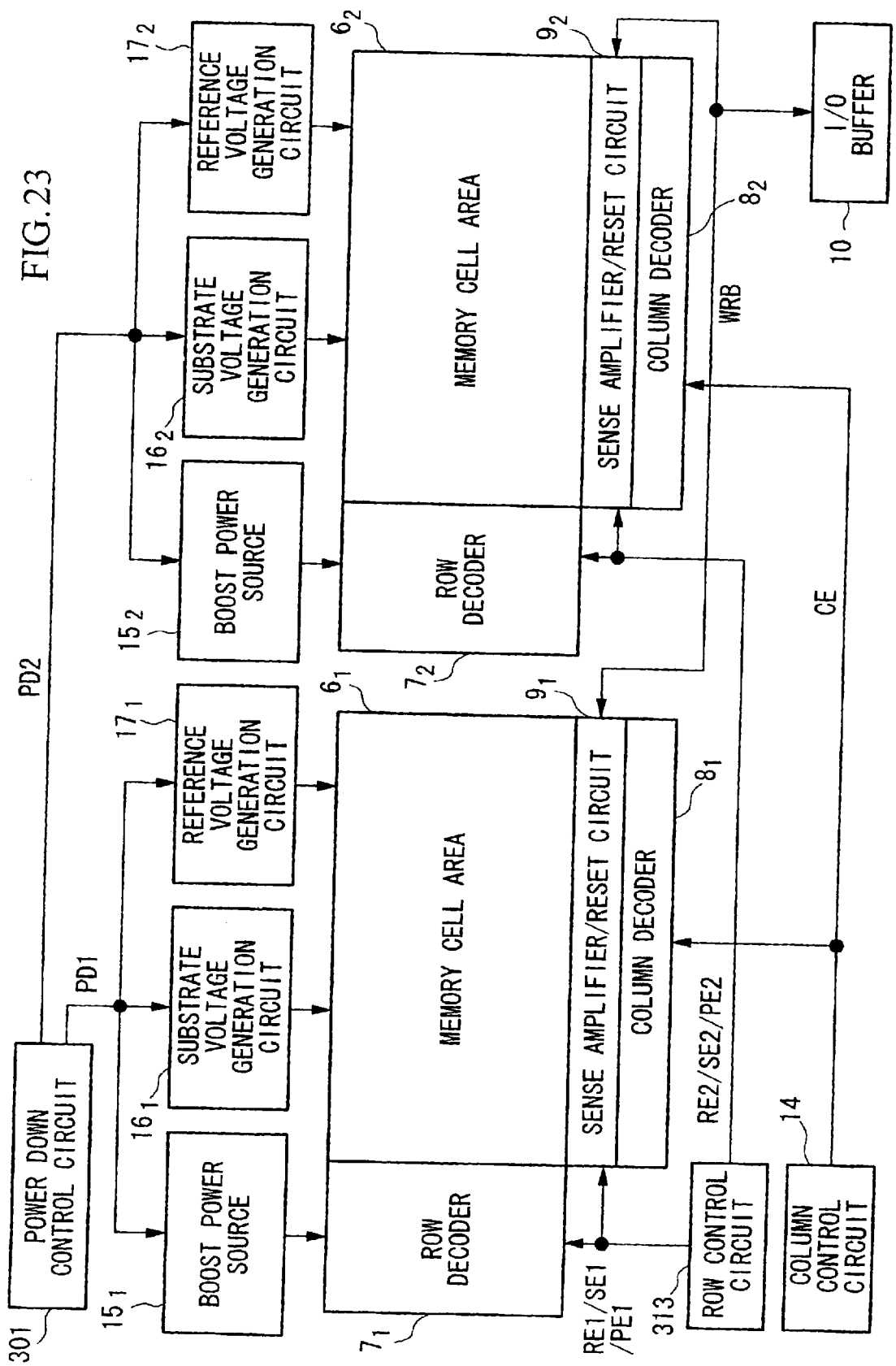
FIG. 23 is a block diagram showing the construction of the essential sections of a semiconductor memory device according to a fifth embodiment of the present invention.

From this background, in the present embodiment, in the case where a memory cell array comprises a plurality of memory cell areas, the standby mode can be set individually for each memory cell area. FIG. 23 is a block diagram showing the construction of the essential sections of a semiconductor memory device according to the present embodiment, which realizes the present embodiment based on the construction in FIG. 1. However, for convenience of illustration, FIG. 23 shows only the circuits in the periphery of the memory cell areas. The address buffer 1, the latch 2, the ATD circuit 3, the refresh control circuit 4, the multiplexer 5, the R/W control circuit 11, the latch control circuit 12, and the signals associated with these shown in FIG. 1 are omitted. However, they are all the same as in FIG. 1.

FIG. 23 shows an example of a case where the memory cell array 6 shown in FIG. 1 is divided into two memory cell areas $6_1$ and $6_2$. However, there may be any number of memory cell areas. Here, in the description hereunder, the memory cell areas and the peripheral circuits installed for each memory cell area corresponding to the memory cell areas are designated "memory plates". For example, in the structural example shown in FIG. 23, the memory cell area 61, and its peripheral circuits, being a row decoder $7_1$, a column decoder $8_1$, a sense amplifier/reset circuit $9_1$, a boost power source $15_1$, a substrate voltage generation circuit $16_1$, and a reference voltage generation circuit $17_1$, are defined as one memory plate.

A row control circuit 313 generates control signals for each memory cell area as described later. Accordingly, for example, some circuitry in the row control circuit 313, for generating a row enable signal RE1, a sense amplifier enable signal SE1 and a precharge enable signal PE1 may be included in the peripheral circuits corresponding to the memory cell area $6_1$. Furthermore, in the following description, the boost power source $15_1$, the substrate voltage generation circuit $16_1$ and the reference voltage generation circuit $17_1$ are designated a "first power supply circuit", and the boost power source $15_2$, the substrate voltage generation circuit $16_2$ and the reference voltage generation circuit $17_2$ are designated a "second power supply circuit".

The row decoder $7_1$, the column decoder $8_1$, the sense amplifier/reset circuit $9_1$, the boost power source $15_1$, the substrate voltage generation circuit $16_1$, and the reference voltage generation circuit $17_1$ correspond to the memory cell area $6_1$, and have the same construction as the structural elements in FIG. 1, omitting the subscript "$_1$" from each numeral. For example, the row decoder $7_1$ is the same as the row decoder 7 shown in FIG. 1. The structural elements with subscript "$_1$" replaced by subscript "$_2$" correspond to the structural elements installed in the memory cell area $6_2$.

An I/O buffer 10 is the same as shown in FIG. 1. However, in the present embodiment, it is connected to both sense amplifier/reset circuits $9_1$ and $9_2$ through the bus WRB. A column control circuit 14 is the same as shown in FIG. 1. However, in the present embodiment, it supplies a column enable signal CE to both a column decoder $8_1$ and a column decoder $8_2$.

A power down control circuit 301 generates control signals PD1 and PD2 in standby state, supplies them to the first power supply circuit and the second power supply circuit respectively, and thereby controls power down operation of these power supply circuits individually. In the present embodiment, when the control signals PD1 and PD2 are at level "H", both power supply circuits supply power, and when the signal is at level "L", both power supply circuits cut power supply. Here, in the case of normal operation when not in standby state, the power down control circuit 301 sets both the control signals PD1 and PD2 to be level "H".

Here, for simplicity of description, a case is described in which two modes, standby mode ("with refresh"), which performs self refresh of memory cells, and standby mode ("without refresh"), which does not perform self refresh of memory cells, are provided in the present embodiment. However, a case where three standby modes are provided as in the above-described embodiments is also the same. Furthermore, in the present embodiment, a case is assumed in which the level of the control signals PD1 and PD2 in standby state is fixed. Here, a construction that can program the level of these control signals externally will be described in a sixth embodiment. However, in the present embodiment, the construction may be such that the level of the control signals can be programmed.

A row control circuit 313 has almost the same construction as the row control circuit 13 shown in FIG. 1. However, in the present embodiment, since two memory plates are provided, the row control circuit 313 generates two system control signals corresponding to each of the respective memory plates. That is, the row control circuit 313 supplies row enable signals RE1 and RE2 to the row decoders $7_1$ and $7_2$ respectively, supplies the sense amplifier enable signal SE1 and the precharge enable signal PE1 to the sense amplifier/reset circuit $9_1$, and supplies the sense amplifier enable signal SE2 and the precharge enable signal PE2 to the sense amplifier/reset circuit $9_2$. Furthermore, the row control circuit 313 is linked to the level of the control signals PD1 and PD2, and controls the generation of the two abovementioned system control signals. For example, in the case where the power down control circuit 301 outputs level "L" for the control signal PD2 in standby state, the row control circuit 313 does not generate a control signal supplied to the memory cell area $6_2$ side in standby state.

Next is a description of the standby operation of a semiconductor memory device according to the above-described construction. Firstly, in the case where both memory cell areas $6_1$ and $6_1$ are used "with refresh", the power down control circuit 301 sets the control signals PD1 and PD2 to level "H" at the beginning of standby state, and causes both the first power supply circuit and the second power supply circuit to supply voltage similarly to the case of no standby state. Operating together with this, the row control circuit 313 generates the row enable signals RE1 and RE2, the sense amplifier enable signals SE1 and SE2, and the precharge enable signals PE1 and PE2 successively. As a result, the row decoders $7_1$ and $7_2$ activate word lines on the memory cell areas $6_1$ and $6_2$ respectively, and the sense amplifier/reset circuits $9_1$ and $9_2$ each select a sense amplifier to perform self refresh.

In the case where both the memory cell areas $6_1$ and $6_2$ are used "without refresh", the power down control circuit 301 sets the control signals PD1 and PD2 to level "L" in standby state. As a result, the first power supply circuit and the second power supply circuit stop voltage supply. Furthermore, the row control circuit 313 does not generate the row enable signals RE1 and RE2, the sense amplifier enable signals SE1 and SE2, or the precharge enable signals PE1 and PE2 in standby state. Consequently, in this case, self refresh is not performed at all.

In the case where the memory cell area $6_1$ is used "with refresh", and the memory cell area $6_2$ "without refresh", the power down control circuit 301 outputs a "H" level and a "L" level to the control signals PD1 and PD2 respectively in standby state. Furthermore, the row control circuit 313 generates the row enable signal RE1, the sense amplifier enable signal SE1 and the precharge enable signal PE1 in standby state, and does not generate the row enable signal RE2, the sense amplifier enable signal SE2 or the precharge enable signal PE2. As a result, only the first power supply circuit supplies a voltage, and self refresh is performed only for the memory cell area $6_1$.

In the case where the memory cell area $6_1$ is used "without refresh", and the memory cell area $6_2$ "with refresh", the operation is completely opposite to that described above. That is, the power down control circuit 301 sets the control signals PD1 and PD2 to level "L" and level "H" respectively in standby state. Furthermore, the row control circuit 313 generates only the row enable signal RE2, the sense amplifier enable signal SE2 and the precharge enable signal PE2 in standby state. As a result, only the second power supply circuit supplies a voltage, and self refresh is performed only for the memory cell area $6_2$.

In the present embodiment, in the case where both of the memory cell areas are set to "with refresh", a standby current of approximately 100 $\mu$A is consumed. On the other hand, in the case where only one of the memory cell areas is set to "with refresh", it is possible to reduce standby current by approximately a half to 50 $\mu$A. Whereas, in the case where both the memory cell area are set to "without refresh", it is possible to make standby current completely zero.

Here, in the above description, the present embodiment is described based on the first embodiment. However, the same may be applied to the second embodiment and the third embodiment. Furthermore, FIG. 23 implies that the memory cell areas $6_1$ and $6_2$ have the same capacity. However, these memory cell areas may have different capacities. Moreover, in the above description, the case of two standby modes is described. However, it may be applied to the case of three standby modes as in the above-described first to third embodiments.

Sixth embodiment

Figure 24:
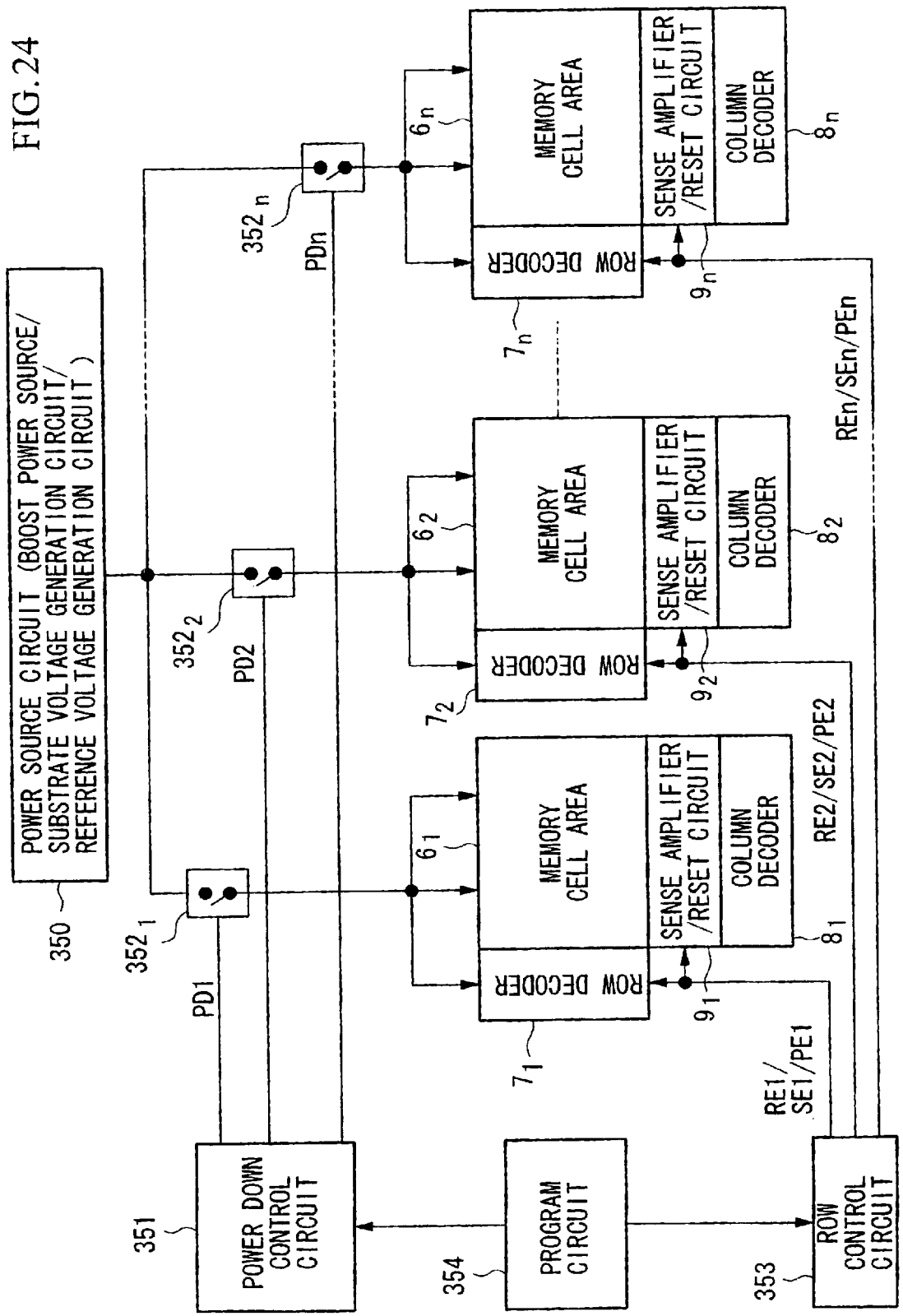
FIG. 24 is a block diagram showing the construction of the essential sections of a semiconductor memory device according to a sixth embodiment of the present invention.

FIG. 24 is a block diagram showing the construction of the essential sections of a semiconductor memory device according to the present embodiment, wherein the present embodiment is realized based on the construction in FIG. 1. In the present embodiment, the memory cell array 6 is also divided into a plurality of memory cell areas similarly to the fifth embodiment, wherein standby modes can be set individually for each memory cell area (memory plate).

However, in the present embodiment, since a semiconductor memory device with a large number of memory cell areas is considered, differently from FIG. 23, the number of memory cell areas is generalized to n (n: natural number greater than or equal to 2). Accordingly, the memory cell array 6 shown in FIG. 1 is divided into memory cell areas $6_1$ to $6_n$ in FIG. 24. Furthermore, in FIG. 24, row decoders $7_1$ to $7_n$, column decoders $8_1$ to $8_n$, and sense amplifier/reset circuits $9_1$ to $9_n$ are provided corresponding to individual memory cell area.

A power source circuit 350 is a common power supply circuit for the memory cell areas $6_1$ to $6_n$, which comprises a boost power source 15, a substrate voltage generation circuit 16, and a reference voltage generation circuit 17 as shown in FIG. 23, wherein the supply capacity is greater than the construction shown in FIG. 1 so that it can supply power to all of n memory cell areas at the same time. Here, in the present embodiment, since the power supply circuit is common to all memory cell areas, a memory plate comprises for example a memory cell area $6_1$ and its peripheral circuits, a row decoder $7_1$, a column decoder $8_1$ and a sense amplifier reset circuit $9_1$.

A power down control circuit 351 is the same circuit as the power down control circuit 301 shown in FIG. 23, which generates control signals PD1 to PDn corresponding to n memory cell areas. Switching elements $352_1$ to $352_n$ control power supply to the memory plates corresponding to the memory cell areas $6_1$ to $6_n$ depending on the control signals PD1 to PDn. For example, the switching element $352_1$ turns on when the control signal PD1 is at level "H", and supplies power from the power source circuit 350 to the memory plate corresponding to the memory cell area $6_1$, and in addition, it turns off when the signal is level "L", and stops power supply to the memory plate. Here, the switching elements $352_2$ to $352_n$ are also the same as the switching elements $352_1$.

A row control circuit 353 is the same circuit as the row control circuit 313 shown in FIG. 23, which generates row enable signals RE1 to REn, sense amplifier enable signals SE1 to SEn, and precharge enable signals PE1 to PEn, and supplies these control signals to corresponding memory plates. A program circuit 354 can program which individual memory cell areas are set to "with refresh" or "without refresh" as desired depending on a user's needs and applications. Furthermore, the program circuit 354 transmits data indicating either "with refresh" or "without refresh", which are programmed for each memory cell area, to the power down control circuit 351 and the row control circuit 353.

Here, for practical approaches to programming from outside the semiconductor memory device to the program circuit 354, the following two approaches can be considered as specific examples.

A first practical approach considers the installation of a fuse inside the program circuit 354 corresponding to a memory plate. In this case, it is possible to set the levels of the control signals PD1 to PDn in standby state depending on whether an individual fuse is disconnected or not.

Next, a second practical approach considers an address supplied from outside being used. That is, since the memory cell areas $6_1$ to $6_n$ are each allocated to different memory spaces, when address "Address" (refer to FIG. 1) is applied from outside, the address defines a unique memory cell area. For example, if n=4, in a case where the values of the two high order bits are "00B" to "11B", memory cell areas $6_1$ to $6_4$ are accessed accordingly. As a result, it is possible to specify the memory cell area to be programmed by the address "Address".

In order to realize the above, the construction may follow the fourth embodiment (refer to FIG. 17 and FIG. 18). Firstly, a register for holding the standby mode set externally is installed inside the program circuit 354 for each memory plate. Furthermore, address "Address", the chip select signal/CS, the write enable signal/WE and the bus WRB are input to the program circuit 354.

Then, for setting standby mode, the memory plate to be set is defined by the two high order bits of the address "Address", and also the other, lower order bits, are set to a specific value (for example, lower order bits are all "0B" following the fourth embodiment). Furthermore, data indicating the standby mode to be set is applied to the bus WRB. If the write enable signal/WE is lowered in this state, the program circuit 354 takes in data of the standby mode to be set in a memory plate defined by the two high order bits from the bus WRB, and stores it in a register corresponding to the memory plate.

Next is a description of the standby operation of a semiconductor memory device according to the above-described construction. For example, only memory cell area 61 is set to "with refresh", and the memory cell areas other than this are all set to "without refresh". Then, this setting is programmed into the program circuit 354 using one of the two above-described practical approaches. As a result, the setting of standby mode for each memory plate is advised to the power down control circuit 351 and the row control circuit 353.

As described above, during a normal operation, the control signals PD1 to PDn are all at level "H". By contrast, in standby state, the power down control circuit 351 maintains the control signal PD1 at level "H", while the other control signals PD2 to PDn are set to level "L". As a result, the switch element $352_1$ remains on, and conversely the switch elements $352_1$ to $352_n$ are all turned off. Consequently, power continues to be supplied from the power source circuit 350 to the memory plate corresponding to the memory cell area $6_1$. However, power is not supplied to the memory plates corresponding to the memory cell areas $6_2$ to $6_n$.

On the other hand, the row control circuit 353 self refreshes the memory cell area $6_1$, to which power continues to be supplied, by generating a row enable signal RE1, a sense amplifier enable signal SE1, and a precharge enable signal PE1. Furthermore, for the memory plates corresponding to the memory cell areas $6_2$ to $6_n$, to which power is not supplied, the row control circuit 353 does not generate a row enable signal, a sense amplifier enable signal, or a precharge enable signal. In this manner, by controlling such that self refresh is only performed by the memory cell area $6_1$ in standby state, it is possible to reduce standby current to "1/n".

As described above, the present embodiment can obtain the same advantage as the fifth embodiment, and also it is possible to set the standby mode externally as desired depending on a user's needs and application. Furthermore, in the present embodiment, since the power source circuit 350 is used in common for all memory plates, even if the number of memory plates increases, the number of power supply circuits does not need to be increased, thus enabling a smaller sized construction compared with the fifth embodiment.

Here, in the above description, the present embodiment is described based on the construction of the first embodiment. However, the same may be applied to the second embodiment through the fourth embodiment. Furthermore, FIG. 24 implies that the memory cell areas $6_1$ to $6_n$ have the same capacities. However, the memory cell areas may have different capacities. Moreover, in the above description, the case of two standby modes is described. However, similarly to the first through the third embodiments, it may be applied to a case of three standby modes.

Furthermore, the standby mode control described in the embodiments (the first embodiment through the sixth embodiment) mentioned above may be applied to an existing semiconductor memory device such as conventional pseudo-SRAM, standard DRAM and the like, and is not limited to pseudo-SRAM with standard SRAM specifications.

Seventh Embodiment

In the first embodiment through the sixth embodiment described above, refresh operations of the memory cell array 6, the memory cell areas $6_1$, $6_2$ and $6_n$ and the like are all controlled inside the semiconductor memory device. Alternatively, in the present embodiment, the construction may be such that in addition to refresh operations being controlled inside the semiconductor memory device similarly to the above-described embodiments, refresh operations can also be controlled externally. By using such a construction, it is possible to select chips with defective refresh operation using a test before shipping.

Firstly, specific details of such defects and reasons for the occurrence of such defects will be described. In the first embodiment of the embodiments described above, for example, the refresh start timing is controlled based on the refresh control signals REFA and REFB generated by the refresh control circuit 4 (refer to FIG. 1). In the timing as shown in FIG. 7, for example, at a point (time t54) where a predetermined time has elapsed from when the refresh control signal REFA is set to level "H" (time t53), a negative one shot pulse is generated on the refresh control signal REFB to start self refresh. The fact that these refresh control signals are generated based on output signals from the refresh timer inside the refresh control circuit 4 is as described previously.

Here, it is typical that the refresh timer generates its output signal by dividing the output frequency of a ring oscillator (omitted in the figure) installed inside the semiconductor memory device. Therefore, in the case of such a construction, the timing of the refresh control signal depends on the period of the ring oscillator. However, the period of a ring oscillator can change due to such factors as power source voltage, external temperature, manufacturing process and the like. In particular, the external temperature changes continually depending on the environment where the semiconductor memory device is placed. Consequently, it is not actually possible to predict when self refresh will start depending on refresh control signals. In other words, viewed from outside the semiconductor memory device, self refresh inside the semiconductor memory device starts asynchronously.

On the other hand, as described above, the timing when address "Address" changes (including the activation of chip select signal/CS; hereunder the same) looks asynchronous viewed from the inside of the semiconductor memory device, so that the timing cannot be predicted. In this manner, the two timings are asynchronous with each other, so it is extremely difficult to find defects, which are generated only when the timing of the start of self refresh and the timing of address "Address" change are in a specific time relationship, using only a normal semiconductor memory device test.

For defects dependant on such timing, the following can be considered. As described above, a one shot pulse is generated on the address transition detection signal ATD by an address "Address" change. However, there is a possibility that inside the semiconductor memory device, the generation of a one shot pulse, or the like, becomes a source of noise. That is, in a case where the timing of the start of self refresh and the timing of the change of address "Address" overlap, there is a possibility that the power supply voltage declines transiently due to the generation of a one shot pulse. If this happens, a temporary negative pulse occurs on the pulse for the row enable signal RE (for example, refer to time t55 in FIG. 7) generated from the refresh control signal REFB at the start of self refresh (in other words, a hazard occurs).

Figure 25:
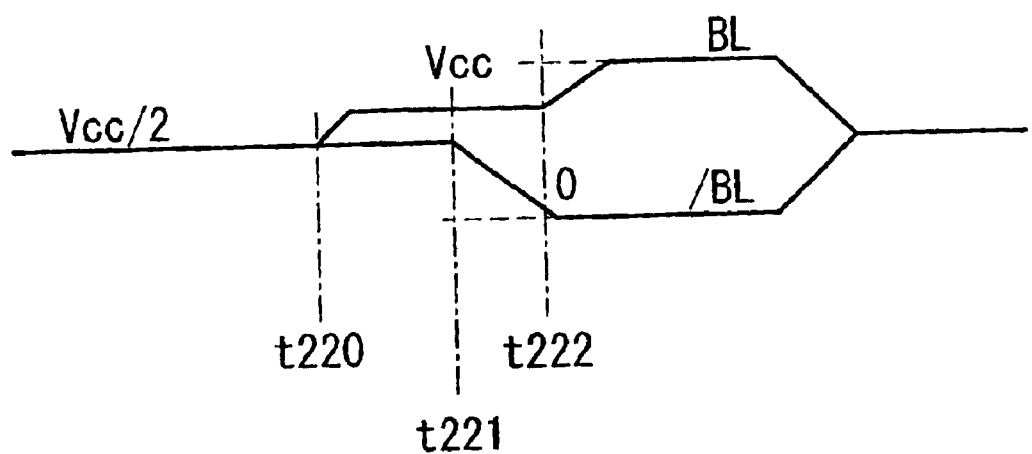
FIG. 25 is a timing chart for a sense operation on a DRAM memory cell, showing the situation as the electric potential of a bit line pair BL, /BL varies as time elapses.

If the level of the row enable signal RE falls, the word line is deactivated, the required refresh time is thus not satisfied, and thus refresh is unfinished. Such a refresh time shortage causes a defect wherein memory cells are refreshed with incorrect data as described hereunder. That is, in order to perform a refresh (reading is the same) of a DRAM memory cell, voltages of complementary bit lines (symbol BL and symbol/BL in the figure) comprising a pair of bit lines as shown in FIG. 25 for example, are both precharged to ½Vcc, and subsequently the word line is activated and the electric charge held by the memory cell connected to the word line is read on the bit line BL.

In this operation, a minute potential difference occurs between the bit lines BL and /BL from a time t220 in the figure, and this minute potential difference is then amplified by the sense amplifier to an potential difference corresponding to a logic level of "0" or "1" (for example, ground potential or power source potential Vcc). This amplified potential difference is used as a potential difference for rewriting (refreshing) to the memory cell. Consequently, if the refresh time becomes insufficient, rewriting to the memory cell is performed with a potential difference (for example, potential difference around the times t220 to t222) that has not been sufficiently amplified. Therefore, there is a possibility that data "0" is rewritten, although the memory cell stored data "1".

Furthermore, other than the defect as described above, there is a possibility that noise occurring through the generation of a one shot pulse causes the following defect. That is, it is necessary to maintain a predetermined time (for example, the period from the time t220 to the time t221 in FIG. 25) from when the word line is activated to when the sense amplifier starts operation. If noise caused by a one shot pulse within the predetermined time occurs on a pair of the bit lines, it can be considered that the minute potential difference is changed by the influence of the noise, and the magnitude correlation of electric potential between bit lines BL and/BL is reversed. If this happens, even if the sense amplifier performs an amplification operation, it is not possible to refresh the memory cell with the correct data stored in the memory cell.

Because chips with defects as described above cannot be shipped, it is necessary to select such chips and guarantee that no defects occur whatever the time relationship between the timing of the start of self refresh and the timing of address change. Here, a fundamental solution is to avoid noise sources, and options such as enhancing the power source, and dividing the power source system into a plurality are considered suitably effective. However, since noise cannot be completely removed even though those options are provided, it is obviously necessary to test whether defects are really solved.

Therefore, in the present embodiment, depending on instructions from outside of the semiconductor memory device (a tester device as an example), the time relationship between the timing of the start of self refresh and the timing of address "Address" change is varied, and the existence of the abovementioned defects is then tested. Incidentally, there are some types of standard DRAMs that perform self refresh. However, since standard DRAMs do not use a construction that generates a one shot pulse signal corresponding to an address change, defects as described above do not occur. In that respect, such a problem of testing for such defects is unique to semiconductor memory devices with SRAM specifications using DRAM memory cells, as in the present invention.

Figure 26:
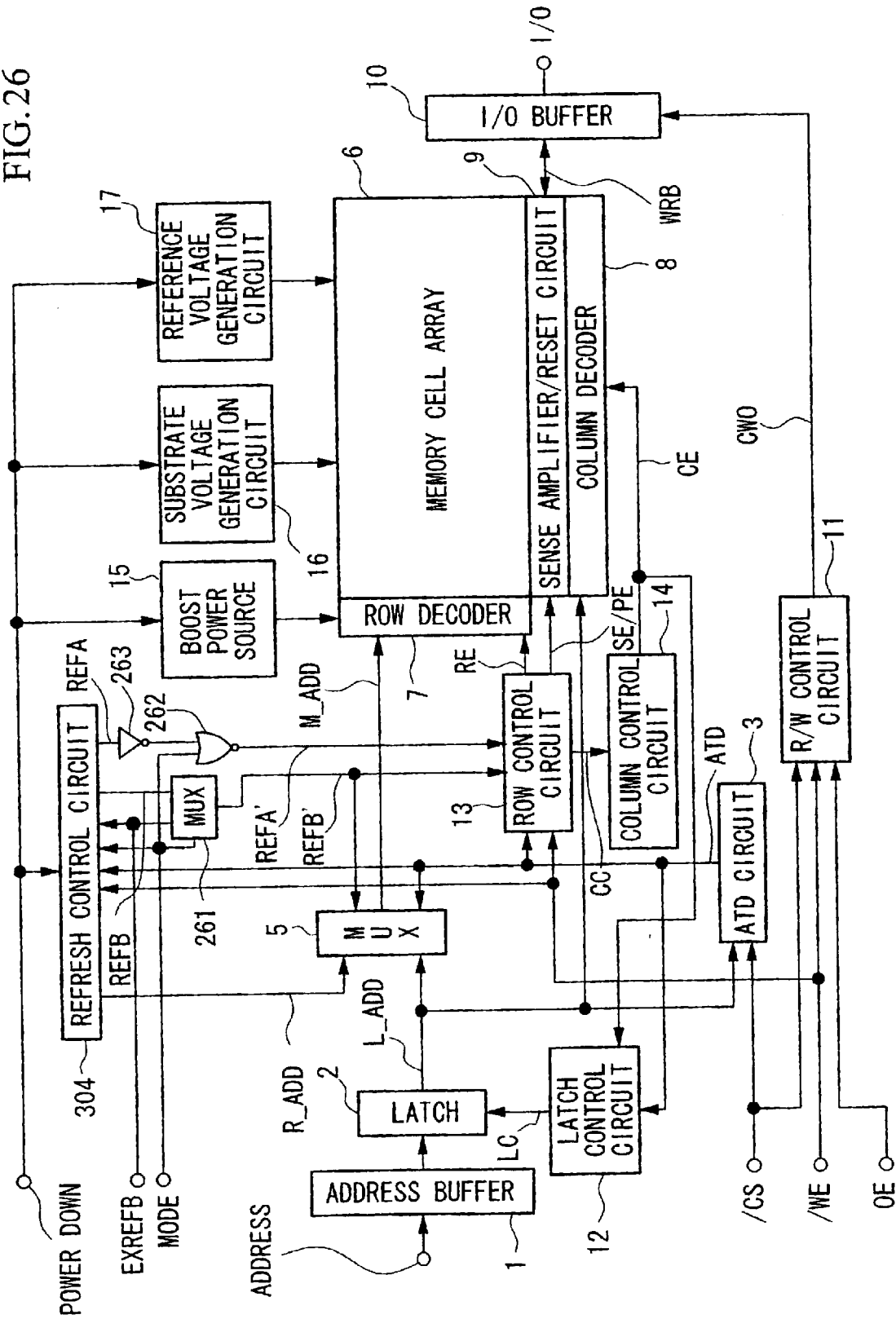
FIG. 26 is a block diagram showing the construction of a semiconductor memory device according to a seventh embodiment of the present invention.

The following is a description of a specific construction in a case where the technical concept of the present invention is applied to the construction of the first embodiment as an example. FIG. 26 is a block diagram showing the construction of a semiconductor memory device according to the present embodiment. Those structural elements and signal names that are identical to those shown in FIG. 1 are assigned the same numerals. To describe the differences from FIG. 1, in the present embodiment a multiplexer 261, a NOR gate 262 and an inverter 263 are added to the construction in FIG. 1, and a test mode signal MODE and a refresh control signal EXREFB supplied from tester device are added as input signals. Furthermore, the test mode signal MODE and the refresh control signal EXREFB are supplied to the refresh control circuit 4 shown in FIG. 1, and the additional functionality (detail described later) based on these signals applies to a refresh control circuit 304.

Here, the test mode signal MODE is a test mode entry signal for switching the semiconductor memory device from normal operation mode to test mode, and the refresh control signal EXREFB is a signal for starting refresh from outside the semiconductor memory device. Furthermore, in FIG. 1, the refresh control signals REFA and REFB are supplied to the multiplexer 5 and the row control circuit 13. However, in the present embodiment, refresh control signals REFA' and REFB' are supplied to the multiplexer and the row control circuit 13 instead.

If the test mode signal MODE is at level "H", the multiplexer 261 selects the refresh control signal EXREFB, and outputs it as the refresh control signal REFB'. If the test mode signal MODE is at level "L", it selects the refresh control signal REFB in the same manner as the first embodiment, and outputs it as the refresh control signal REFB'. The circuit comprising the NOR gate 262 and the inverter 263 forces the refresh control signal REFA' to level "L", regardless of the level of the refresh control signal REFA, if the test mode signal MODE is at level "H". On the other hand, if the test mode signal MODE is at level "L", it outputs the refresh control signal REFA as the refresh control signal REFA' unchanged similarly to the first embodiment. In the case where the test mode signal MODE is at level "H", the refresh control circuit 304 increments an internal address counter by "1" count at a rise of the refresh control signal EXREFB and updates the refresh address R_ADD.

In this manner, by setting the test mode signal MODE to level "H" and switching to test mode, refresh requests generated inside the semiconductor memory device (refresh with a rise of the address transition detection signal ATD as a trigger, and self refresh by a refresh timer) are made invalid, and external refresh control is made valid. Then, by supplying a negative one shot pulse for the refresh control signal EXREFB externally in such a state, refresh is started in the same manner as when a negative one shot pulse is applied to the refresh control signal REFB, and also the refresh address R_ADD is updated. On the other hand, if the test mode signal MODE is set to level "L", refresh by refresh requests generated inside the semiconductor memory device are performed in exactly the same manner as in the first embodiment.

Here, both the test mode signal MODE and the refresh control signal EXREFB are signals used only in pre-shipping tests, and so the test mode signal MODE is fixed to level "L" for use after shipping. Furthermore, although the refresh control signal EXREFB has no influence on the operation of the semiconductor memory device if the test mode signal MODE is set to level "L", it is fixed to either level "H" or level "L" for use. However, if an existing pin such as the output enable signal OE pin or the like also serves as the refresh control signal EXREFB pin, this does not apply.

Unused pins (NC: No Connection) may be allocated as pins for inputting the test mode signal MODE and the refresh control signal EXREFB. Large capacity SRAMs have unused pins in most cases, and so there are few cases where the number of pins needs to be increased just for external refresh control. Furthermore, for the refresh control signal EXREFB, an existing signal that is not used during refresh may be used. The output enable signal OE mentioned above, selection signals UB (Upper Byte), LB (Lower Byte) (neither shown in the figure) for selecting bytes to be transferred between the outside the semiconductor memory device and the like can be considered as candidates for such signals. Incidentally, in FIG. 26, the refresh control signals REFA and REFB are input to the multiplexer 261 and the like directly. However, there may be an intervening buffer.

Figure 27:
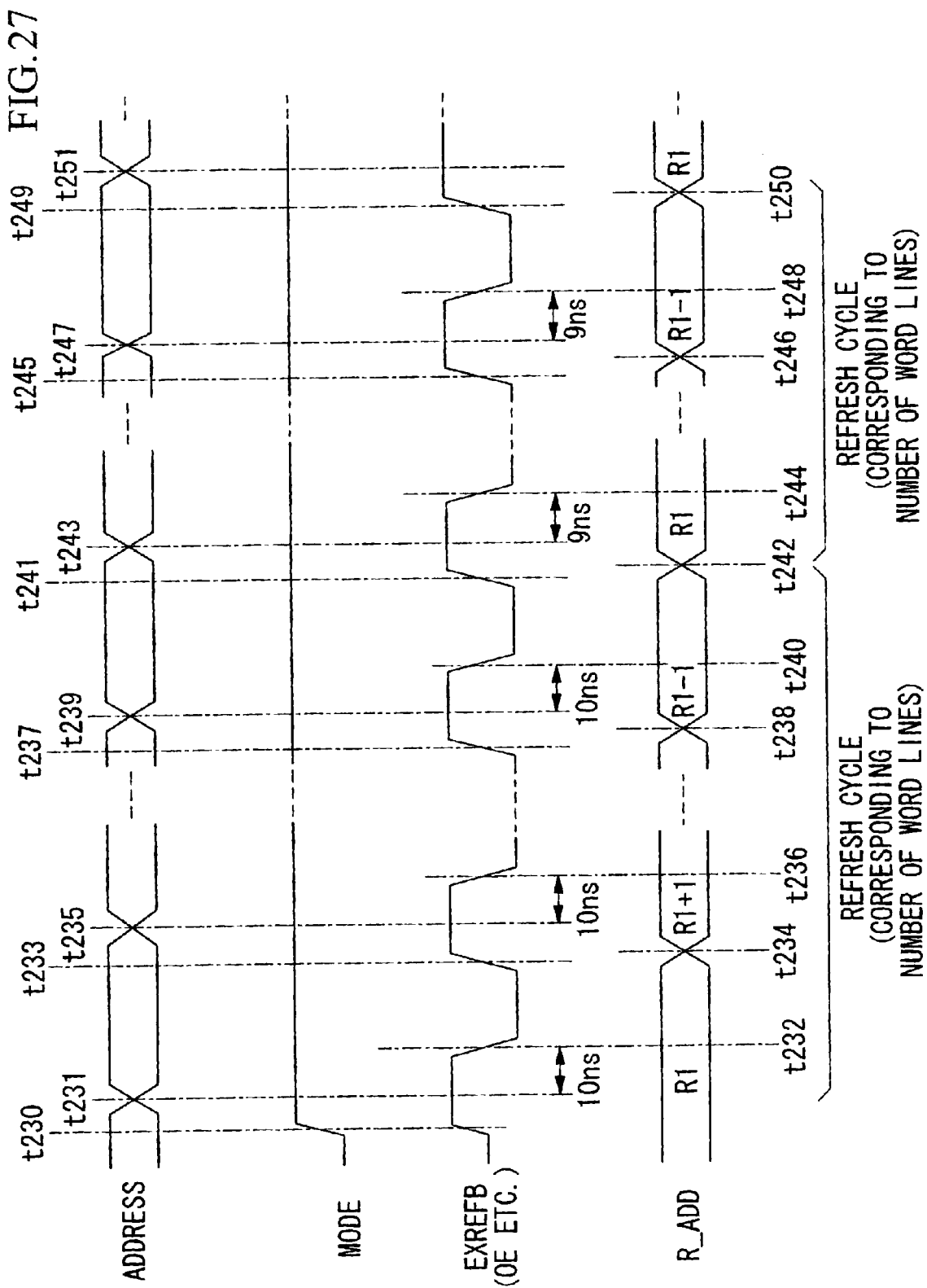
FIG. 27 is a timing chart for the seventh embodiment, showing the timing of signals supplied from a tester device to the semiconductor memory device, together with a refresh address R_ADD.
Figure 28:
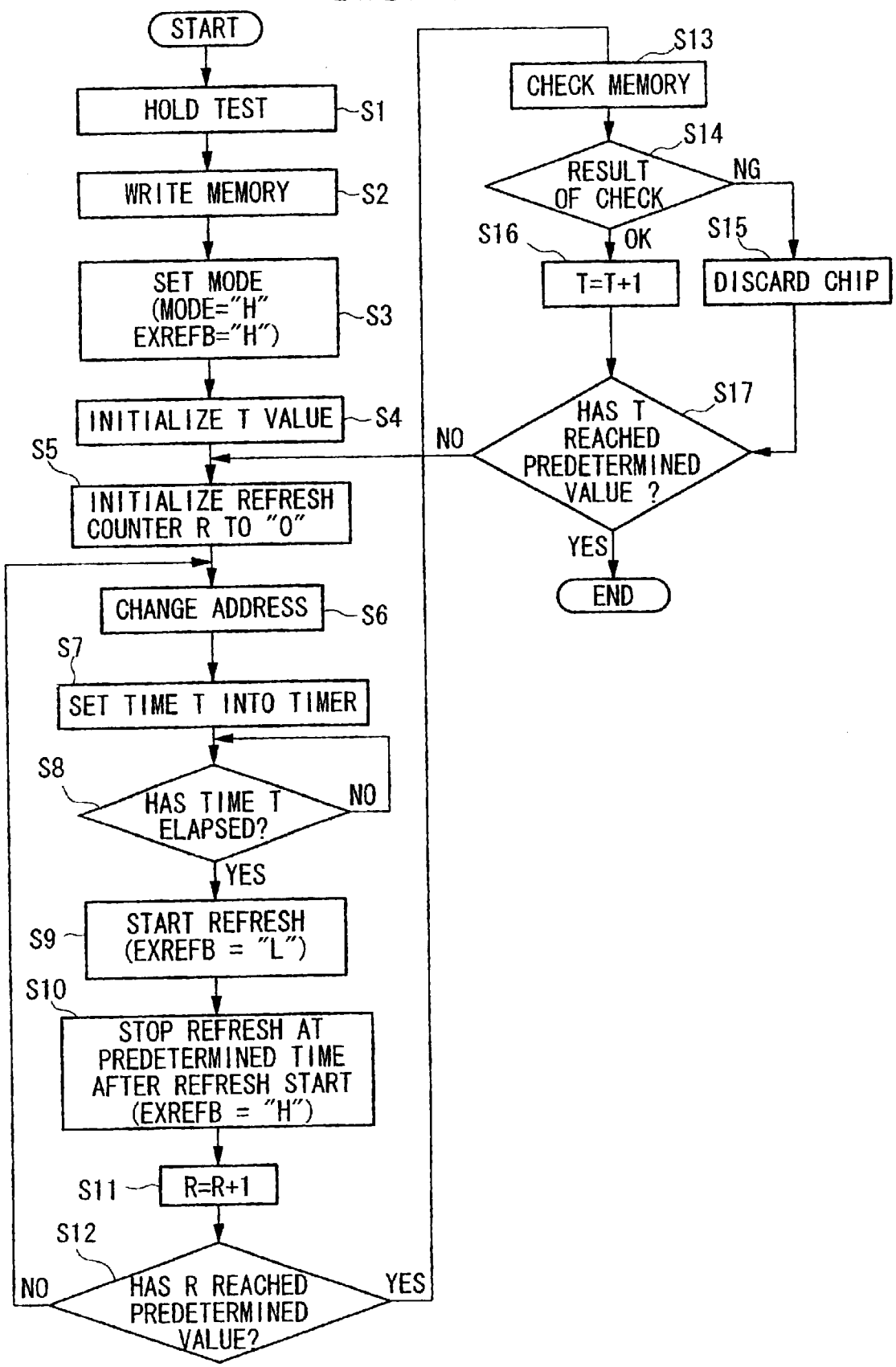
FIG. 28 is a flow chart for the seventh embodiment, showing a test procedure for a semiconductor memory device executed within a tester device.

Next is a description of the operation of a semiconductor memory device according to the above-described construction. Here, because the operation where the test mode signal MODE is set to level "L" is exactly the same as the operation in the first embodiment, it is not repeated. Accordingly, the operation in test mode when the test mode signal MODE is set to level "H" will be described in detail here. FIG. 27 is a timing chart showing the timing of a signal supplied from the tester device to the semiconductor memory device together with the refresh address R_ADD. Furthermore, FIG. 28 is a flow chart showing the procedure of the semiconductor memory device test executed inside the tester device.

Firstly, a hold test is performed in advance (step S1 in FIG. 28), because if there is a permanent defect, or a memory cell with defective hold characteristics in a chip, it becomes meaningless to perform a test for refresh operation. The hold test itself may be performed according to the same test procedure as performed for standard DRAM. That is, when writing to the memory cell array 6 is performed, and reading is performed after a state has continued for a predetermined time during which refresh is disabled, by adjusting the predetermined time (that is, refresh cycle) such that the read data just matches the written data, a value of refresh cycle corresponding to the memory cell with the shortest hold time is determined. At that time, in the present embodiment, by setting both the test mode signal MODE and the refresh control signal EXREFB to level "H", refresh operation by neither internally generated refresh request nor external refresh request are performed at all, and hence it is possible to easily realize a state wherein refresh is disabled.

The tester device writes (step S2) a test pattern in advance to the memory cell array 6 in order to test afterwards whether the refresh operation is performed correctly (to be specific, at step S13). Here, since the purpose is to test the normality of the refresh operation, a test pattern in which all bits are "1" (that is, data corresponding to a state in which each memory cell holds a high electric potential) is used.

Subsequently, the tester device changes the test mode signal MODE to level "H", and switches the semiconductor memory device to test mode (step S3: time t230 in FIG. 27). Here, when the test mode signal MODE is set to level "H", if the refresh control signal EXREFB is at level "L", refresh is performed immediately. Therefore, the tester device changes the refresh control signal EXREFB to level "H" at the same time as setting the test mode signal MODE to level "H". However, the refresh control signal EXREFB may be set to level "H" before setting the test mode signal MODE to level "H".

By such settings, since the refresh control signal REFA' becomes level "H" inside the semiconductor memory device, even if a one shot pulse is generated on the address transition detection signal ATD, refresh is not started inside the semiconductor memory device. Furthermore, since the multiplexer 261 selects the refresh control signal EXREFB, whatever state the refresh timer in the refresh control circuit 304 is in, it does not affect the operation. A state in which refresh can be performed is only created when a negative one shot pulse is applied to the refresh control signal EXREFB. Here, the tester device maintains the test mode signal MODE at level "H" afterwards while the test is performed.

Subsequently, the tester device initializes the value of a time T, for example to "−10 ns" (step S4). The time T here is the time at which address "Address" should be changed with respect to the time at which the refresh control signal EXREFB is lowered. If this time T has a negative value, it means the address "Address" changes at the point of time "−T" before the refresh control signal EXREFB is lowered. On the other hand, if the time T has a positive value, it means that the address "Address" changes after the time T has elapsed from when the refresh control signal EXREFB is lowered. In the present embodiment, by varying the time T in "1 ns" increments within a range of "−10 ns" to "+10 ns", it can be checked whether a defect occurs due to the time relationship between the timing of address "Address" change and the timing of the start of refresh.

Subsequently, the tester device initializes the value of the number of refreshes, R, to "0" (step S5). As described later, in the present embodiment, a predetermined number of refreshes (normally a number of refreshes corresponding to the number of word lines) is performed for each value of time T to refresh the whole of memory cell array 6. That is, this number of refreshes, R, corresponds to a counter for storing the number of refreshes performed for each value of time T. Here, in the present embodiment, the number of word lines is "512" for example.

Subsequently, at a time t231, the tester device changes the value of the address "Address", and generates a positive one shot pulse on the address transition detection signal ATD (step S6). Here, address "Address" may be any value before and after the change, and any bit of address "Address" may be changed. However, since address "Address" is changed in order to generate noise, it is desirable for the address "Address" change pattern to be a pattern that is most susceptible to noise, which makes the noise level high. Accordingly, for the address "Address" change pattern, a pattern that inverts all bits of the address "Address" at the same time is desirable.

Subsequently, the tester device sets (step S7) a timer, which is not shown in the figure, inside the tester device to the time T (to be accurate, the absolute value of the time T, because there is a case where the time T is negative) initialized in step S4. The tester device waits, doing nothing, until this time ("10 ns" at this point) has elapsed ("NO" in step S8). Then, at a time t232 ("YES" in step S8) after "10 ns" has elapsed from the time t231, the tester device changes the refresh control signal EXREFB to level "L", and starts refresh operation (step S9). Here, by this point, the address counter inside the refresh control circuit 304 has output "R1" (R1=0 to 511 [decimal]) as a value of the refresh address R_ADD.

Subsequently, at a time t233 after a predetermined time has elapsed from the time t232, the tester device returns the refresh control signal EXREFB to level "H", and terminates the refresh operation (step S10). Here, this predetermined time may be, for example, the same time as the time from t54 to t56 in FIG. 7 during which the refresh control signal REFB is level "L". Then at a time t234, detecting a rise of the refresh control signal EXREFB, the refresh control circuit 304 inside the semiconductor memory device updates the value of the refresh address R_ADD to "R1+1" in preparation for the next refresh.

In this manner, the detailed operation between the times t230 to t234 is basically the same as, for example, the operation between the times t53 to t57 in FIG. 7. However, in the present embodiment, the refresh address R_ADD is not updated at the fall of the address transition detection signal ATD as in the first embodiment, but the refresh address R_ADD is updated by the rise of the refresh control signal EXREFB when the test mode signal MODE is at level "H".

The tester device increases the value of the number of refreshes, R, by just "1" (step S11) corresponding to the update of the refresh address R_ADD, and judges whether refresh has been performed for just the number of word lines. In this case, because only one refresh has been performed ("NO" in step S12), the tester device returns processing to step S6, and the same processing as described before is performed without changing the value of the time T. That is, the address "Address" is changed at a time t235, the refresh control signal EXREFB is changed to level "L" at a time t236 when another 10 ns has elapsed, and refresh operation for the address "R1+1" is started. Then, the refresh control signal EXREFB is returned to level "H" after a predetermined time has elapsed, and the refresh address R_ADD is updated to the next address.

Afterwards, the same operation is repeated until refresh of the five hundred and twelfth word line (refresh address R_ADD is "R1−1" in FIG. 27) is completed at a time t241 ("YES" in step S12). Incidentally, in FIG. 27, the refresh addresses before and after the address R1 are expressed as "R1−1" and "R1+1" for convenience of illustration. However, to be accurate, if the value of the address R1 is "0", the value of the address "R1−1" is 511 (decimal), and if the value of the address R1 is "511" (decimal), the value of the address "R1+1" is "0".

When refresh is completed for the whole memory cell array 6 in the above-described manner, the tester device tests whether any defect has occurred during the refresh operation by noise due to an address change. To do so, the tester device reads data sequentially from the memory cell array 6, while thoroughly verifying with the test pattern written in the previous step S2 (step S13). As a result, if there is any mismatching data ("NG" in step S14), the tested chip is a defective one wherein the above described defect occurred, and is therefore classified as a chip for rejection (step S15).

Here, for convenience of illustration, in FIG. 28 it is also possible to understand that after all memory cells are verified in step S13, the check result is judged in step S14. However, from the point of view of test time, if any memory cell is detected to have a verification mismatch, it is clear that there is no problem in determining that the chip should be rejected (step S15) without verifying the other memory cells.

On the other hand, if all data match ("OK" in step S14) as a result of verification in step S13, no defect has occurred for a time T of "−10 ns". Therefore, the tester device increases the time T (step S16), for example by just "1 ns", and afterwards it is judged whether this time T has reached a predetermined value. In the present embodiment, because the test is performed until "+10 ns", this predetermined value is "+11 ns".

At this point, since the time T is "−9 ns" ("NO" in step S17), the tester device returns the processing to step S5, and similar processing as described previously is repeated (times t243 through t250). A difference between the operation of this case and the operation described above is that the time from when the address "Address" is changed to when the refresh control signal EXREFB is lowered is "9 ns" (for example, times t243 to t244 in the test for the first word line).

The tester device performs a test for each value of the time T while incrementing the time T by "1 ns" each time in this manner. Then, if there is any defect influenced by noise caused by an address "Address" change during refresh, this defect is detected by a memory check (step S13). On the other hand, if no such defect is detected, and the results of the tests for all values of time T within a range "−10 ns" to "+10 ns" in step S14 are "OK", the determination result in step S17 then finally becomes "YES", and it is possible to determine that the semiconductor memory device under test is a normal chip (non-defective article) that is not influenced by noise caused by address "Address" change.

Here, in the above operation, in the case where the value of the time T is "0", the tester device changes the address "Address", and at the same time lowers the refresh control signal EXREFB. That is, in this case, the tester device omits the processing in steps S7 to S8, and performs the processing in step S6 and step S9 at the same time. On the other hand, in the case where the time T has a positive value, the tester device firstly lowers the refresh control signal EXREFB, and then changes the address "Address" at the point when the time T has elapsed. That is, in this case, the processing in step S6 and the processing in step S9 in FIG. 28 are exchanged.

As described above, in the present embodiment, the construction is such that the timing of the refresh control signals REFA' and REFB' can be controlled from outside the semiconductor memory device, and so the time relationship between the timing of the start of refresh and the timing of address changes during normal reading and writing operations is varied. As a result, it is possible to test before shipping that there is no defect caused by the influence of noise occurring due to address changes over the time range for possible time relationship between the timing of the start of refresh and the timing of address changes.

Incidentally, in the above description, the time T is set within a range of "−10 ns" to "+10 ns", and changed in increments of "1 ns". However, this is just one example and so, needless to say, the time range through which the time T is changed and the value of the time step size may be determined depending on each semiconductor memory device.

Furthermore, in the above description, the present invention is described using the first embodiment as a basis. The cases where it is applied to the second embodiment through the sixth embodiments are exactly the same. That is, in these embodiments, the connection relationships between the refresh control circuit 304 (refresh control circuit 204), the multiplexer 5, and the row control circuit 13 (row control circuit 313, row control circuit 353) are exactly the same as in the first embodiment. Therefore, exactly the same modifications as are made in the construction in FIG. 1 may be made to the constructions in FIG. 12, FIG. 14, FIG. 17, FIG. 23 and FIG. 24.

Here, in each embodiment described above, for example, refresh is performed from the rising edge of a one shot pulse generated on the address transition detection signal ATD. However, inverting the logic of the one shot pulse, refresh may be performed from the falling edge. This is exactly the same for signals other than the address transition detection signal ATD.

Furthermore, in each embodiment described above, each memory cell such as memory cell array 6 and the like comprises one transistor and one capacitor. However, the structure of the memory cells is not limited to such a configuration. From the point of chip size and the like, such memory cells are naturally most desirable. However, in a semiconductor memory device of the present invention, usage of memory cells other than one transistor and one capacitor is not excluded. That is, if it is a DRAM memory cell whose structure is smaller than a standard SRAM memory cell, there is an effect of reducing chip size compared with standard SRAM even though it is not a one transistor and one capacitor construction.

Moreover, obviously the configuration of a semiconductor memory device according to the above-described embodiments may be one wherein whole circuits are mounted on a single chip as shown in FIG. 1. However, the configuration may be such that whole circuits are divided into several function blocks, and each function block is mounted on a different chip. As an example of the latter, a hybrid IC (integrated circuit) can be considered in which a control section for generating all of the control signals and address signals and a memory cell section are mounted on different chips (control chip and memory chip). That is, such a construction in which all of the control signals to the memory chip are supplied from a control chip installed outside a memory chip also comes within the scope of the present invention.

Industrial Applicability

The present invention is a semiconductor memory device which operates with the specification of a standard SRAM, and even though storage capacity is increased it has a small chip size, low power consumption and is inexpensive, and the invention provides a technique to realize a semiconductor memory device wherein there are no problems such as normal access being influenced by refresh, refresh unable to be performed due to continuation of writing, and defects due to delayed access and defective memory cells occurring in a case where the address is skewed do not occur. Furthermore, the present invention supplies control signals and address signals from outside a memory chip in which memory cells are formed, and provides control circuits to realize the abovementioned semiconductor memory device as well as this memory chip. Moreover, the present invention provides a technique to realize a semiconductor memory device that has standby modes equivalent to those used in standard SRAM, and a unique low power consumption mode, which is not provided in existing semiconductor memory devices.

What is claimed is:

1. A semiconductor memory device comprising:
   a plurality of memory cells which require refresh;
   a refresh address generating circuit which generates a refresh address signal corresponding to memory cells which are the object of said refresh,
   an address transition detection circuit which generates an address transition detection signal in response to an input address signal; and
   a control circuit which, in response to said address transition detection signal, performs refresh of memory cells corresponding to said refresh address signal and then accesses memory cells corresponding to said input address signal.

2. A semiconductor memory device according to claim 1, wherein
   said address transition detection circuit generates said address transition detection signal in response to higher predetermined bits of said input address signal, and
   said control circuit changes a page address comprising bits other than said higher predetermined bits of said input address signal, for a plurality of memory cells for which said higher predetermined bits of said input address signal are the same, and continuously accesses said plurality of memory cells.

3. A semiconductor memory device according to claim 1, wherein said address transition detection circuit generates said address transition detection signal in response to said input address signal or an activation signal, and
   said activation signal is a selection signal which is valid when said semiconductor memory device is accessed.

4. A semiconductor memory device according to claim 1, wherein said address transition detection signal is a one shot pulse.

5. A semiconductor memory device according to claim 4, wherein said control circuit performs said access after said refresh is performed, with generation of said one shot pulse as a trigger.

6. A semiconductor memory device according to claim 4, wherein said address transition detection circuit generates respective pulses of predetermined width in response to transition of respective bits of said input address signal or an activation signal used in generating said address transition detection signal, and generates said one shot pulse by combining these pulses.

7. A semiconductor memory device according to claim 4, wherein said address transition detection circuit generates a one shot pulse having a pulse width which exceeds the maximum value of skew incorporated in said input address signal or an activation signal, as said address transition detection signal.

8. A semiconductor memory device according to claim 4, wherein said address transition detection circuit generates a one shot pulse having a pulse width corresponding to a waiting period from start of transition of said input address signal or an activation signal until said input address signal or said activation signal become definite, as said address transition detection signal.

9. A semiconductor memory device according to claim 4, wherein said control circuit performs said refresh within a period where said one shot pulse is being generated.

10. A semiconductor memory device according to claim 4, wherein said one shot pulse has a first transition point and a second transition point which become a trigger for said refresh and said access, and
said refresh address generating circuit updates said refresh address signal in response to said second transition point.

11. A semiconductor memory device according to claim 1, wherein said control circuit takes in the input write data to a write bus in response to a write enable signal which activates write operation to said memory cell when said write enable signal is input within a period where refresh is performed, and said control circuit writes said write data from said write bus to said memory cell after completion of said refresh.

12. A semiconductor memory device according to claim 1, wherein said control circuit starts self refresh when said address transition detection signal has not been generated for a predetermined time, and generates an internal refresh request at a predetermined time interval to perform said refresh.

13. A semiconductor memory device according to claim 12, wherein when said address transition detection signal is generated during refresh is being performed by said self refresh, said control circuit performs access for said input address signal after said self refresh has been performed.

14. A semiconductor memory device according to claim 1, further comprising:
a refresh control circuit which comprises a circuit part of said control circuit which controls said refresh, and said refresh address generating circuit,
a voltage generating circuit which generates a voltage for supply to a predetermined circuit inside said semiconductor memory device, and
a mode switching circuit which switches any one of a first mode which supplies power to both said refresh control circuit and said voltage generating circuit, a second mode which stops supply of power to said refresh control circuit and supplies power to said voltage generating circuit, and a third mode which stops power supply to both said refresh control circuit and said voltage generating circuit, and respectively controls whether or not to supply power to said refresh control circuit and said voltage generating circuit in accordance with said switched mode.

15. A semiconductor memory device according to claim 14, wherein said mode switching circuit switches the mode, in response to receiving a write request of predetermined data to a predetermined address for each mode.

16. A semiconductor memory device according to claim 1, wherein in response to an input test mode signal, said control circuit selects either one of an input refresh request and an internal refresh request generated based on said address transition detection signal, and performs said refresh in accordance with the selected refresh request.

17. A semiconductor memory device according to claim 16, wherein said input refresh request is input via a pin which is not used during said refresh.

18. A semiconductor memory device according to claim 1, wherein said refresh address generating circuit updates said refresh address signal each time refresh is performed.

19. A semiconductor memory device according to claim 1, wherein in response to said address transition detection signal, said control circuit performs refresh of memory cells corresponding to said refresh address signal, and then performs reading or writing of memory cells corresponding to said input address signal.

20. A semiconductor memory device according to claim 1, wherein
when a write request is input, in response to said address transition detection signal, said control circuit performs refresh of memory cells corresponding to said refresh address signal, and then performs write to memory cells corresponding to said input address signal, and
when a read request is input, in response to said address transition detection signal, said control circuit performs read of memory cells corresponding to said input address signal and then performs refresh of memory cells corresponding to said refresh address signal.

21. A semiconductor memory device according to claim 20, wherein when a predetermined time has elapsed from when said input address signal has changed, said control circuit determines whether an input access request is a read request or a write request.

22. A test method for a semiconductor memory device for testing the semiconductor memory device disclosed in any one of claim 1 through claim 21, comprising:
a step which writes a predetermined test pattern to a memory cell array comprising said plurality of memory cells;
a step which inhibits all refresh due to a refresh request generated inside said semiconductor memory device;
a step which sets a timing for a transition of said input address signal and a timing for applying an input refresh request to said semiconductor memory device, to a predetermined time relationship, and applies said input refresh request while said input address signal is being changed, and performs refresh of said memory cell array; and
and a step which determines pass or fail of said semiconductor memory device by collating data read from said memory cell array with said test pattern.

23. A test method for a semiconductor memory device according to claim 22, further having a step which changes said time relationship between the timing for said transition and the timing for applying said input refresh request, over a predetermined time range.

24. A test method for a semiconductor memory device according to claim 22, further having a step for sequentially performing said refresh on all word lines on said memory cell array while keeping said time relationship.

25. A test method for a semiconductor memory device according to claim 22, wherein when said input address signal is changed, all bits of said input address signal are simultaneously inverted.

26. A semiconductor memory device according to claim 1, comprising;
   an operation control circuit which operates respective circuits inside a device which requires said refresh, or stops the operation thereof, in accordance with a mode selected from amongst a plurality of kinds of modes prescribed for each circuit for whether or not the respective circuits inside the device which requires said refresh will be operated in a standby state, when said standby state results.

27. A semiconductor memory device according to claim 26, wherein said memory cell array comprising said plurality of memory cells is divided into a plurality of memory cell areas which are independently controlled as to whether or not said refresh is to be performed when said standby state results, and
   said operation control circuit respectively operates memory plates comprising said memory cell areas and peripheral circuits which are necessary for refresh of said memory cell areas or stops the operation thereof, corresponding to said mode which is set for each of memory plates.

28. A semiconductor memory device according to claim 27, wherein each of said memory plates further comprises a power supply circuit for supplying power to said memory cell areas and said peripheral circuits which constitute said memory plates, and
   said operation control circuit operates said power supply circuit provided for each of said memory plates, or stops the operation thereof, corresponding to said mode which is set for each of said memory plates.

29. A semiconductor memory device according to claim 27, wherein a power supply circuit is provided which is shared between said plurality of memory plates for supplying power to said plurality of memory plates, and
   said operation control circuit is provided with a plurality of switch circuits which control each of said memory plates by supplying or not supplying power from said power supply circuit to each of said memory plates, corresponding to said mode which is set for each of said memory plates.

30. A semiconductor memory device according to claim 27, wherein there is provided a program circuit for setting said mode for each of said memory plates, in response to an input mode signal.

31. A semiconductor memory device according to claim 30, wherein said program circuit specifies a memory plate provided with a memory cell area corresponding to said address, based on an input address, and sets a mode designated by said input mode signal as a mode for said specified memory plate.

32. A semiconductor memory device, comprising:
   a plurality of memory cells which require refresh;
   a refresh control circuit which controls said refresh;
   a power supply circuit which supplies power to a predetermined circuit which requires refresh other than said refresh control circuit and its own power supply circuit; and
   an operation control circuit, which when a standby state results, operates said refresh control circuit and said power supply circuit or stops the operation thereof corresponding to a mode selected from; a first mode which operates both said refresh control circuit and said power supply circuit, a second mode which stops operation of said refresh control circuit and operates said power supply circuit, and a third mode which stops operation of both said refresh control circuit and said power supply circuit.

33. A semiconductor memory device according to claim 32, wherein said operation control sets the mode, in response to receiving a write request of predetermined data to a predetermined address for each mode.

34. A semiconductor memory device according to claim 32, wherein said operation control circuit comprises a fuse for which a necessity for disconnection is determined corresponding to a selected mode.

35. A control circuit which supplies an address signal to a selection circuit which selects a memory cell which requires refresh, comprising:
   a refresh address generating circuit which generates a refresh address signal in response to a transition of an input address signal, and
   an address switching circuit which outputs said refresh address signal to said selection circuit and then outputs said input address signal to said selection circuit.

36. A control circuit according to claim 35, wherein said refresh address generating circuit generates said refresh address signal in response to said input address signal or an activation signal.

37. A control circuit according to claim 35, wherein said address switching circuit outputs said refresh address signal to said selection circuit and then outputs said input address signal to said selection circuit, with a transition of said input address signal as a trigger.

38. A control circuit according to claim 35, wherein said refresh address generating circuit updates said refresh address signal each time said refresh is performed.

39. A control circuit according to claim 35, wherein, corresponding to said mode which is set for each memory plate comprising a memory cell area which independently controls whether or not said refresh is performed when said standby stare results, and peripheral circuits which are necessary for refresh of said memory cell area, said operation setting circuit operates each of said memory plates, or stops the operation thereof.

40. A control circuit according to claim 39, wherein said operation setting circuit operates a power supply circuit which is provided for each of said memory plates for supplying power to said memory cell area and said peripheral circuits, or stops the operation thereof, corresponding to said mode which is set for each of said memory plates.

41. A control circuit according to claim 39, wherein said operation setting circuit comprises a plurality of switching circuits which control whether or not to supply power to each of said memory plates from a power supply circuit which is shared between said plurality of memory plates for supplying power to said plurality of memory plates, corresponding to said mode which is set for each of said memory plates.

42. A control circuit according to claim 39, wherein said operation setting circuit comprises a program circuit for setting said mode for each of said memory plates, in response to an input mode signal.

43. A control circuit according to claim 42, wherein said program circuit specifies, based on an input address, a memory plate which has a memory cell area corresponding to said address, and sets a mode designated by said input mode signal as a mode for said specified memory plate.

44. A control circuit according to claim 35, wherein said address switching circuit, while changing a page address comprising bits other than higher predetermined bits of said input address signal, outputs an address signal for continuously accessing a plurality of memory cells for which said higher predetermined bits are the same, to said selection circuit.

45. A control circuit according to claim 35, wherein said refresh address generating circuit starts self refresh when said input address signal has not changed over a predetermined time, and generates said refresh address signal at fixed time intervals.

46. A control circuit according to claim 45, wherein when said input address signal changes while refresh is being performed by said self refresh, said address switching circuit outputs said input address signal to said selection circuit once said self refresh has been performed.

47. A control circuit according to claim 35, further comprising:

a refresh control circuit which includes at least said refresh address generating circuit, and which performs said refresh control, and a mode control circuit which generates a mode switching signal for switching to any one of; a first mode which supplies power to both said refresh control circuit and a voltage generating circuit which generates a voltage for supply to predetermined circuits including said memory cell and said selection circuit, a second mode which stops supply of power to said refresh control circuit and supplies power to said voltage generating circuit, and a third mode which stops power supply to both said refresh control circuit and said voltage generating circuit.

48. A control circuit according to claim 47, wherein said mode control circuit generates said mode switching signal in response to a write request to write data previously determined for each mode to a predetermined address.

49. A control circuit according to claim 35, further comprising a refresh request selection circuit which, in response to an input test mode signal, selects any of an input refresh request or an internal refresh request generated based on a change of said input address signal, and said address switching circuit, corresponding to a selected refresh request, outputs said input address signal to said selection circuit as said refresh address signal, or outputs said refresh address signal to said selection circuit unchanged.

50. A control circuit according to claim 49, said input refresh request is input via a pin which is not used during said refresh.

51. A control circuit according to claim 35, wherein irrespective of whether or not a write request or a read request is input, said address switching circuit outputs said refresh address signal to said selection circuit and then outputs said input address signal to said selection circuit.

52. A control circuit according to claim 35, wherein when a write request is input, in response to said address transition detection signal, said address switching circuit outputs said refresh address signal to said selection circuit and then outputs said input address to said selection circuit, and when a read request is input, in response to said address transition detection signal, said address switching circuit outputs said input address signal to said selection circuit and then outputs said refresh address to said selection circuit.

53. A control circuit according to claim 52, wherein when a predetermined time has elapsed after said input address signal has changed, said address switching circuit determines whether an input address request is a read request or a write request.

54. A control circuit which controls operation of respective circuits which are used for refreshing memory cells, comprising an operation setting circuit which operates a refresh control circuit which controls said refresh and a power supply circuit which supplies power to a predetermined circuit which are used for refresh other than said refresh control circuit and its own power supply circuit or stops the operation thereof, when a standby state results, corresponding to a mode selected from amongst; a first mode for operating both said refresh control circuit, and said power supply circuit; a second mode which stops operation of said refresh control circuit and operates said power supply circuit, and a third mode which stops operation of both said refresh control circuit and said power supply circuit.

55. A control circuit according to claim 54 which sets a mode in response to receiving a write request of predetermined data to a predetermined address for each mode.

56. A semiconductor memory device according to claim 54, wherein said operation control circuit comprises a fuse for which a necessity for disconnection is determined corresponding to a selected mode.

57. A semiconductor memory device comprising;

a memory cell array constructed from a plurality of memory cells which require refresh and which is divided into a plurality of memory cell areas which are independently controlled as to whether or not said refresh is to be performed when a standby state results, and an operation control circuit, wherein a fuse for which a necessity for disconnection is determined corresponding to a mode selected from amongst a plurality of kinds of modes which prescribe whether or not to respectively operate memory plates comprising said memory cell area and peripheral circuits which are necessary for refresh of said memory cell area, in said standby condition, is provided for each of said memory plates, and which respectively operates said memory plates or stops the operation thereof, in accordance with a mode selected for each of said memory plates by said fuse, when said standby state results.

58. A control circuit wherein a fuse for which a necessity for disconnection is determined corresponding to a mode selected from amongst a plurality of kinds of modes which prescribe whether or not to respectively operate memory plates comprising memory cell areas which are independently controlled as to whether or not refresh is to be performed when a standby state results, and peripheral circuits which are necessary for refresh of said memory cell area, in said standby state, is provided for each of said memory plates, and which respectively operates said memory plates or stops the operation thereof, in accordance with a mode selected for each of said memory plates by said fuse, when said standby state results.

* * * * *